US006235572B1

(12) United States Patent
Kunitomo et al.

(10) Patent No.: US 6,235,572 B1
(45) Date of Patent: May 22, 2001

(54) METHOD OF MAKING A MEMORY CELL HAVING TWO LAYERED TANTALUM OXIDE FILMS

(75) Inventors: Masato Kunitomo, Ome; Shinpei Iijima, Akishima, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/334,625

(22) Filed: Jun. 17, 1999

(30) Foreign Application Priority Data

Jun. 19, 1998 (JP) .................................................. 10-173607

(51) Int. Cl.⁷ .............................................. H01L 21/8242
(52) U.S. Cl. ............................................ 438/240; 438/785
(58) Field of Search .................................... 438/240, 253, 438/396, 591, 763, 785

(56) References Cited

U.S. PATENT DOCUMENTS

| 5,202,280 | * | 4/1993 | Kamiyama et al. | 438/240 |
| 5,290,609 | * | 3/1994 | Horiike et al. | 438/785 |
| 5,569,619 | * | 10/1996 | Roh | 438/396 |
| 5,786,248 | * | 7/1998 | Schuegraf | 438/240 |

* cited by examiner

*Primary Examiner*—Chandra Chaudhari
(74) *Attorney, Agent, or Firm*—Antonelli, Terry, Stout & Kraus, LLP

(57) ABSTRACT

A semiconductor device includes a DRAM having a memory cell constructed by an information storage capacitor C which is comprised of a lower electrode 54 made of a ruthenium film and an upper electrode 62 made of a capacity insulating film 61 and a titanium nitride film and which is connected in series with a memory cell selection MISFET Qs formed on the main surface of a semiconductor substrate 1. The capacity insulating film 61 is made of a multi layered film comprising two layered crystallized tantalum oxide films 56 and 58 each having a film thickness of 10 nm or less. The film thickness of the capacity insulating film 61 is set to 10 to 40 nm.

12 Claims, 47 Drawing Sheets

METHOD OF MAKING A MEMORY CELL HAVING TWO LAYERED TANTALUM OXIDE FILMS

TITLE OF THE INVENTION

A semiconductor device, a method of manufacturing the semiconductor device, and an apparatus for manufacturing the semiconductor device.

BACKGROUND OF THE INVENTION

The present invention relates to a semiconductor device and a manufacturing technique thereof, and particularly to a technique advantageously applicable to a semiconductor device having a DRAM (Dynamic Random Access Memory).

Memory cells of a DRAM are arranged on cross points between a plurality of word lines and a plurality of bit lines which are arranged in a matrix layout on a main surface of a semiconductor substrate, and each memory cell contains a memory cell selection MISFET (Metal Insulator Semiconductor Field Effect Transistor) and an information storage capacitor connected in series with the MISFET. The memory cell selection MISFET is formed in an active region surrounded by an element isolation region and mainly consists of a gate oxide film, a gate electrode formed to be a part of a word line, and a pair of semiconductor regions forming a source and a drain. A bit line is provided above the memory cell selection MISFETs and is electrically connected with one of the source and drain common to two memory cell selection MISFETs. The information storage capacitor is provided also above the memory cell selection MISFETs and is electrically connected to the other one of the source and drain.

Japanese Patent Application Laid Open No. 7-7084 discloses a DRAM having a capacitor over bitline structure in which an information storage capacitor is provided above a bit line. In the DRAM described in this reference, the information storage capacitor consists of a lower electrode (storage electrode) processed of a cylindrical shape, a capacity insulating film and an upper electrode (plate electrode). By processing the lower electrode into a cylindrical shape, the surface area of the lower electrode is increased, and the reduction of storage charge amount (Cs) of the information storage capacitor is compensated for scale down of the memory cell. A multi layered insulating film comprising a silicon oxide film and a silicon nitride film are used as a capacity insulating film.

However, the surface area of the lower electrode is reduced as integration and scale down of a DRAM progress. It is consequently difficult to ensure a sufficient storage charge amount with a capacity insulating film made of a multi layered film comprising a silicon oxide film and a silicon nitride film. Meanwhile, if the film thickness of the capacity insulating film is reduced for maintaining a sufficient storage charge amount, a leakage current will be increased between upper and lower electrodes with the result that the refresh characteristic will be deteriorated or the reliability of DRAM. Hence, there has occurred a demand for a method of maintaining a necessary storage charge amount with a film thickness sufficient for reducing a leakage current, and various methods have been proposed.

In one of those methods, a high-dielectric material or a ferroelectric material is used for a capacity insulating film, and the effective film thickness of the capacity insulating film is reduced where the effective film thickness is calculated as an equivalent silicon oxide film, thus obtaining a sufficient capacity value. A typical insulating film thereof is a tantalum oxide film. The technique of using a tantalum oxide film is described in, for example, "Extended Abstracts of the 1993 International Conference on Solid State Device and Materials, Makuhari, pp853 to 855, and pp862 to 864, or "Extended Abstracts (The 43rd Spring Meeting, 1996); The Japan Society of Applied Physics and Related Societies", page 728.

SUMMARY OF THE INVENTION

It is difficult to deposit a tantalum oxide film at a high temperature since an tantalum oxide film is generally formed by a CVD method using an organic tantalum gas. Therefore, the tantalum oxide film as deposited is in an amorphous state and must be subjected to a thermal treatment to crystallize the film, in order to obtain a capacity insulating film with a high dielectric constant. Meanwhile, there is a method of improving the quality of a tantalum oxide film by a thermal treatment or plasma treatment in an oxidation atmosphere at about 400° C., in order to avoid a heat treatment at a high temperature.

Of the tantalum oxide films described above, the tantalum oxide film improved by a heat treatment or plasma treatment has a lower dielectric constant than a crystallized tantalum oxide film and is therefore disadvantageous for high integration of a DRAM. The film quality of a tantalum oxide film not crystallized may be deteriorated or the reliability of the DRAM may be reduced by a heat treatment (for example, at 400 to 600° C.) or the like for proceeding conductance between a wire after forming an information storage capacitor and a contact portion of a wire or substrate thereunder. Meanwhile, a crystallized tantalum oxide film has been subjected to a sufficiently high temperature during a heat treatment for the crystallization (for example, at 750° C.) and is therefore less deteriorated by a heat treatment to be performed later. In addition, a crystallized tantalum oxide film has a dielectric constant, which is twice higher than that of an amorphous material, and is therefore advantageous for high integration of a DRAM. Thus, a tantalum oxide film used for a capacity insulating film is desirable to crystallize in view of reliability of thermal treatment or of applying for high integration.

However, a crystallized tantalum oxide film is a thin poly-crystal film, and the film includes a grain boundary. The grain boundary may form a path for a leakage current between upper and lower electrodes formed with a tantalum oxide film inserted therebetween. In particular, it has been found from studies and discussions by the present inventors that the leakage current tends to increase if a polycrystalline silicon film having a surface including granular silicon (Hemispherical Silicon Grain) is used for the lower electrode. To realize high integration and a DRAM with high reliability, the following technique is required which is capable of reducing the leakage current in a lower electrode structure as described above.

In addition, if a crystallized tantalum oxide film is used, the film thickness of a capacity insulating film can be increased within the allowance of design standpoint by using the high dielectric constant thereof. Increase of the film thickness is a countermeasure for reducing the leakage current. However, if the film thickness of the tantalum oxide film is increased, the stress of the crystallized tantalum oxide film is increased thereby causing a leakage current at the boundary of crystal.

Further, it has also been found through studies and discussions by the present inventors et al. that increase of the film thickness causes deterioration of the surface morphology of the crystallized tantalum oxide film. The deterioration of the surface morphology means an occurrence of a portion where the distance between the upper and lower electrodes is short in fine scale, and the possibility of leakage or insulation break-down increases at this portion. In particular, such a portion where the distance between electrodes is short also becomes a boundary of crystal with a high possibility. It is considered that this portion causes further increase of a leakage current.

Meanwhile, a silicon oxide film is normally used as a gate insulating film in a MISFET. However, the film thickness of the gate insulating film needs to be reduced in accordance with scale down of the MISFET. As long as the silicon oxide film used as the gate insulating film, a tunneling current flows between the substrate and the gate electrode so that the MISFET does not operate properly if the film thickness is reduced to about several nm.

An object of the present invention is to provide a capacity insulating film which has heat resistance, causes a less leakage current, and achieves a high withstand voltage.

Another object of the present invention is to improve film characteristics such as of stress, surface morphology, and density on a capacity insulating film.

Another object of the present invention is to improve reliability and performance of a DRAM such as the refresh characteristic and the like.

The present invention also has another object of providing a gate insulating film in which the effective film thickness of the gate insulating film is reduced and occurrence of a tunneling current is restricted.

The above and other objects of the present invention as well as novel features thereof will be clearly understood from the description of the present specification and the drawings appended thereto.

Representative ones of the inventions disclosed in the present application will be briefly summarized as follows.

(1) A semiconductor device according to the present invention comprises: a substrate made of semiconductor or having a semiconductor layer formed thereon; a memory cell selection MISFET formed on a main surface of the substrate; and an information storage capacitor comprising a first electrode electrically connected to a semiconductor region which functions as a source or drain of the memory cell selection MISFET, a second electrode formed to be opposed to the first electrode, and a capacity insulating film inserted between the first and second electrodes, wherein the capacity insulating film includes a multi layered film comprising two or more layered metal oxide films each having a polycrystalline structure.

According to the semiconductor device as described above, the insulating capacity film contains a multi-layered film comprising two or more metal oxide films each having a polycrystalline structure. Therefore, the gain boundary of the polycrystalline metal films forming the capacity insulating film, which serve as leakage paths, are divided into sectors so that the leakage current between the first and second electrodes can be reduced.

(2) Another semiconductor device according to the present invention comprises: a substrate made of semiconductor or having a semiconductor layer formed thereon; and a MISFET including a gate insulating film formed on a main surface of the substrate, and a gate electrode formed on the main surface of the substrate with the gate insulating film inserted between the gate electrode and the main surface, wherein the gate insulating film includes a multi layered film comprising two or more layered metal oxide films each having a polycrystalline structure.

According to the semiconductor device as described above, the gate insulating film is made of a metal oxide film having a high dielectric constant. Therefore, a sufficient capacity can be maintained even if the film thickness is made thick to prevent a tunneling current from flowing. As a result, it is possible to restrict the tunneling current through the gate insulating film between the gate electrode and the substrate. Also, since the gate insulating film includes a multi layered film comprising two or more layered metal oxide films each having a polycrystalline structure, the gain boundary of the polycrystalline metal films forming the gate insulating film, which serve as leakage paths, are divided into sectors, so that the leakage current between the first and second electrodes can be reduced.

In the semiconductor device according to the above article (1) or (2), the metal element forming the metal oxide film may be tantalum. That is, the capacity insulating film or gate insulating film may be formed of a multi-layered film of polycrystalline tantalum oxide films.

Also, the plurality of metal oxide films forming the multi-layered film may each have a film thickness of 10 nm or less. By thus setting the film thickness to 10 nm or less, the stress of the multi layered film can be reduced and the density and morphology thereof can be improved. These improvements of film quality result in reduction of leakage currents.

Also, in the semiconductor device according to the above article (1), the first electrode may be a polycrystalline silicon film, and a silicon nitride film or a silicon oxy-nitride film may be formed between the first electrode and the multi layered film. By thus forming a silicon nitride film or a silicon oxy-nitride film between the first electrode and the multi layered film, oxidation of the polycrystalline silicon film as the first electrode can be restricted in the oxidation processing when crystallizing the metal oxide films or tantalum oxide films forming the capacity insulating film. Note that concave and convex portions depending on granular silicon crystal may be formed on a surface of the polycrystalline silicon film. In case of including such concave and convex portion depending on granular silicon crystal, the leakage current tends to be particularly large. Particularly remarkable advantages can be obtained if the present invention is applied to this case.

In the semiconductor device according to the article (1) described above, the first electrode may be metal, metal nitride, or metal oxide, and a metal oxide film forming the first electrode may be formed between the first electrode and the multi layered film. In this case, oxidation of the metal, metal nitride, or metal oxide as the first electrode can be restricted in the oxidation processing when crystallizing the metal oxide films or tantalum oxide films forming the capacity insulating film. In this case, the metal forming the first electrode may be ruthenium, tungsten, or titanium.

In the semiconductor device according to the above article (2), a silicon nitride film or a silicon oxy-nitride film may be formed between the substrate and the multi-layered film. In this case, oxidation of the substrate can be restricted in the oxidation processing when crystallizing the metal oxide films or tantalum oxide films forming the gate insulating film.

In the semiconductor device according to the above articles (1) and (2) described above, if the metal oxide film is a polycrystalline tantalum oxide film, the multi layered film comprising a plurality of layers of tantalum oxide films has a density of 8.5 g/cm³ or more, a stress of 1100 MPa or less, and surface roughness of 10% or less of a film thickness of the multi layered film. Also, the multi-layered film comprising a plurality of layers of tantalum oxide films is formed to be uniform in the film thickness direction of the multi-layered film. These film characteristics are obtained by an X-ray reflection rate measurement, and these results are excellent and exceed the film characteristics of tantalum oxide films obtained by a conventional method. Thus, excellent film characteristics can be obtained since the multi-layered film of the polycrystalline tantalum films is formed separately in two or more steps, as will be described later.

(3) A method of manufacturing a semiconductor device according to the present invention is a method of manufacturing semiconductor device comprising a substrate made of semiconductor or having a semiconductor layer formed thereon, a memory cell selection MISFET formed on a main surface of the substrate, and an information storage capacitor comprising a first electrode electrically connected to a semiconductor region which functions as a source or drain of the memory cell selection MISFET, a second electrode formed to be opposed to the first electrode, and a capacity insulating film inserted between the first and second electrodes, or a method of manufacturing semiconductor device comprising a substrate made of semiconductor or having a semiconductor layer formed thereon, and a MISFET including a gate insulating film formed on a main surface of the substrate, and a gate electrode formed on the main surface of the substrate with the gate insulating film inserted between the gate electrode and the main surface. The manufacturing method comprises steps of: (a) forming a first tantalum oxide film by a CVD method; (b) crystallizing the first tantalum oxide film by a first heat treatment, thereby to form a first polycrystalline tantalum oxide film; (c) forming a second tantalum oxide film on the first polycrystalline tantalum oxide film, by a CVD method; and (d) performing a second heat treatment on the second tantalum oxide film.

According to the method of manufacturing a semiconductor device, as described above, a multi-layered film comprising polycrystalline tantalum films can be formed. The multi-layered film is formed by layering polycrystalline tantalum films, every of which is formed by crystallization. Note that the steps (c) and (d) may be further repeated to form a multi layered film composed of three or more layered polycrystalline tantalum oxide films.

Note that the first and second tantalum oxide films are formed at a temperature of 550° C. or less by a CVD method using an organic tantalum gas as a raw material.

Also, the film thickness of each of the first and second tantalum oxide films is set to 10 nm or less. By thus layering polycrystalline tantalum oxide films having a thickness of 10 nm or less, a multi-layered film is formed with uniformity in the film thickness direction, and it is possible to reduce the stress thereof and to improve the morphology and density thereof.

Also, the first or second heat treatment is carried out at a temperature of 650° C. or more in an oxidation atmosphere. For example, it is possible to cite a first condition set in an oxygen atmosphere at a treatment temperature of 700 to 850° C. for a processing time of 1 to 10 minutes, or a second condition set in a dinitrogen monoxide atmosphere at a treatment temperature of 650 to 850° C. for a processing time of 1 to 10 minutes.

Further, the first or second heat treatment may be carried out in a manner in which a first treatment can be carried out in an oxidation atmosphere at a temperature of 600° C. or less and a second treatment is thereafter carried out in an inert-gas atmosphere at a treatment temperature of 650 to 850° C. for a processing time of 1 to 10 minutes. Also, the first or second heat treatment may be carried out by inverting the orders of the first and second treatments, i.e., a second treatment is carried out under a condition set in an inert-gas atmosphere at a treatment temperature of 650 to 850° C. for a processing time of 1 to 10 minutes and a first treatment is thereafter carried out in an oxidation atmosphere at a temperature of 600° C. or less.

Also, the first treatment can be carried out under a third condition set in an ozone atmosphere at a treatment temperature of 300 to 500° C. or under a fourth condition set in an oxygen atmosphere at a treatment temperature of 550 to 600° C.

The present invention includes steps of depositing a tantalum oxide film, performing a heat treatment (ozone annealing) in an ozone atmosphere, and further performing deposition of a tantalum oxide film and ozone annealing. A method similar to this method is a method of forming a capacitor film described in Japanese Patent Application Laid-Open No. 9-121035. The method described in this reference includes a first stage of forming a $Ta_2O_5$ film, a second stage of performing $UV-O_3$ annealing on the $Ta_2O_5$ film, and a third stage of repeating the first and second steps for one or more times. However, the method according to this reference has an object of supplying sufficiently oxygen to the $Ta_2O_5$ film by repeating $O_3$ annealing, and the $Ta_2O_5$ film formed through these steps is considered as an amorphous film. In contrast, the tantalum oxide film formed by the method according to the present invention is crystallized. In this respect, both methods clearly differ from each other. Also, in the method according to the present invention, the grain boundary of the tantalum oxide crystals formed by crystallization are divided by layering, and there is an object of improving the insulating withstand voltage by improving the morphology and by reducing the grain diameter of the crystal grains. Thus, both methods have respectively different objects. The difference between the objects of both methods appears as a difference in structure therebetween. that is, the film thickness of the $Ta_2O_5$ has a film thickness of 10 to 500 Å the method described in the publication while the film thickness of the tantalum oxide film in each step is 10 nm in the present invention.

In the method described above, before formation (a) of the first tantalum oxide film, the first electrode or the main surface of the substrate may be nitrified. In this case, oxidation of silicon during crystallization processing of the first tantalum oxide film can be prevented by the silicon nitride film or silicon oxy-nitride film formed on the first electrode or substrate formed by nitrification. As a result, the silicon oxide film having a low dielectric constant can be prevented from substantially functioning as a capacity insulating film with the result that the information storage capacitor can be protected from reduction in the storage charge amount. Note that the nitrification may be carried out as a heat treatment at a treatment temperature of 700° C. to 850° C. in an ammonia atmosphere.

Also, in case where the main surface of the first electrode is made of a material containing silicon as a principal component, granular silicon crystal may be let grow on the surface of the first electrode before the nitrification. In this manner, the surface area of the first electrode as a lower electrode is increased so that the storage charge amount of the information storage capacitor can be increased.

(4) A equipment for manufacturing a semiconductor device according to the present invention comprises: a first reaction chamber for depositing a tantalum oxide film on a substrate by a CVD method; a second reaction chamber capable of subjecting the substrate to a heat treatment in an oxidation atmosphere or an inert-gas atmosphere; a vacuum transfer chamber connected to the first and second reaction chambers, for transferring the substrate to the first and second reaction chambers while maintaining a decompressed condition or a vacuum condition; and a load lock chamber connected to the vacuum transfer chamber, for loading/unloading the substrate, wherein a first tantalum oxide film is deposited on the substrate in the first reaction chamber, the substrate is thereafter transferred to the second reaction chamber while maintaining the decompressed condition, the first tantalum oxide film is crystallized by a heat treatment in the second reaction chamber, and deposition of a second tantalum oxide film in the first reaction chamber and crystallization thereof in the second reaction chamber are carried out while further maintaining the decompressed condition.

According to the equipment for manufacturing a semiconductor device, as described above, the manufacturing method described in the above article (3) can be realized, and the polycrystalline tantalum oxide films of the semiconductor device described in the articles (1) and (2) can be manufactured. Also, according to the manufacturing equipment, transfer between the first and second reaction chambers is carried out under a decompressed atmosphere. Therefore, cleanliness of the polycrystalline tantalum oxide films forming a multi layered film can be maintained, and the insulating withstand voltage of the capacity insulating film improved, so that the performance and reliability of the semiconductor device can be improved.

The manufacturing equipment described above may further comprise a third reaction chamber connected to the vacuum transfer chamber and capable of performing a heat treatment in an ammonia atmosphere, wherein a silicon region on a surface of the substrate may be nitrified in the third reaction chamber, and the substrate may be thereafter transferred to the first reaction chamber while maintaining the decompressed condition. In this case, the decompressed condition is kept between formation of a silicon nitride film or a silicon oxy-nitride film in the third reaction chamber and formation of a polycrystalline tantalum oxide films in the first and second reaction chambers. Therefore, oxygen does not stick because of no released air, so that the interfaces can be kept clean.

Also, the manufacturing equipment described above may further comprise a fourth reaction chamber connected to the vacuum transfer chamber and capable of depositing a polycrystal silicon film, a metal film, or a metal compound film by a sputtering method or a CVD method, wherein, after the tantalum oxide film is crystallized in the second reaction chamber, the substrate may be transferred to the fourth reaction chamber while maintaining the decompressed condition and a polycrystalline silicon film, a metal film, or a metal compound film may be formed on the crystallized tantalum oxide film. In this manner, the upper electrode can be formed of a polycrystalline silicon film, a metal film, or a metal compound film, and fabrication can be carried out by forming the information storage capacitor consistently in an environment in which the decompressed condition is maintained.

DESCRIPTION OF THE PREFFERED EMBODIMENTS

Embodiments of the present invention will now be explained in details below based on the drawings. In all the drawings explaining the embodiments, those components that have an equal function will be denoted at a common reference symbol and reiteration of those components will be omitted herefrom.

(Embodiment 1)

Figure 1:
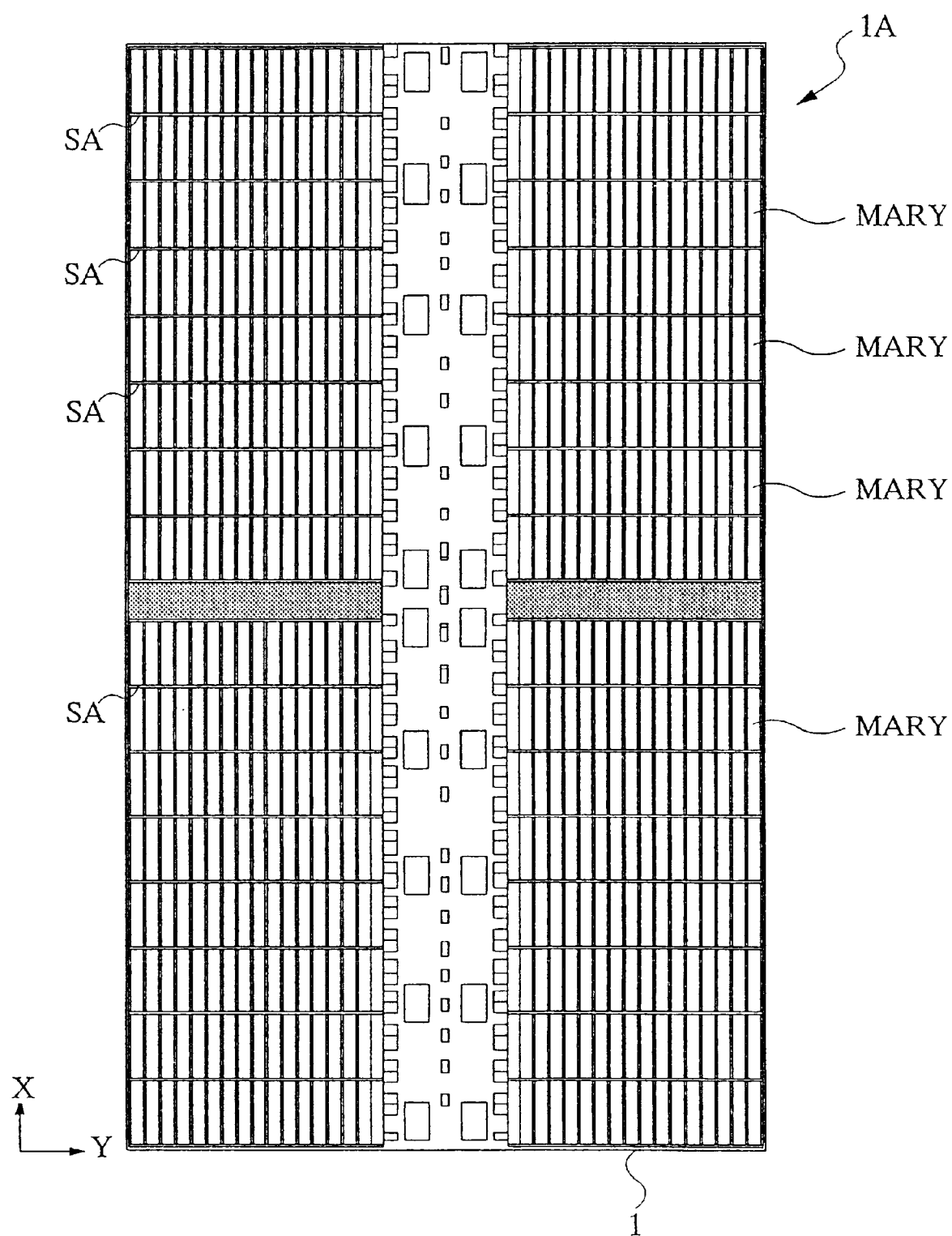
FIG. 1 is a total plan view showing a semiconductor chip on which a DRAM according to the embodiment 1 are formed.

FIG. 1 is a plan view showing the entire of a semiconductor chip on which a DRAM according to the embodiment 1 is formed. As shown in the figure, a number of memory arrays MARY are provided along the X-direction (corresponding to the long side direction of the semiconductor chip 1A) and the Y-direction (corresponding to the short side direction of the semiconductor chip 1A) in a matrix-like layout on the main surface of a semiconductor chip 1A made of monocrystalline silicon. Sense amplifiers SA are respectively provided between pairs of adjacent memory cell arrays MARY in the X-direction. In the center portion of the main surface of the semiconductor chip 1A, there are provided a word driver WD, a control circuit such as a data line selection circuit or the like, an input/output circuit, a bonding pad, and the like.

Figure 2:
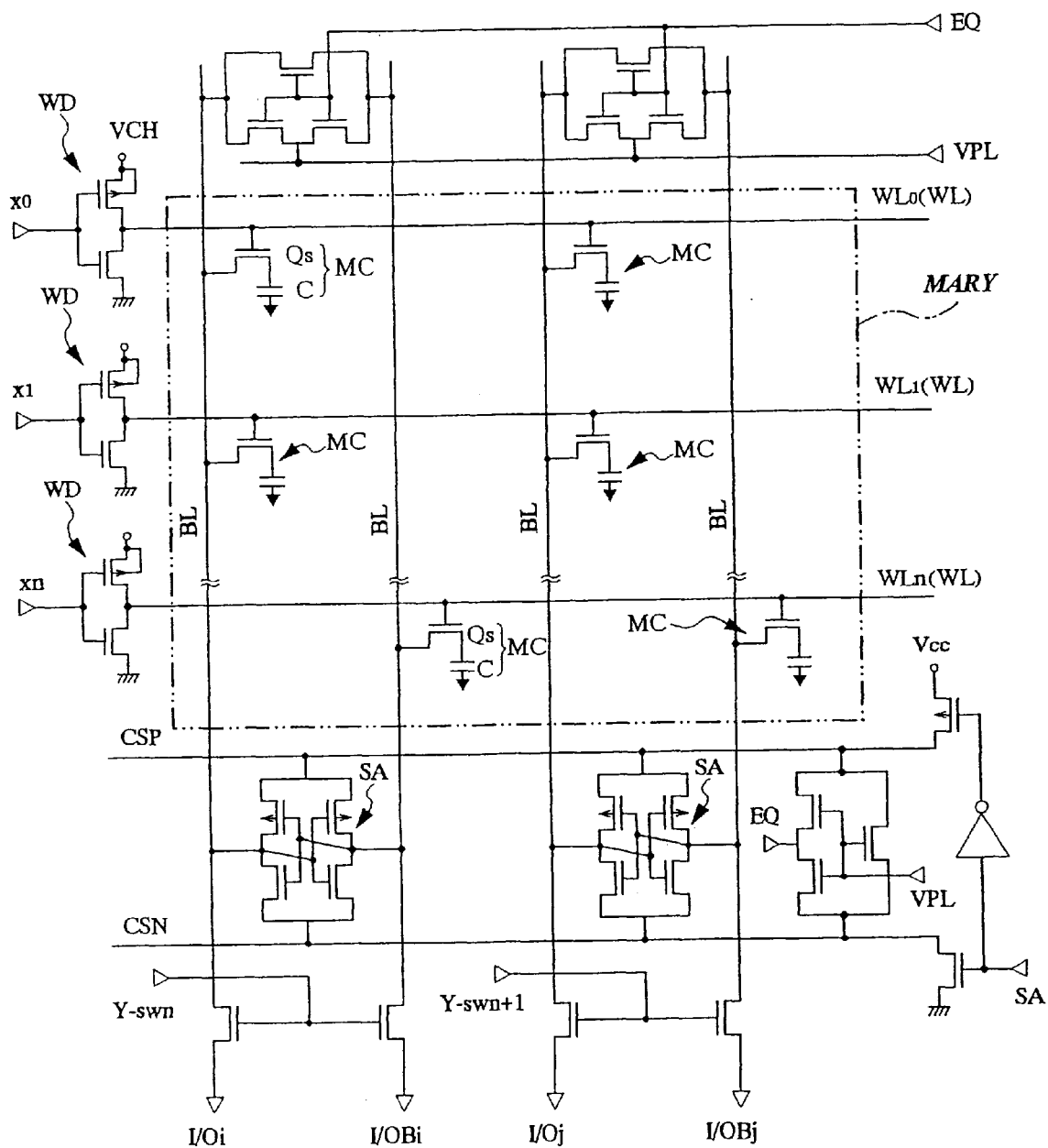
FIG. 2 is an equivalent circuit diagram of the DRAM according to the embodiment 1.

FIG. 2 is an equivalent circuit diagram of the DRAM according to the embodiment 1. As shown in the figure, the memory array (MARY) of this DRAM is comprised of a plurality of word lines WL (WL0, WL1, . . . WLn) and a plurality of bit lines BL, which are arranged in a matrix-like layout, and a plurality of memory cells (MC) arranged at cross points between the word lines and the bit lines. A memory cell which stores information of one bit is comprised of an information storage capacitor C and a memory cell selection MISFET Qs connected in series thereto. One of the source and drain of the memory cell selection MISFET Qs is electrically connected to the information storage capacitor C, and the other one of the source and drain is electrically connected to a bit line BL. An end of the word line WL is connected to a word driver WD, and an end of the bit line BL is connected to a sense amplifier SA.

Next, the method of manufacturing the DRAM according to the present embodiment will be explained in accordance with the manufacturing process sequence with reference to the drawings.

FIGS. 3 to 26 are cross-sectional views of an example of the DRAM according to the embodiment 1 under a stage of manufacturing process sequence.

Figure 3:
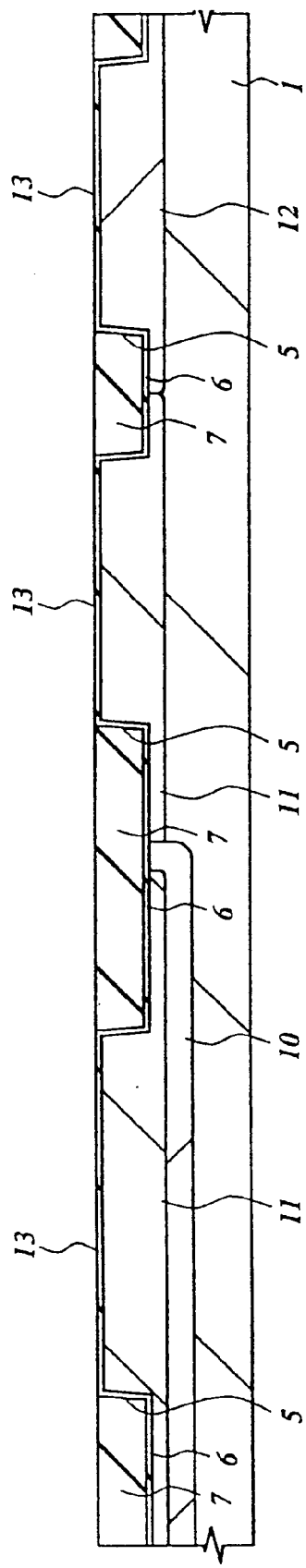
FIG. 3 is a cross-sectional view of an example of the DRAM according to the embodiment 1 under a stage of manufacturing process sequence.

Formed at first are an element isolation region and a well region to which impurities are introduced, as shown in FIG. 3.

A semiconductor substrate 1 of p-type which has a resistivity of about 10 Ωcm and is made of monocrystalline silicon is prepared. A thin silicon oxide film (not shown) having a film thickness 10 nm and formed by, for example, wet oxidation at about 850° C. and a silicon nitride film (not shown) having a film thickness of about 140 nm and formed by, for example, a CVD (Chemical Vapor Deposition) method are deposited on the semiconductor substrate 1. Although a semiconductor substrate 1 made of monocrystalline silicon is exemplified, it is possible to use a SOI (Silicon On Insulator) substrate having a monocrystalline silicon layer on its surface or a dielectric substrate made of glass or ceramics which have a polycrystalline silicon film on its surface.

Next, with a photoresist film (not shown) used as a mask, the silicon nitride film and the silicon oxide film are subjected to etching within the region where a groove 5 is formed. With the silicon nitride film used as a mask, the semiconductor substrate 1 is subjected to dry etching. A groove 5 having a depth of about 300 to 400 nm is thus formed in the semiconductor substrate 1 in the element isolation region.

Next, the photoresist film is removed, and thereafter, a thin silicon oxide film 6 (having a thickness of about 10 nm) is formed on the inner walls of the groove 5 by wet oxidation at about 850 to 900° C., to remove a damaged layer in the inner walls of the groove 5, damaged by the above-mentioned etching. Further, a silicon oxide film (not shown) is deposited with a film thickness of about 300 to 400 nm by a plasma CVD method using ozone ($O_3$) and tetraethoxysilane (TEOS) as a source gas. This silicon oxide film may be subjected to sintering (densification) at about 1000° C.

Next, this silicon oxide film is polished by a CMP (Chemical Mechanical Polishing) method to remove the silicon oxide film in the regions other than the groove 5, so that the element isolation region is formed with the silicon oxide film 7 remaining inside the groove 5. Note that it is possible to prevent dishing which means excessively deep polishing of the silicon oxide film if a silicon nitride film is formed in the region of the groove 5 before the polishing by the CMP method.

Next, the silicon oxide film and the silicon nitride film remaining on the surface of the semiconductor substrate 1 are removed by wet etching using a thermal phosphoric acid. Thereafter, n-type impurities such as P (phosphorus) are ion-implanted into the region (of a memory array) where a memory cell is to be formed, thereby to form a n-type semiconductor region 10, and p-type impurities such as B (boron) are ion-implanted into the memory array and a part of a peripheral circuit (where a n-channel type MISFET is to be formed), thereby to form a p-type well 11. Also, n-type impurities such as P (phosphorus) are ion-implanted into another part of the peripheral circuit (where a p-channel type MISFET is to be formed), thereby to form an n-type well 12. Subsequently to this ion-implantation, impurities such as $BF_2$ (boron fluoride) for adjusting the threshold voltage of the MISFET are ion-implanted into the p-type well 11 and the n-type well 12. The n-type semiconductor region 10 is formed so as to prevent noise from entering into the p-type well 11 of the memory array through the semiconductor substrate 1 from the input/output circuit or the like.

Next, the surface of the semiconductor substrate 1 is washed with a HF-based (hydrofluoric-acid-based) cleaning solvent, for example. Thereafter, the semiconductor substrate 1 is subjected to wet oxidation at about 850° C., thereby to form a clean gate oxide film 13 having a film thickness of about 7 nm on the surface of each of the p-type well 11 and the n-type well 12. Although not particularly limited, nitrogen may be segregated at the interface between the gate oxide film 13 and the semiconductor substrate 1 by performing a heat treatment on the semiconductor substrate 1 in a NO (nitrogen oxide) atmosphere or a $N_2O$ (dinitrogen monoxide) atmosphere after forming the gate oxide film 13 (oxy-nitrification processing). When the gate oxide film 13 is thinned to about 7 nm, distortion caused at the interface therebetween appears clearly due to the difference in the thermal expansion coefficient from semiconductor substrate 1, thereby inducing generation of hot carriers. Since nitrogen segregated at the interface to the semiconductor substrate 1 relaxes the deformation, the oxy-nitrification processing is capable of improving the reliability of the very thin gate oxide film 13.

Figure 4:
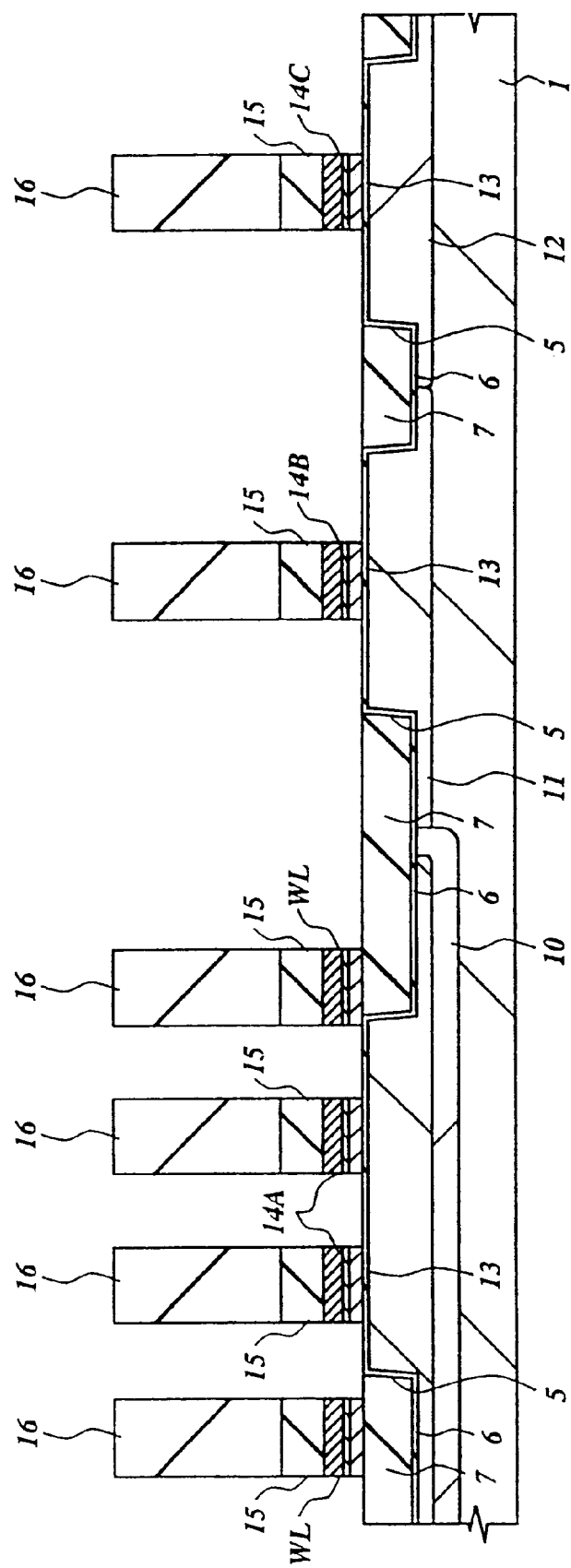
FIG. 4 is a cross-sectional view of an example of the DRAM according to the embodiment 1 under a stage of manufacturing process sequence.

Next, as shown in FIG. 4, gate electrodes 14A, 14B, and 14C are formed on the gate oxide film 13. The gate electrodes 14A form part of the memory cell selection MISFET and are used as word lines WL in the regions other than the active region. The width of the gate electrode 14A (or the word line WL), i.e., the gate length thereof is set to a minimum dimension (e.g., about 0.24 μm) within a tolerable range in which the short channel effect of the memory cell selection MISFET is reduced and the threshold voltage is maintained at a constant value or more. In addition, the distance between adjacent gate electrodes 14A (or word lines WL) is set to a minimum size (e.g., 0.22 μm) determined by the limit resolution of photo-lithography. The gate electrodes 14B and 14C respectively form parts of an n-channel type MISFET of a peripheral circuit and a p-channel type MISFET thereof.

The gate electrodes 14A (or word lines WL) and the gate electrodes 14B and 14C are formed as follows. At first, a polycrystalline silicon film having a film thickness of about 70 nm and doped with n-type impurities such as P (phosphorus) is deposited on the semiconductor substrate 1 by a CVD method, and next, a WN (tungsten nitride) film having a film thickness of about 50 nm and a W film having a film thickness of about 100 nm are formed thereon by a sputtering method. Further, a silicon nitride film 15 having a film thickness of about 150 nm is deposited thereon by a CVD method. Thereafter, with a photoresist film 16 used as a mask, those films are subjected to patterning. Note that the WN film functions as a barrier layer which prevents the W film and the polycrystalline silicon film from reacting with each other during a heat treatment at a high temperature thereby forming a high-resistance silicide layer at the interface between both films. A TiN (titanium nitride) film or the like may be used as the barrier layer, in place of the WN film.

In case where a part of the gate electrodes 14A (or word lines WL) is formed of low-resistance metal (W), the sheet resistance can be reduced to about 2 to 2.5 Ω/□ so that the word line delay can be reduced. In addition, since the word line delay can thus be reduced without backing the gate electrodes 14 (or word lines WL) with a Al wire or the like, the number of wiring layers formed above the memory cell can be reduced by one.

Next, the photoresist film 16 is removed, and thereafter, residues of the dry etching and the photoresist remaining on the surface of the semiconductor substrate 1 are removed with use of an etching solution such as a hydrofluoric acid or the like. By this wet etching, the gate oxide film 13 is removed at regions other than the regions under the gate electrodes 14A (or word lines WL) and the gate electrodes 14B and 14C, and simultaneously, the gate oxide film 13 is isotropically etched at the regions under the gate sidewalls, thereby causing an undercut so that the withstand voltage of the gate oxide film 13 is lowered in this situation. Hence, the semiconductor substrate 1 is subjected to wet oxidation at about 900° C., thereby to improve the film quality of the gate oxide film 13 thus removed.

Figure 5:
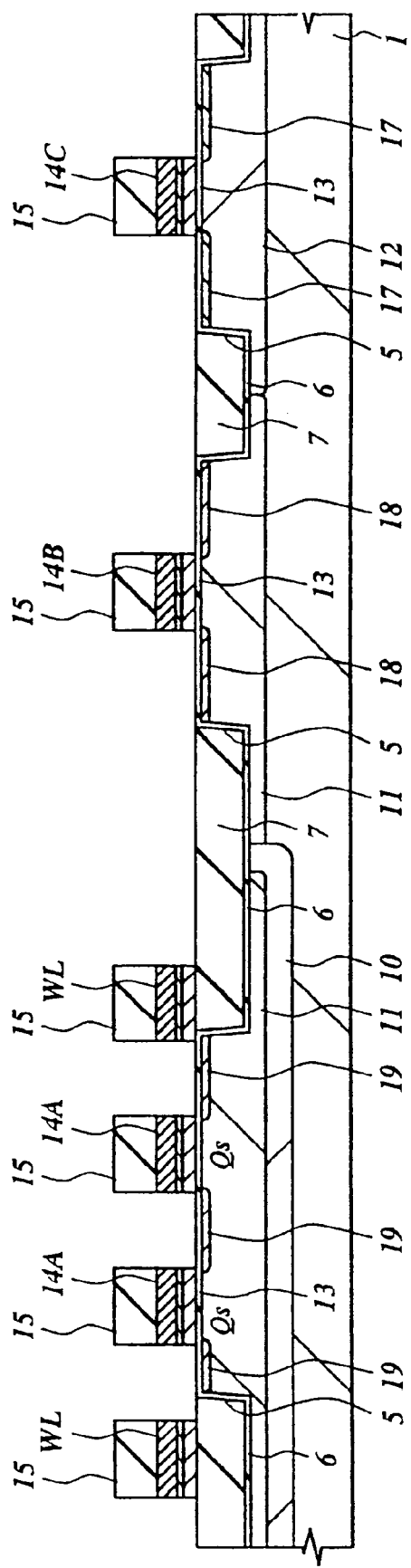
FIG. 5 is a cross-sectional view of an example of the DRAM according to the embodiment 1 under a stage of manufacturing process sequence.

Next, as shown in FIG. 5, p-type impurities such as B (boron) are ion-implanted into the n-type well 12 thereby to form p⁻-type semiconductor regions 17 in the n-type well 12 in both sides of the gate electrode 14C. In addition, n-type impurities such as P (phosphorus) are ion-implanted into the p-type well 11 thereby to form n⁻-type semiconductor regions 18 in the p-type well 11 in both sides of the gate electrode 14B and to form n-type semiconductor regions 19 in the p-type well 11 in both sides of the gate electrodes 14A. In this manner, a memory cell selection MISFET Qs is formed in the memory array.

Figure 6:
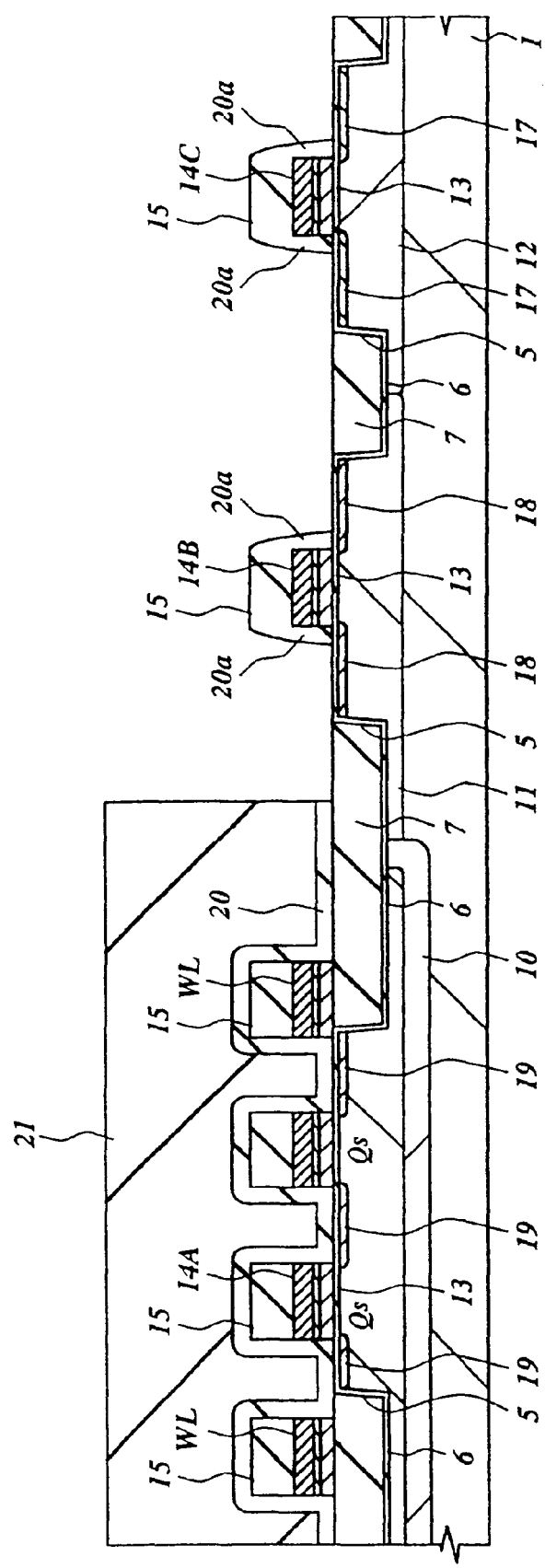
FIG. 6 is a cross-sectional view of an example of the DRAM according to the embodiment 1 under a stage of manufacturing process sequence.

Next, as shown in FIG. 6, a silicon nitride film 20 having a film thickness of about 50 to 100 nm is deposited on the semiconductor substrate 1 by a CVD method, and thereafter, the silicon nitride film 20 of the peripheral circuit is subjected to anisotropic etching with the silicon nitride film 20 of the memory array covered with a photoresist film 21, thereby to form side wall spacers 20a on the sidewalls of the gate electrodes 14B and 14C. This etching uses such an etching gas which enhances the etching rate of the silicon nitride film 20 relative to the silicon oxide film, in order to minimize the shaving amount of the gate oxide film 13 and the silicon oxide film 7 embedded in the element separation groove 5. In addition, the over-etching amount is restricted to a minimum necessary level to minimize the shaving amount of the silicon nitride film 15 on the gate electrodes 14B and 14C.

Figure 7:
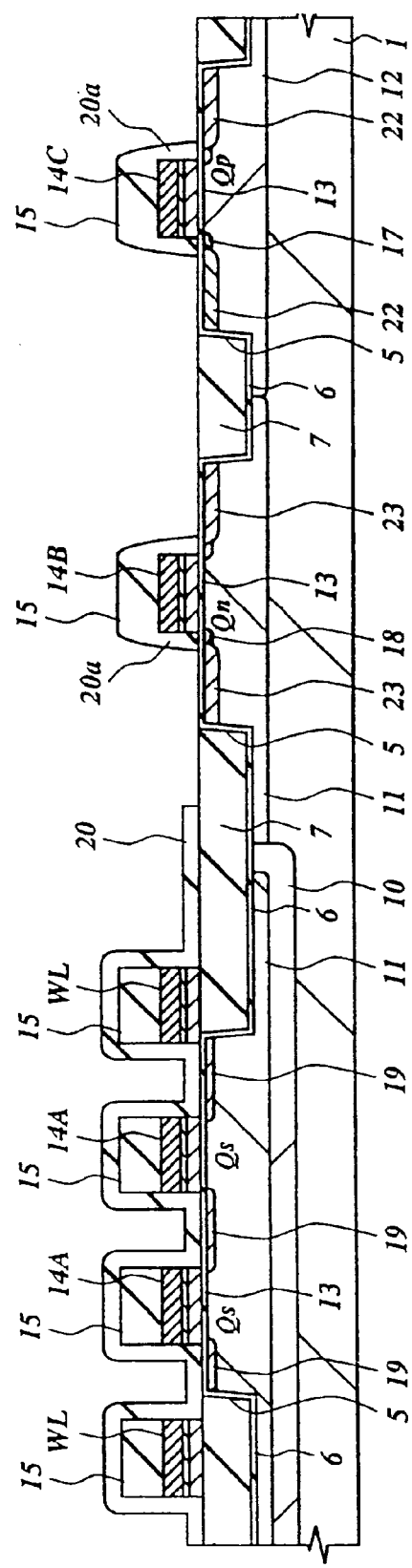
FIG. 7 is a cross-sectional view of an example of the DRAM according to the embodiment 1 under a stage of manufacturing process sequence.

Next, the photoresist film 21 is removed. Thereafter, p-type impurities such as B 8boron) are ion-implanted into the n-type well 12 in the peripheral circuit region, as shown in FIG. 7, thereby to form p⁺-type semiconductor regions 22 (source and drain) of the p-channel type MISFET, and n-type impurities such as As (arsenic) is ion-implanted into the p-type well 11 in the peripheral circuit region, thereby to form n⁺-type semiconductor regions 23 (source and drain) of the p-channel type MISFET. In this manner, p-channel type MISFET Qp and n-channel type MISFET Qn having a LDD (Lightly Doped Drain) structure are formed in the peripheral circuit region.

Figure 8:
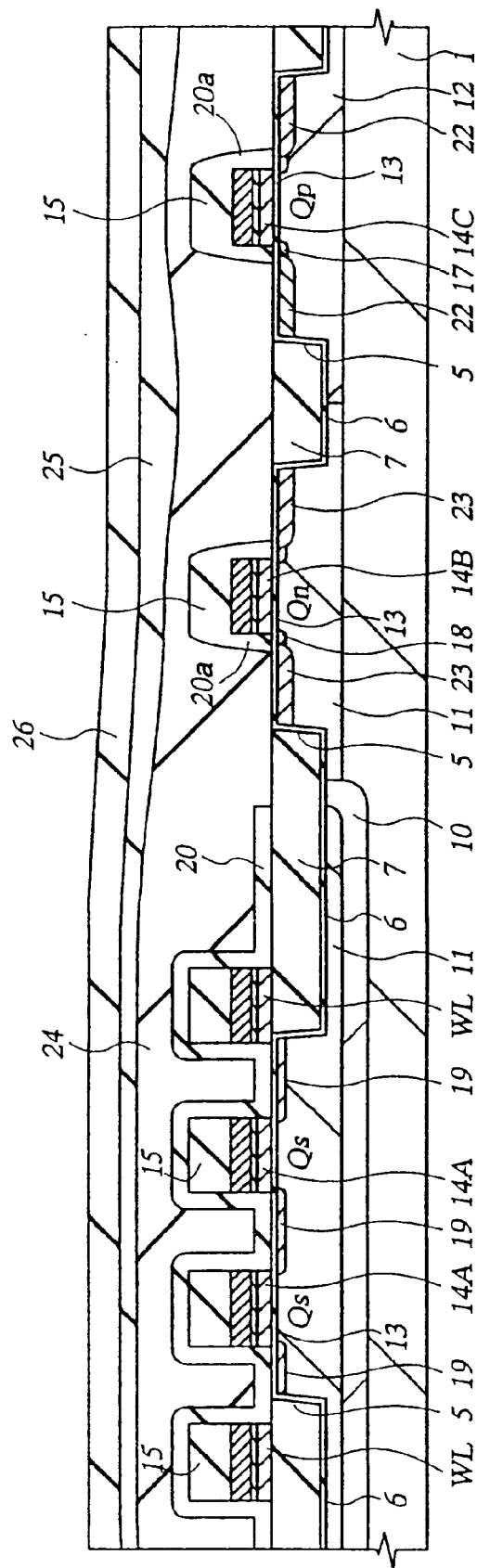
FIG. 8 is a cross-sectional view of an example of the DRAM according to the embodiment 1 under a stage of manufacturing process sequence.

Next, as shown in FIG. 8, a SOG (Spin On Glass) film 24 having a film thickness of about 300 nm is spin-coated on the semiconductor substrate 1, and thereafter the semiconductor substrate 1 is subjected to sintering (densification) by performing a heat treatment at 800° C. for about one minute. In addition, a silicon oxide film 25 having a film thickness of about 600 nm is deposited on the SOG film 24, and thereafter, the silicon oxide film 25 is polished by a CMP method to flatten its surface. This silicon oxide film 26 is deposited in order to rebuild fine flaws on the surface of the silicon oxide film 25 caused by the polishing by the CMP method. The silicon oxide films 25 and 26 are deposited by a plasma CVD method using, for example, ozone ($O_3$) and tetraethoxysilane (TEOS) for a source gas. In place of the silicon oxide film, 26, a PSG (Phospho Silicate Glass) film may be deposited.

Thus, according to the present embodiment, a SOG film 24 having a high reflow characteristic is coated on the gate electrodes 14A (or word lines WL) and the gate electrodes 14B and 14C, and further, the silicon oxide film 25 deposited thereon is flattened by a CMP method. In this manner, it is possible to improve the gap filling property on the fine gaps between the gate electrodes 14A (or word lines WL), and to realize flattening of the insulating film above the gate electrodes 14A (or word lines WL) and the gate electrodes 14B and 14C.

Figure 9:
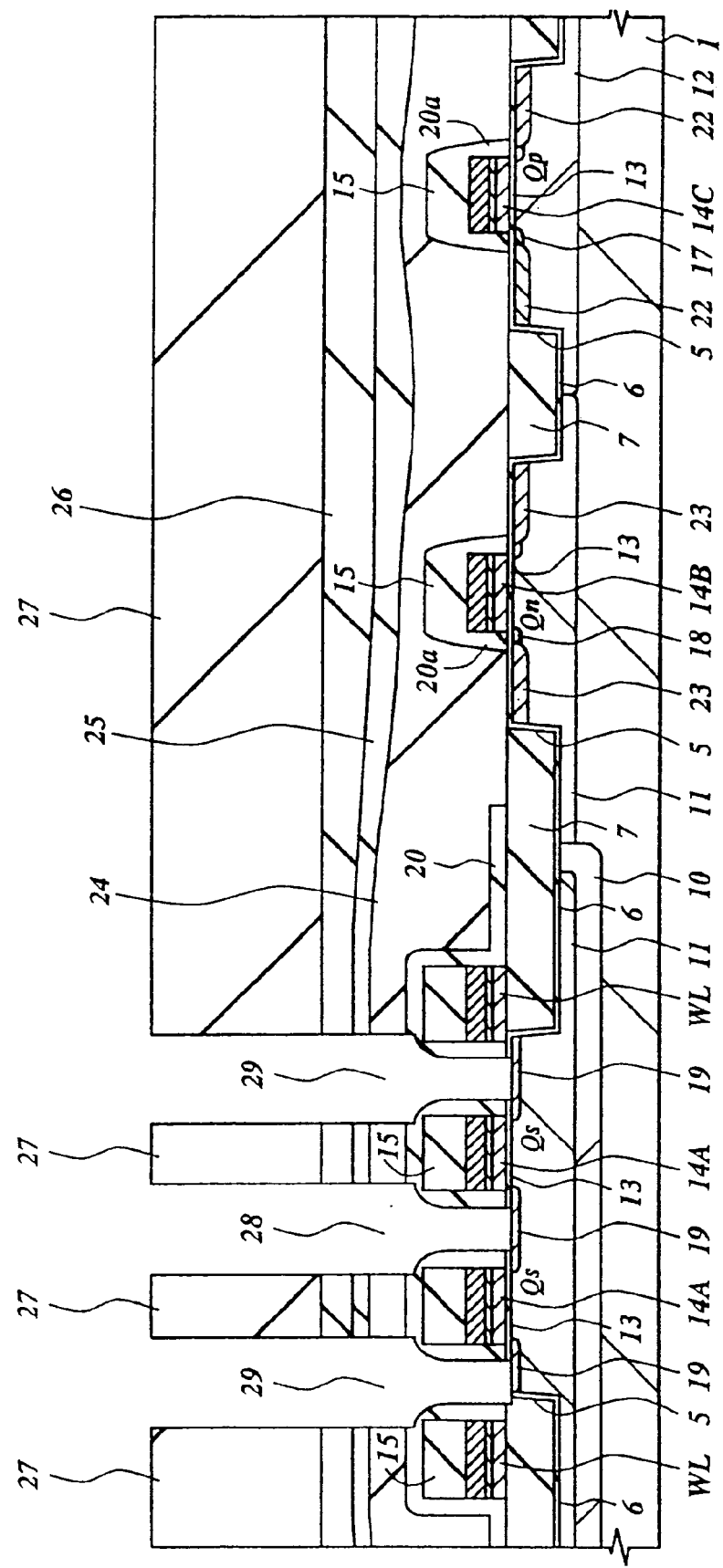
FIG. 9 is a cross-sectional view of an example of the DRAM according to the embodiment 1 under a stage of manufacturing process sequence.

Next, as shown in FIG. 9, the silicon oxide films 26 and 25 and the SOG film 24 above the n-type semiconductor regions 19 (source and drain) of the memory cell selection MISFET Qs are removed by dry etching with a photoresist film 27 used as a mask. This etching is carried out under a condition that the etching rates of the silicon oxide films 26 and 25 and the SOG film 24 are increased relatively to the etching rate of the silicon nitride film 20, so that the silicon nitride film 20 covering the n-type semiconductor regions 19 and the element separation groove 5 might not completely be removed. Subsequently, the silicon nitride film 20 and the gate oxide film 13 above the n-type semiconductor regions 19 (source and drain) of the memory ell selection MISFET Qs are removed by dry etching with the photoresist film 27 used as a mask, thereby to form a contact hole at an upper portion of one of the n-type semiconductor regions 19 (source and drain). This etching is carried out under a condition that the etching rate of the silicon nitride film 15 is increased relative to that of the silicon oxide film (which means the gate oxide film 13 and the silicon oxide film 7 in the element separation groove 5), so that the n-type semiconductor regions 19 and the element separation groove 5 might not be shaved deeply. Also, this etching is carried out under a condition that the silicon nitride film 20 is anisotropically etched, so that the silicon nitride film 20 remains on the sidewalls of the gate electrodes 14A (or word lines WL). In this manner, contact holes 28 and 29 having a very small diameter equal to or smaller than the limit resolution of photolithography are automatically aligned with the gate electrodes 14A (or word lines WL) in a self-aligning manner. To form the contact holes 28 and 29 aligned with the gate electrodes 14A (or word lines WL) in a self-aligning manner, sidewall spacers may be previously formed on the sidewalls of the gate electrodes 14A (or word lines WL) by anisotropically etching the silicon nitride film 20.

Figure 18:
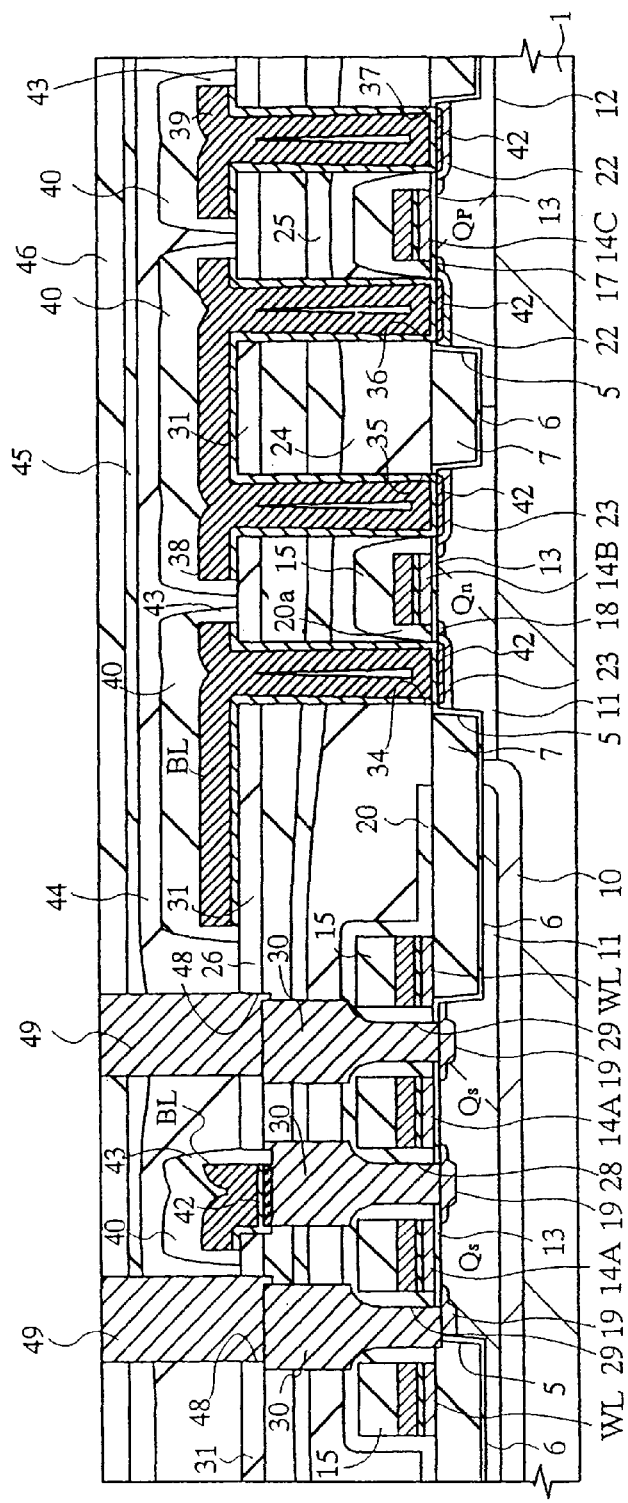
FIG. 18 is a cross-sectional view of an example of the DRAM according to the embodiment 1 under a stage of manufacturing process sequence.

Note that the surfaces of the silicon oxide film 26 and the resist film 27 in FIG. 9 are shaped such that these surfaces are lowered (or gapped) along the surface of the silicon oxide film 25 in the peripheral circuit region as shown in FIG. 18, although the shapes are omitted from FIG. 9.

Next, the photoresist film 27 is removed. Thereafter, residues of the dry etching and residues of the photoresist on the surface of the substrate exposed at the bottom portions of the contact holes 28 and 29 are removed with use of an etching solution such as a mixed solution of a hydrofluoric acid and an ammonium fluoride. At this time, the SOG film 24 exposed from the sidewalls of the contact holes 28 and 29 is subjected to the etching solution. However, since the etching rate of the SOG film 24 is lowered with respect to a hydrofluoric-acid-based etching solution by the sintering at about 800° C. described above, the sidewalls of the contact holes 28 and 29 are not greatly undercut by the wet etching processing. In this manner, it is possible to securely prevent short-circuiting between plugs, which will be embedded in the contact holes 28 and 29 in the next step.

Figure 10:
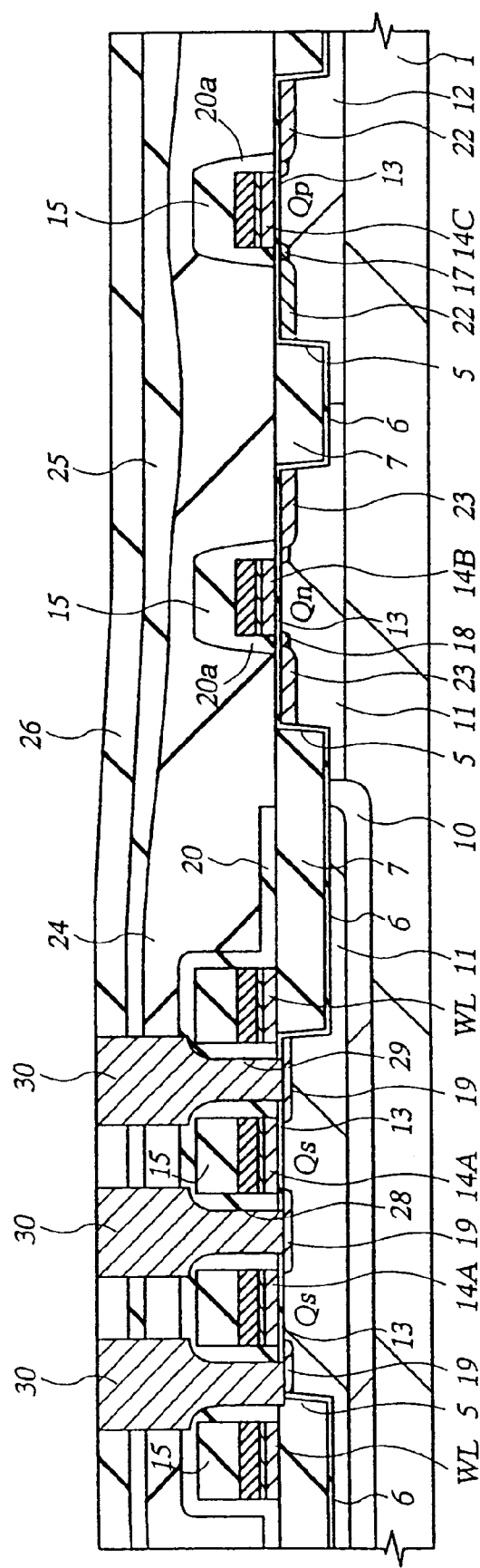
FIG. 10 is a cross-sectional view of an example of the DRAM according to the embodiment 1 under a stage of manufacturing process sequence.

Next, as shown in FIG. 10, plugs 30 are formed in the contact holes 28 and 29. The plugs 30 are formed by depositing a polycrystalline silicon film doped with n-type impurities (such P (phosphorus)) on the silicon oxide film 26 and by thereafter polishing the polycrystalline silicon film so as to remain in the contact holes 28 and 29, by a CMP method.

Figure 11:
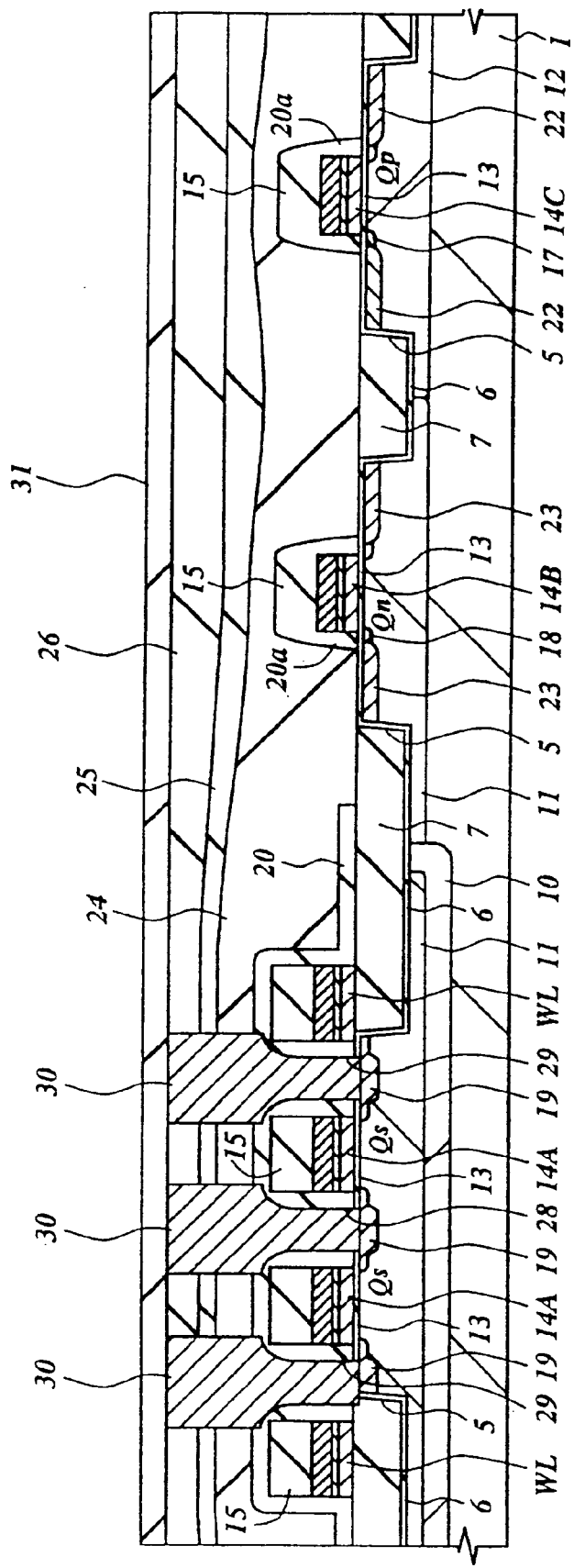
FIG. 11 is a cross-sectional view of an example of the DRAM according to the embodiment 1 under a stage of manufacturing process sequence.

Next, as shown in FIG. 11, a silicon oxide film 31 having a film thickness of about 200 nm is deposited on the silicon oxide film 26, and thereafter, the semiconductor substrate 1 is subjected to a heat treatment at about 800° C. The silicon oxide film 31 is deposited by a plasma CVD method in which, for example, ozone (O$_3$) and tetraethoxysilane (TEOS) are used for a source gas. By this heat treatment, the n-type impurities in the polycrystalline silicon film forming the plugs 30 are diffused into the n-type semiconductor regions 19 (source and drain) of the memory cell selection MISFET Qs from the bottom portions of the contact holes 28 and 29, thereby lowering the resistance of the n-type semiconductor regions 19.

Figure 12:
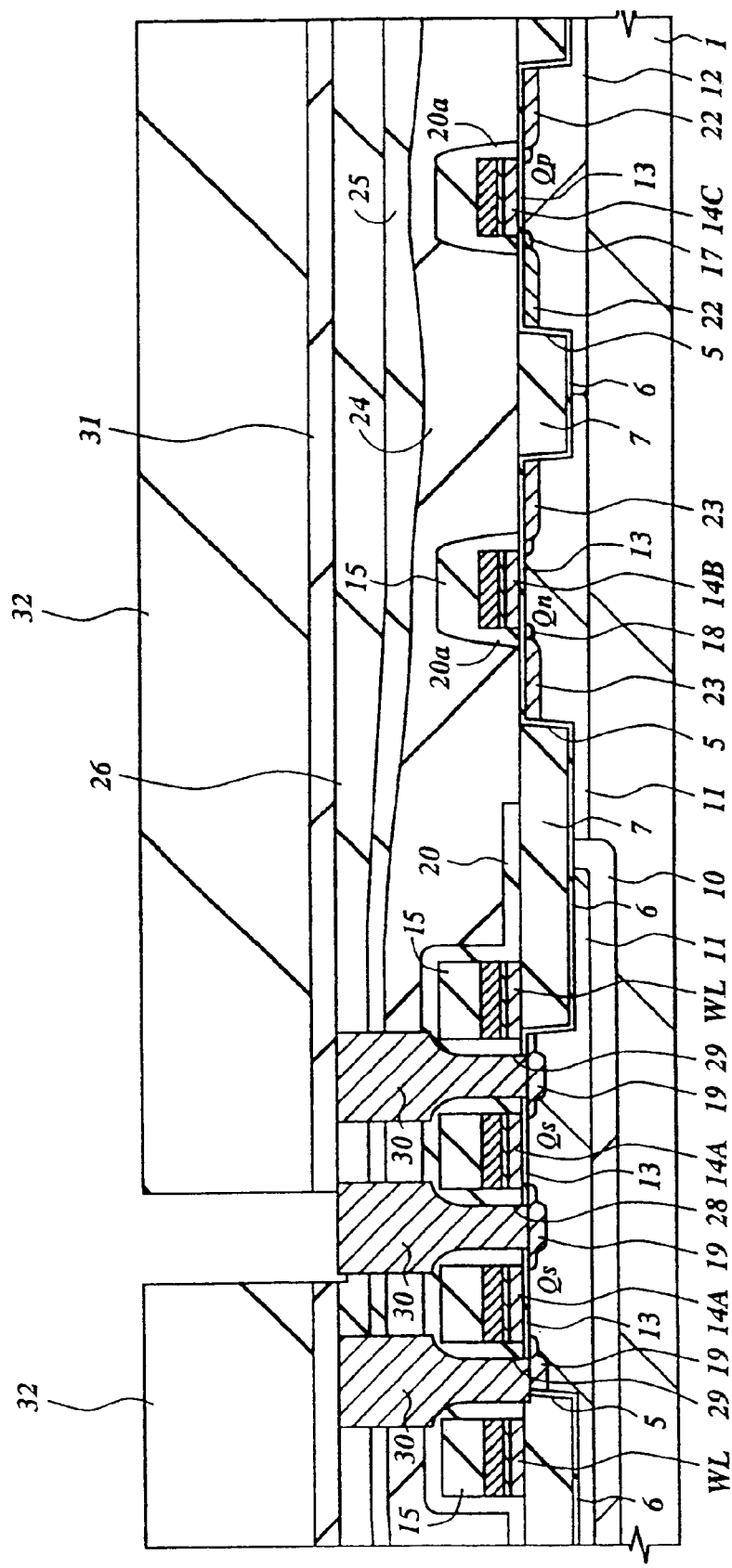
FIG. 12 is a cross-sectional view of an example of the DRAM according to the embodiment 1 under a stage of manufacturing process sequence.
Figure 13:
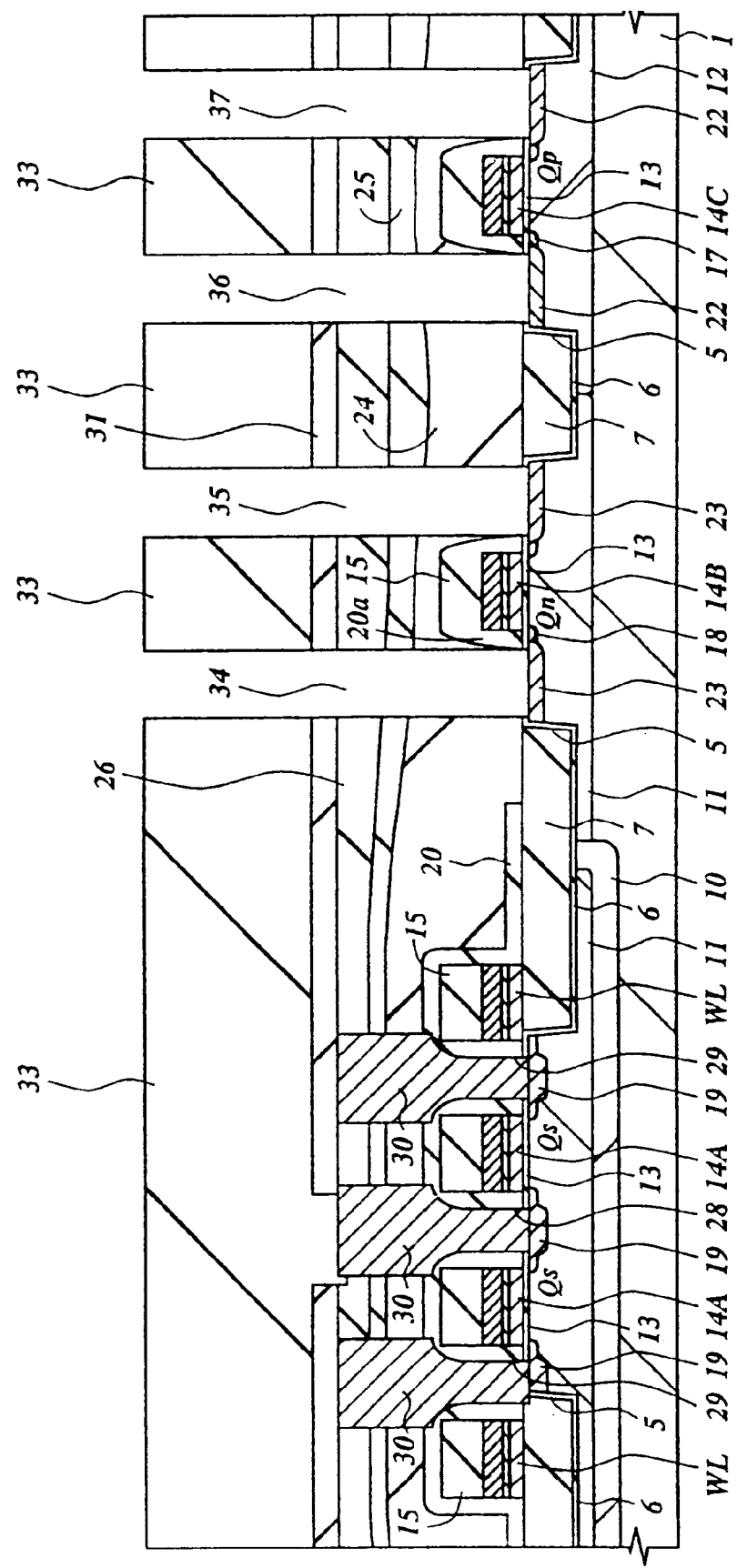
FIG. 13 is a cross-sectional view of an example of the DRAM according to the embodiment 1 under a stage of manufacturing process sequence.

Next, as shown in FIG. 12, the silicon oxide film 31 above the contact hole 28 is removed by dry etching with a photoresist film 32 used as a mask, thereby to expose the surfaces of the plug 30. Next, the photoresist film 32 is removed. Thereafter, the silicon oxide films 31, 26, and 25, the SOG film 24, and the gate oxide film 13 are removed in the peripheral circuit region by dry etching with a photoresist film 33 used as a mask, thereby to form contact holes 34 and 35 above the n$^+$-type semiconductor regions 23 (source and drain) of the n-channel type MISFET Qn, as well as contact holes 36 and 37 above the p$^+$-type semiconductor regions 23 (source and drain) of the p-channel type MISFET Qp.

Figure 14:
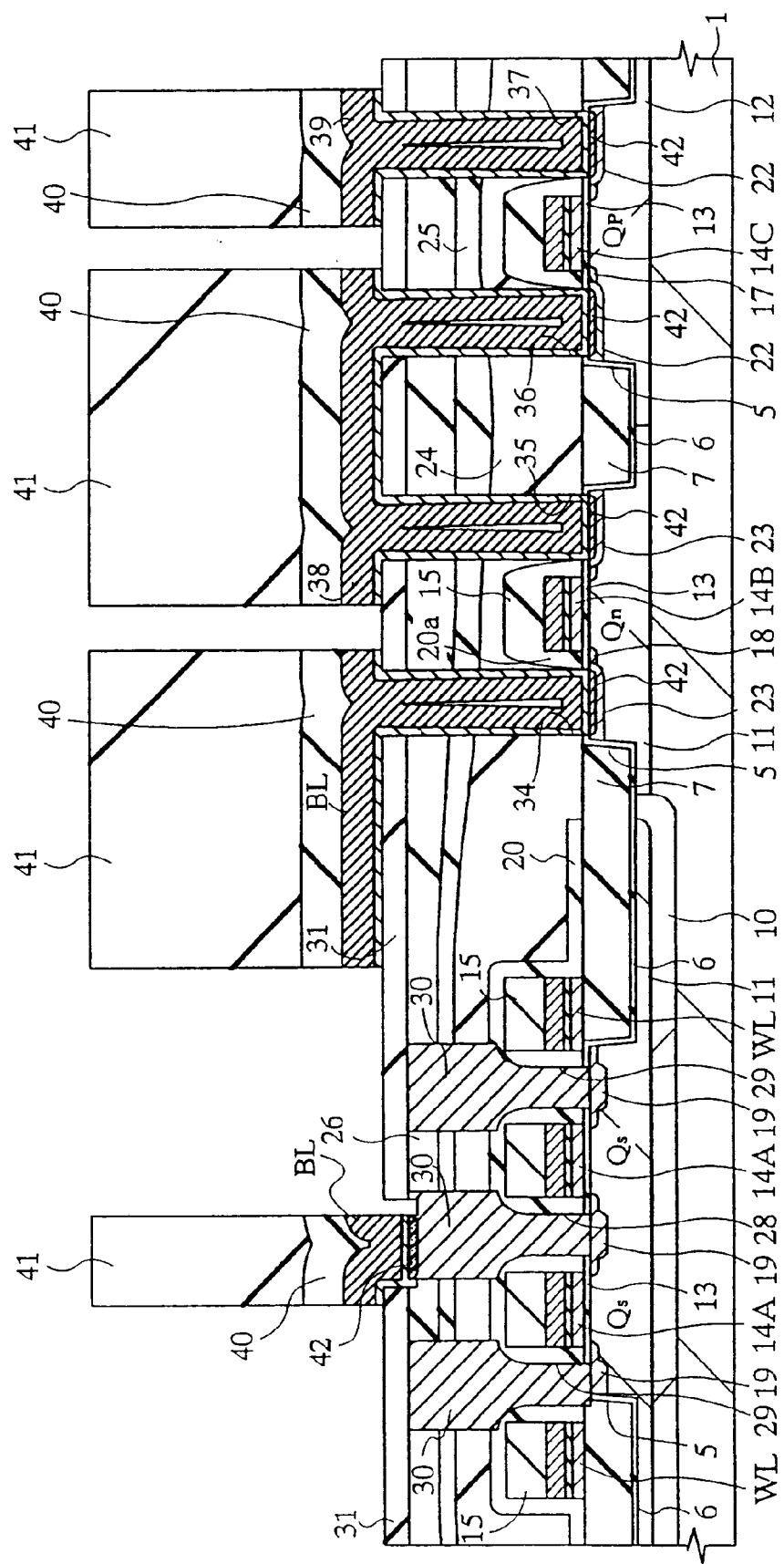
FIG. 14 is a cross-sectional view of an example of the DRAM according to the embodiment 1 under a stage of manufacturing process sequence.

Next, the photoresist film 33 is removed, and thereafter, as shown in FIG. 14, bit lines BL and first layer wires 38 and 39 of the peripheral circuit are formed on the silicon oxide film 31. To form the bit lines BL and the first layer wires 38 and 39, a Ti film having film thickness of about 50 nm is deposited on the silicon oxide film 31 by a sputtering method, and the semiconductor substrate 1 is subjected to a heat treatment at 800° C. Subsequently, a TiN film having a film thickness of about 50 nm is deposited on the Ti film by a sputtering method, and further, a W film having a film thickness of about 150 nm and a silicon nitride film 40 having a film thickness of about 200 nm are deposited thereon. Thereafter, these films are subjected to patterning with a photoresist film 41 used as a mask.

Since the semiconductor substrate 1 is subjected to a heat treatment at 800° C. after the Ti film is deposited on the silicon oxide film 31, the Ti film and Si of an under layer thereof react with each other thereby forming a TiSi$_2$ (titanium silicide) layer 42 of a low resistance on the surfaces of the n$^+$-type semiconductor regions 23 (source and drain) of the n-channel type MISFET Qn, the surfaces of the p$^+$-type semiconductor regions 22 (source and drain) of the p-channel type MISFET Qp, and the surfaces of the plugs 30. In this manner, it is possible to reduce the contact resistance of the wires (such as bit lines BL and the first layer wires 38 and 39) connected to the n$^+$-type semiconductor regions 23 and the p$^+$-type semiconductor regions 22. In addition, since the bit line BL is formed of a W film, TiN film, and a Ti film, the sheet resistance thereof can be reduced to 2 Ω/□ or less. Therefore, the reading rate and writing rate can be improved and the bit lines BL and the first layer wires 38 and 39 of the peripheral circuit can be fabricated at a time by a simple manufacturing stage, so that the manufacturing steps of the DRAM can be shortened. Further, if the first layer wires 38 and 39 of the peripheral circuit are formed of the wire in the same layer as the bit lines, the aspect ratio of the contact holes (34 to 37) connecting the MISFETs (including the n-channel type MISFET Qn and the p-channel type MISFET Qp) of the peripheral circuit with the first layer wires can be reduced in comparison with the case where the first layer wires are formed of a Al wire as an upper layer above the memory cell, so that the reliability concerning the connection of the first layer wires can be improved.

The bit lines BL are formed such that the distance between adjacent bit lines BL is longer than the bit line BL in order that a parasitic capacity formed between adjacent bet lines BL is reduced as much as possible so that the reading rate and the writing rate for information are improved. Therefore, the distance between adjacent bit lines is set to, for example, 0.24 μm and the width of the bit line is set to, for example, 0.22 μm.

Although there is a possibility that the TiSi$_2$ layer 42 is deteriorated due to a heat treatment, and one of possible heat treatment is a step of forming a capacity insulating film for an information storage capacitor, which will be described later. However, as will be explained later, the step of forming the capacity insulating film is performed at a lowered temperature according to the present embodiment, and therefore, the TiSi$_2$ layer 42 is not deteriorated by the heat treatment and the drawback of increase of the contact resistance or the like is not caused.

Figure 15:
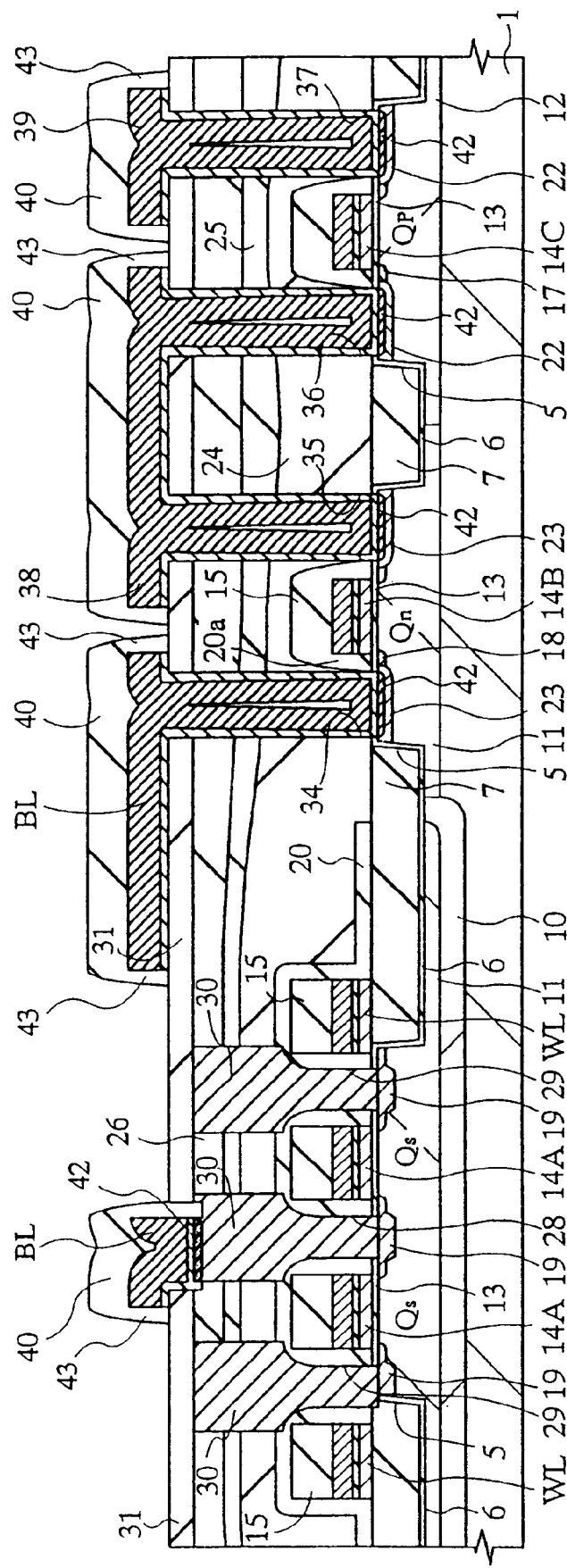
FIG. 15 is a cross-sectional view of an example of the DRAM according to the embodiment 1 under a stage of manufacturing process sequence.

Next, the photoresist film 41 is removed, and thereafter, sidewall spacers 43 are formed on the sidewalls of the bit lines BL and the first layer wires 38 and 39, as shown in FIG. 15. The sidewall spacers 43 are formed by depositing a silicon nitride film on the bit lines BL and the first layer wires 38 and 39, by a CVD method, and by thereafter anisotropically etching the silicon nitride film.

Figure 16:
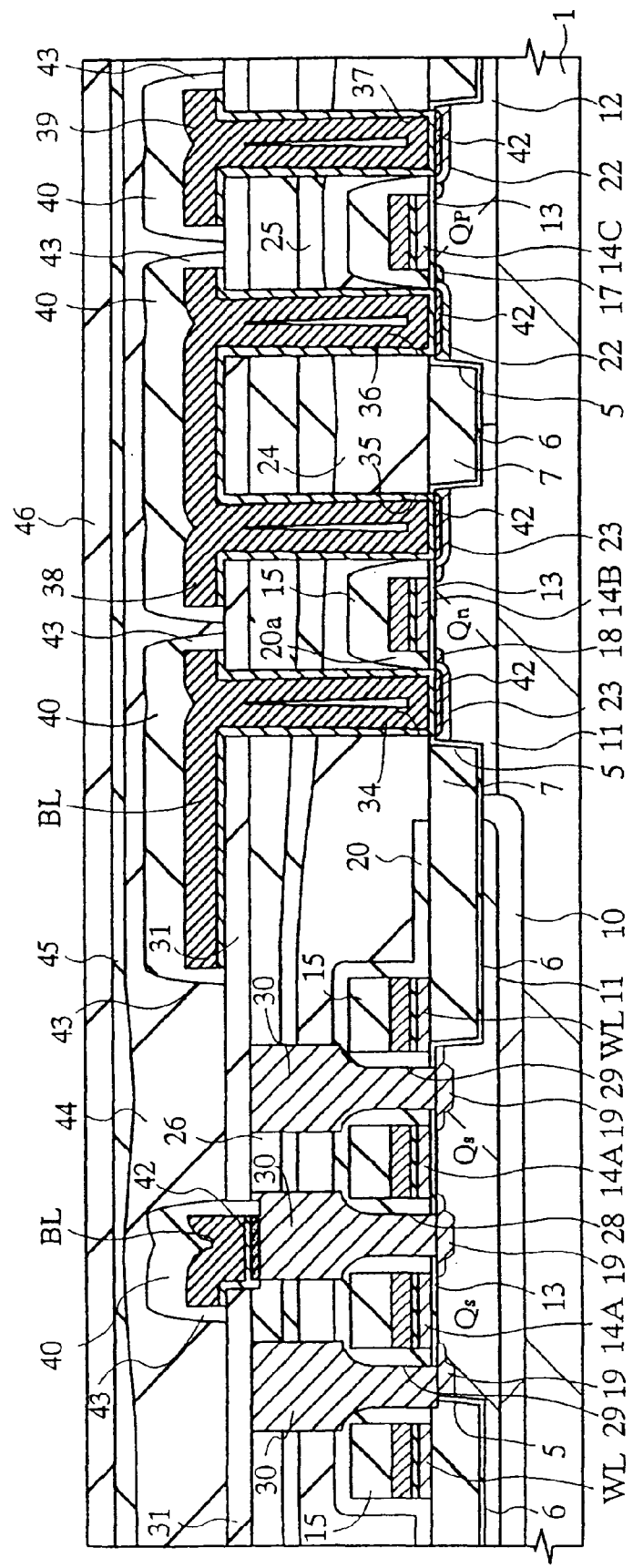
FIG. 16 is a cross-sectional view of an example of the DRAM according to the embodiment 1 under a stage of manufacturing process sequence.

Next, as shown in FIG. 16, a SOG (Spin On Glass) film 44 having a film thickness of about 300 nm is spin-coated above the bit lines BL and the first layer wires 38 and 39. Subsequently, the semiconductor substrate 1 is subjected to a heat treatment at 800° C. for about one minute, thereby to sinter (densify) the SOG film 44. The SOG film 44 has a high reflow characteristic compared with a BPSG film and has an excellent characteristic of filling gaps between fine wires, so that it is possible to fill excellently the gaps between the bit lines which are microfabricated up to the limit resolution of the photolithography. Also, the SOG film 44 achieves a high reflow characteristic without carrying out a heat treatment for a long time and at a high temperature, which will be required for a BPSG film. Therefore, it is possible to restrict the thermal diffusion of impurities contained in the source and drain of the memory cell selection MISFET Qs formed under the bit lines BL, and the source and drain of the MISFETs (n-channel type MISFET Qn and p-channel type MISFET Qp) of the peripheral circuit can be reduced, also it is possible to reduce the depth of the channel region. Further, since deterioration of metal forming the gate electrodes 14A (or word lines WL) and the gate electrodes 14B and 14C can be restricted, it is possible to make the MISFETs forming the memory cell and the peripheral circuit of a DRAM have high performance. Also, deterioration of the Ti film, TiN film, and W film forming the bit lines BL and the first layer wires 38 and 39 can be restricted thereby to reduce the wiring resistance.

Next, a silicon oxide film 45 having a film thickness of about 600 nm is deposited on the SOG film 44, and thereafter, the silicon oxide film 45 is polished by a CMP method thereby to flatten the surface of the film. The silicon oxide film 45 is deposited by a plasma CVD method using, for example, ozone (O$_3$) and tetraethoxysilane (TEOS) for a source gas.

Thus, according to the present embodiment, the SOG film 44 which ensures excellent flatness even immediately after film formation is coated above the bit lines BL and the first layer wires 38 and 39, and the silicon oxide film 45 deposited is flattened by a CMP method. In this manner, the gap-fill property between bit lines BL can be improved, and flattening of the insulating film above the bit lines BL and the first layer wires 38 and 39 can be realized. Also, since no heat treatment is performed for a long time at a high temperature, deterioration of the characteristics of the MISFETs forming part of the memory cell and the peripheral circuit can be prevented from being deteriorated and high performance can be realized. Beside, the resistance of the bit lines BL and the first layer wires 38 and 39 can be lowered.

Next, a silicon oxide film 46 having film thickness of about 100 nm is deposited on the silicon oxide film 45. This silicon oxide film 46 is deposited in order to repair fine flaws on the surface of the silicon oxide film 45, which are caused during polishing by a CMP method. The silicon oxide film 46 is deposited by a plasma CVD method using, for example, ozone ($O_3$) and tetraethoxysilane (TEOS) for a source gas.

Figure 17:
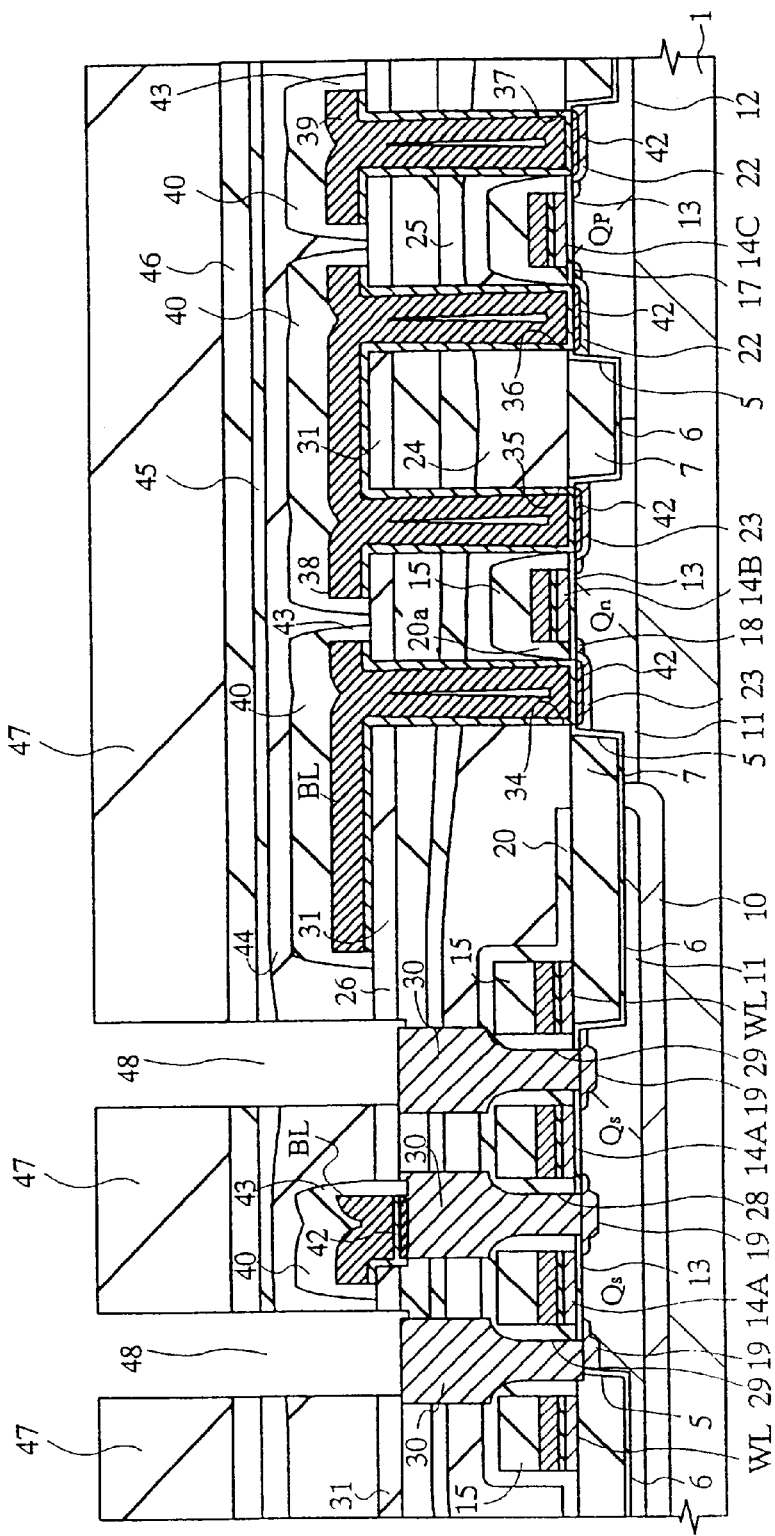
FIG. 17 is a cross-sectional view of an example of the DRAM according to the embodiment 1 under a stage of manufacturing process sequence.

Next, as shown in FIG. 17, the silicon oxide films 46 and 45, the SOG film 44, and the silicon oxide film 31 above the contact holes 39 are removed by dry etching with a photoresist film 47 used as a mask, thereby to form through holes 48 which reach the surfaces of the plugs 30. This etching is carried out under a condition that the etching rate of the silicon nitride film is reduced to be small relative to the etching rates of the silicon oxide films 46, 45, and 31 and the SOG film 44, so that the silicon nitride film 40 above the bit lines BL and the side wall spacers 43 might not be shaved deeply even if the through holes 48 and the bit lines BL are misaligned with each other. In this manner, the through holes 48 are formed, automatically aligned with the bit lines BL in a self-aligning manner.

Next, the photoresist film 47 is removed, and thereafter, residues of the dry etching and residues of the photoresist on the surfaces of the plugs 30 exposed at the bottom portions of the through holes 48 are removed with use of an etching solution such as a mixed solution of a hydrofluoric acid and ammonium fluoride. At this time, the SOG film exposed on the sidewalls of the through holes 48 are subjected to the etching solution. However, since the etching rate of the SOG film 44 is lowered with respect to a hydrofluoric-acid-based etching solution by the above-mentioned sintering at about 800° C., the sidewalls of the through holes 48 are not greatly undercut by the wet etching processing. In this manner, short-circuiting between the plugs which will be buried inside through holes 48 in the next step and the bit lines BL can be securely prevented. In addition, the plugs and the bit lines BL can be sufficiently arranged apart from each other, so that increase of the parasitic capacity of the bit lines BL can be prevented.

Next, as shown in FIG. 18, plugs 49 are formed in the through holes 48. The plugs 49 are made of a metal compound such as a titanium nitride film or the like. The plugs 49 are capable of reducing reaction between a reaction protect layer 50 and the plugs 30 when forming the reaction protect layer 50 which will be explained layer. In this manner, a material such as a silicon oxide or the like which impedes the conductance between the plugs 30 and 40 is prevented from being formed therebetween, and the connection between the information storage capacitor and the memory cell selection MISFET Qs can be maintained with excellence. The plugs 49 are formed by depositing, for example, a titanium nitride film on the silicon oxide film 46 by a sputtering method or a CVD method, and by etching back the film 46 so as to remain only in the through holes 48. In place of this etching back, the titanium nitride film may be removed by polishing by a CMP method.

Note that the plugs 49 are not limited to a metal compound such as a titanium nitride film or the like described above but may be formed by a polycrystalline silicon film.

Figure 19:
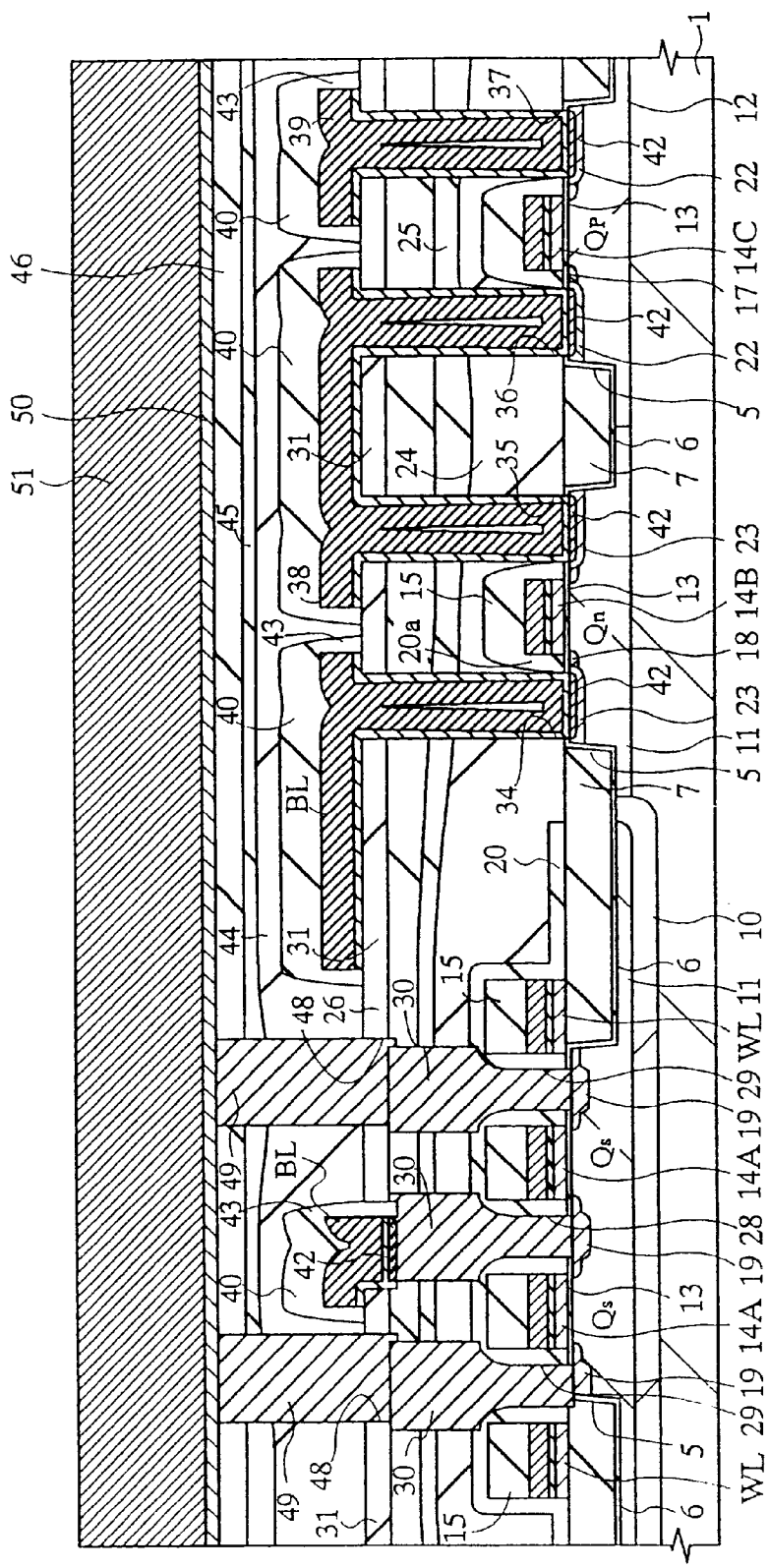
FIG. 19 is a cross-sectional view of an example of the DRAM according to the embodiment 1 under a stage of manufacturing process sequence.

Next, as shown in FIG. 19, a reaction protect layer 50 and a ruthenium (Ru) film 51 are deposited on the plugs 49 and the silicon oxide film 46. A ruthenium oxide film is cited as an example of the reaction protect layer 50. This ruthenium film 51 will form a lower electrode later. The film thickness of the reaction protect layer 50 can be set approximately to several nm to 50 nm. Also, the film thickness of the ruthenium film 51 can be set to, for example, 0.5 $\mu$m. Note that this value of 0.5 $\mu$m defines the height of the lower electrode and can be adjusted by the area of the lower electrode, i.e., by the capacity value to be maintained. The reaction protect layer 50 can be formed by a sputtering method or a CVD method. Note that the reaction protect layer 50 is not an essential component but may be omitted.

The ruthenium film 51 can be formed by a sputtering method regarding ruthenium as a target or a CVD method using an organic ruthenium gas as a material gas. Note that a ruthenium oxide film, tungsten film, titanium nitride film, or the like may be used in place of the ruthenium film 51.

Figure 20:
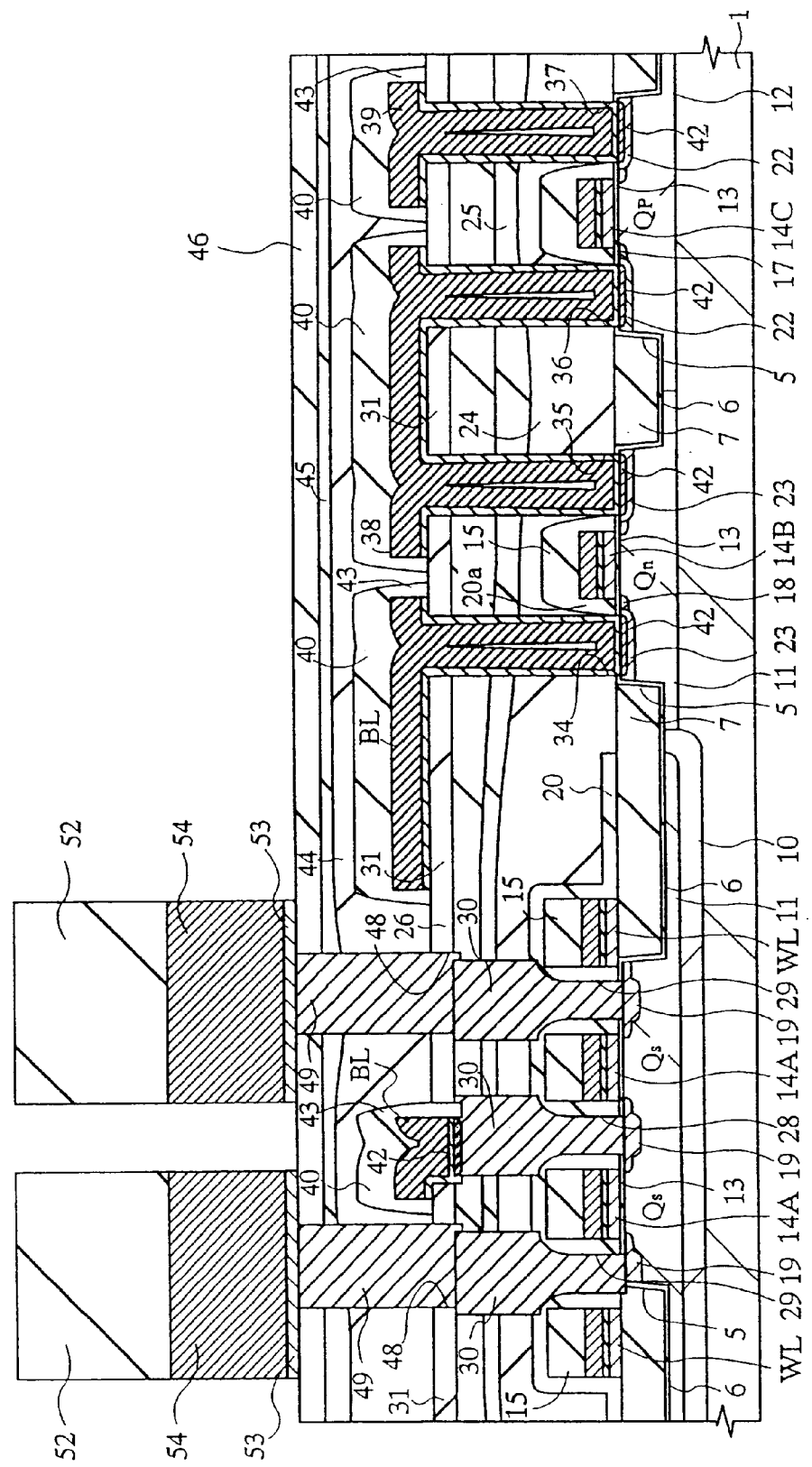
FIG. 20 is a cross-sectional view of an example of the DRAM according to the embodiment 1 under a stage of manufacturing process sequence.

Next, as shown in FIG. 20, a photoresist film 52 is formed on the ruthenium film 51, and the ruthenium film 51 and the reaction protect layer 50 are etched and removed with this photoresist film 52 used as a mask, for example, by a RIE (Reactive Ion Etching) method. Thus, lower electrodes 54 made of the reaction protect layer 53 and the ruthenium film 51 are formed. The reaction protect layer 53 functions to prevent oxygen from entering during a heat treatment in an oxidation atmosphere for a capacity insulating film, which will be explained later.

Figure 21:
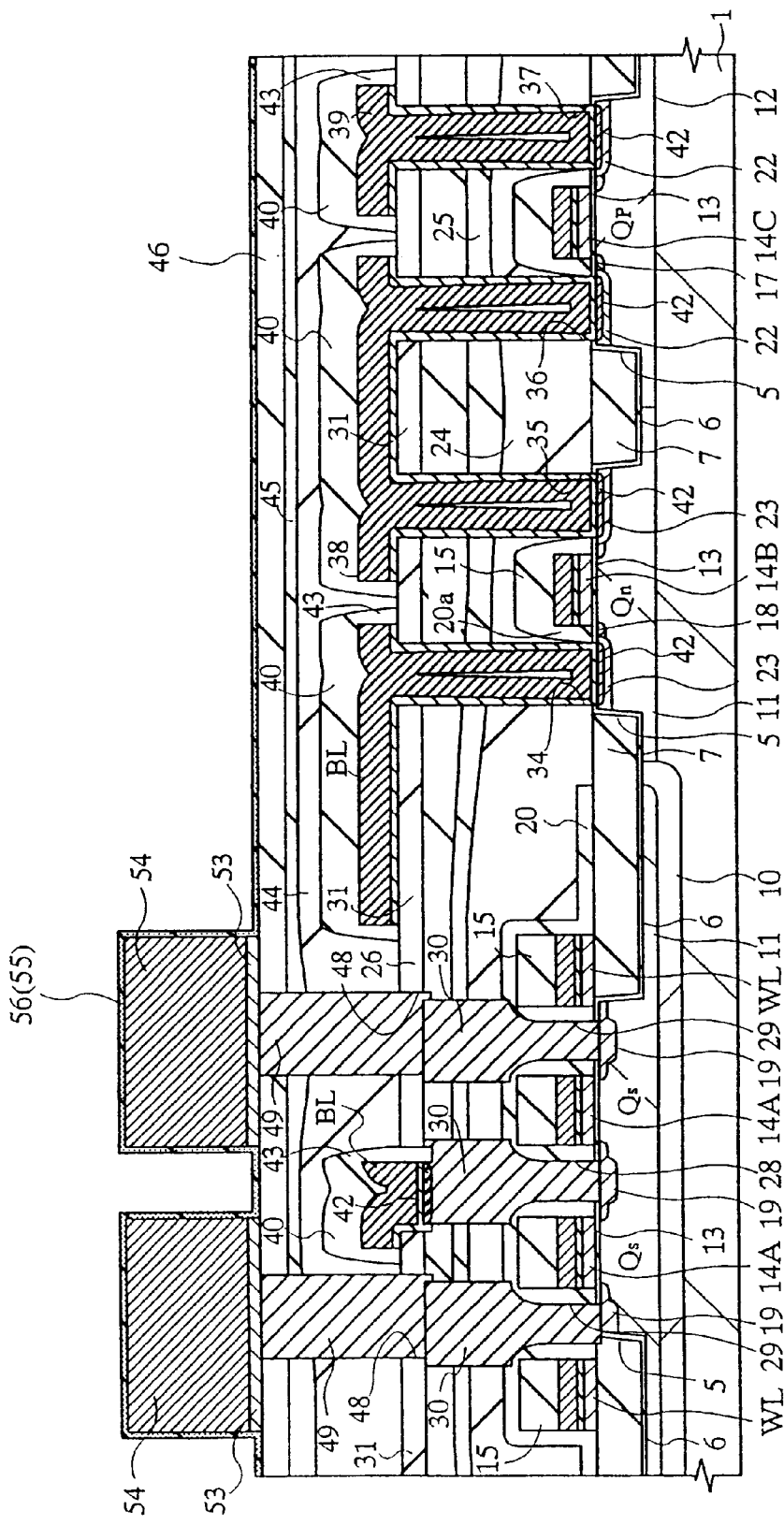
FIG. 21 is a cross-sectional view of an example of the DRAM according to the embodiment 1 under a stage of manufacturing process sequence.

Next, the photoresist film 52 is removed, and thereafter, a tantalum oxide film 55 having a film thickness of 10 nm or less is deposited on the entire surface of the semiconductor substrate 1, as shown in FIG. 21. The tantalum oxide film 55 is deposited by a thermal CVD method under a depressurized condition (e.g., 400 mTorr) at 550° C. or less where a gas containing pentaethoxytantalum ($Ta(C_2H_5O)_5$) is used as a material gas. Note that a mixed gas of oxygen and a pentaalkyltantalum such as ($Ta(C_2H_5)_5$) or the like may be used as a material gas to form the tantalum oxide film 55.

By thus setting the film thickness of the tantalum oxide film 55 to 10 nm or less, it is possible to reduce the stress of the first polycrystalline tantalum oxide film and improve the morphology and density thereof, after a heat treatment of the tantalum oxide film 55 which will be described later. Also, by depositing the tantalum oxide film 55 by a thermal CVD method, it is possible to obtain a tantalum oxide film 55 which has excellent step coverage.

Next, the tantalum oxide film 55 is subjected to a heat treatment and is thereby crystallized to form a polycrystalline tantalum oxide film 56. The heat treatment of the tantalum oxide film 55 is carried out under a temperature condition of 650° C. or more in an oxidation atmosphere. Since the temperature of 650° C. is a crystallization temperature of tantalum oxide, the temperature must be 650° C. or more in order to obtain an excellently crystallized tantalum oxide film. Also, the treatment is carried out in an oxidation atmosphere in order to recover oxygen defect of crystallized tantalum oxide and to attain polycrystalline tantalum oxide film having an excellent crystal characteristic. For example, the first condition of a treatment period of 1 to 10 minutes at a treatment temperature of 700 to 850° C. in an oxygen atmosphere or a second condition of a treatment period of 1 to 10 minutes at a treatment temperature of 650 to 850° C. in a dinitrogen monoxide atmosphere is cited.

Also, the heat treatment of the tantalum oxide film 55 may be carried out in a manner in which a first treatment is carried out at a temperature of 600° C. or less in an oxygen atmosphere and a second treatment is carried out under a condition at a treatment temperature of 650 to 850° C. for a treatment period of 1 to 10 minutes in an inert-gas atmosphere. Otherwise, these first and second treatments may be carried out reversely, i.e., the second treatment is carried out under a condition at a treatment temperature of 650 to 850° C. for a treatment period of 1 to 10 minutes in an inert-gas atmosphere and the first treatment is thereafter carried out at a temperature of 600° C. or less in an oxygen atmosphere. Thus, crystallization of the tantalum oxide film can be carried out separately from the oxidation processing. Any of the oxidation processing and the crystallization processing may be carried out first. The first treatment can be carried out under a third condition at a treatment temperature of 300 to 500° C. in an ozone atmosphere or a fourth condition at a treatment temperature of 550 to 600° C. in an oxygen atmosphere.

The crystallization through treatments of two stages is effective for the case where the oxidation of the lower electrodes 54 is a matter. That is, the tantalum oxide film 55 is crystallized in an inactive atmosphere, and the crystallized tantalum oxide film can be thereafter subjected to oxidation processing under such a loose condition that the lower electrode is not oxidized. Conversely, the tantalum oxide film can be subjected to oxidation processing under such a loose condition that the lower electrode is not oxidized, and thereafter, the heat treatment can be carried out in an inactive atmosphere. Processing at 400° C. in an ozone atmosphere is cited as an example of the oxidation processing under a loose condition.

This oxidation processing is a measure for charging oxygen against oxygen defect of the crystallized tantalum oxide film 56 caused by crystallization thereof. Note that a necessary heat treatment temperature varies depending on the property of the oxidation (mechanism) of the oxygen gas forming the oxygen atmosphere. That is, the treatment temperature can be lower with use of dinitrogen monoxide than with use of oxygen, and the treatment temperature can be much lower with use of ozone than with use of dinitrogen monoxide.

Thus, crystallization by a heat treatment in an oxidation atmosphere or oxidation processing after a crystallization heat treatment or crystallization processing after oxidation processing is performed on the tantalum oxide film 55 having a film thickness of 10 nm or less. Therefore, it is possible to reduce the stress of the crystallized tantalum oxide film 56 after crystallization and to improve the morphology and density thereof. Detailed data thereof will be described later.

Figure 22:
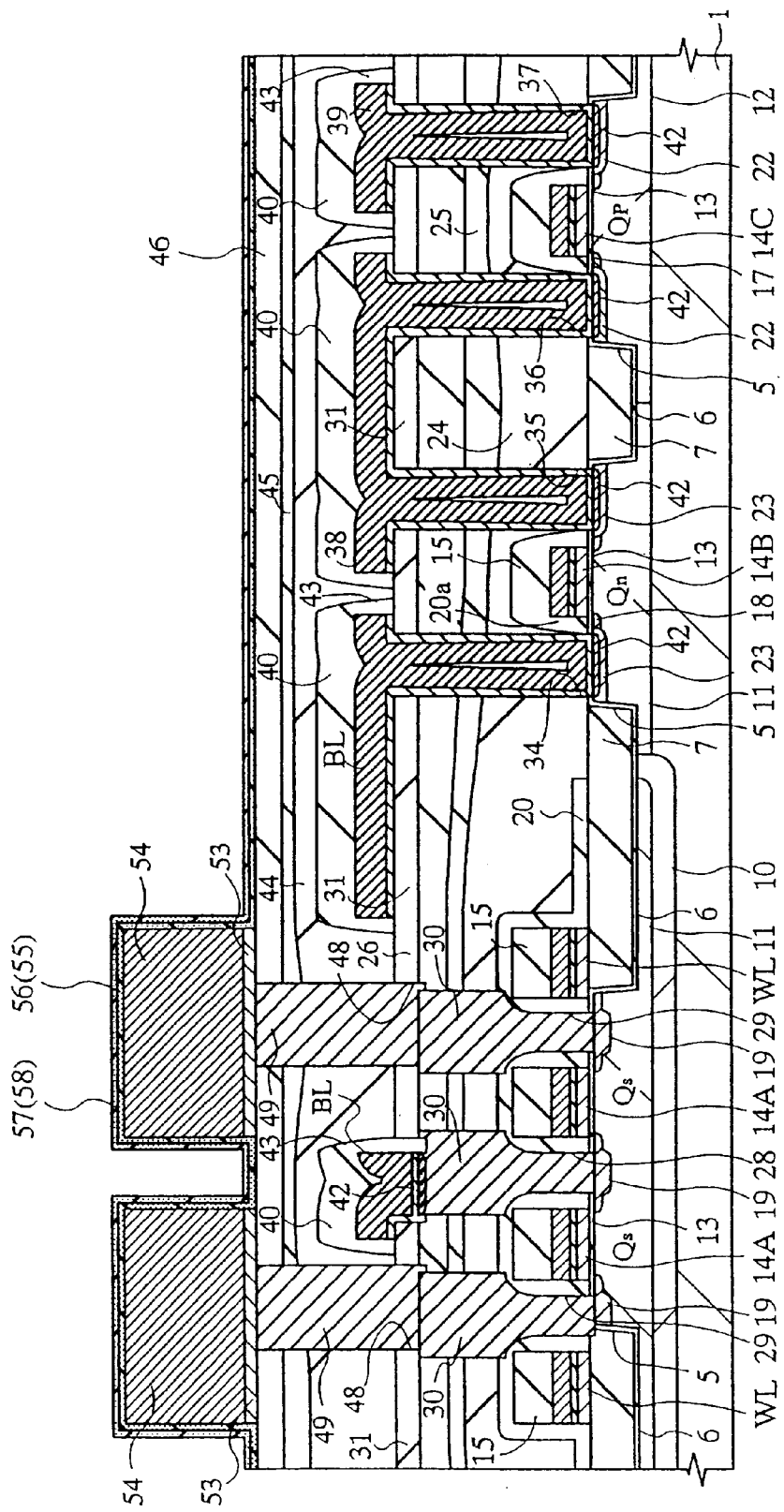
FIG. 22 is a cross-sectional view of an example of the DRAM according to the embodiment 1 under a stage of manufacturing process sequence.

Next, as shown in FIG. 22, a second tantalum oxide film 57 having a film thickness of 10 nm or less is deposited on the crystallize tantalum oxide film 56. Deposition of the tantalum oxide film 57 can be achieved in the same manner as in the tantalum oxide film 55. Further, the tantalum oxide film 57 is subjected to and crystallized by a heat treatment, thereby to form a second crystallize tantalum oxide film 58. The method of crystallizing the tantalum oxide film 57 is the same as that of crystallizing the tantalum oxide film 55 thereby to form a crystallized tantalum oxide film 56. A capacity insulating film comprising the crystallized tantalum oxide films 56 and 58 is thus formed.

Since the second tantalum oxide film 57 is deposited on a crystallized tantalum film 56 as a polycrystalline film of tantalum oxide, there is a case that the tantalum oxide crystal kept in a state as deposited is formed. In this case, the tantalum oxide film 57 becomes an amorphous film partially containing tantalum oxide crystal, so that a low treatment temperature can be set in the step of crystallizing the tantalum oxide film 57 to form the crystallized tantalum oxide film 58.

Thus, the second tantalum oxide film 57 is formed with a film thickness of 10 nm or less like the tantalum oxide film 55 described before, and the tantalum oxide film 57 is crystallized to form the crystallized tantalum oxide film 58. Therefore, it is possible to reduce the stress of the crystallized tantalum oxide film 58 and to improve the morphology and density thereof.

Figure 23:
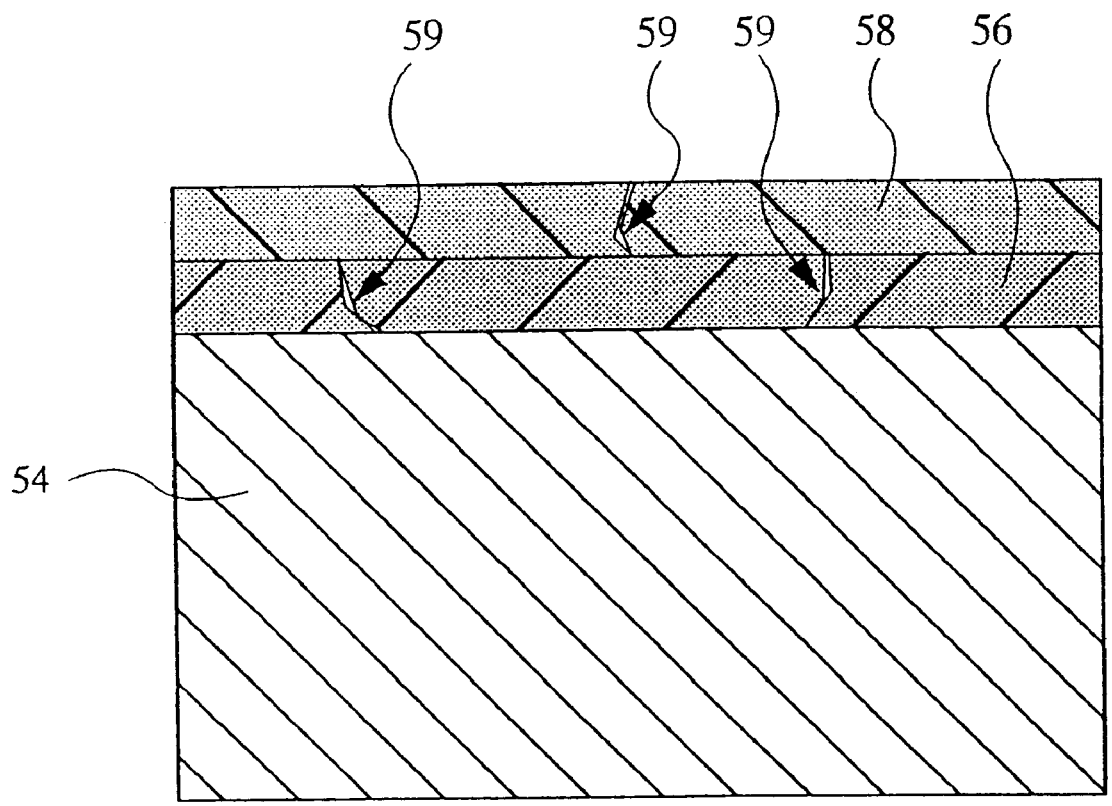
FIG. 23 is a cross-sectional view of an example of the DRAM according to the embodiment 1 under a stage of manufacturing process sequence.

Also, since the tantalum oxide film 58 is formed to be layered on the crystallized tantalum oxide film 56, the leakage current of the capacity insulating film can be reduced in comparison with the case where only one crystallized tantalum oxide film is used. FIG. 23 is an enlarged cross-sectional view showing portions of the lower electrode 54 and the crystallized tantalum oxide films 56 and 58 formed under the lower electrode. As shown in FIG. 23, the crystallized tantalum oxide films 56 and 58 each have grain boundary 59 of the tantalum oxide crystals. However, since the grain boundary of each layer are terminated by the other layer, no grain boundary extending from the lower electrode reaches the upper electrode formed on the crystallized tantalum oxide film 58. Therefore, the grain boundary 59 which are main factors causing paths for leakage currents are divided by any of the crystallized tantalum oxide films 56 and 58, and as a result, the insulation of the capacity insulating film can be maintained.

In addition, the crystallized tantalum films 56 and 58 forming the capacity insulating film are each formed at a film thickness of 10 nm or less, Therefore, the stress of each of the crystallized tantalum oxide films 56 and 58 is reduced, and the morphology and the density thereof are improved as described above. Accordingly, the capacity insulating film formed as a multi layered film comprising the crystallized tantalum oxide films 56 and 58 having improved characteristics also attains a reduced stress and improved morphology and density.

Further, since the capacity insulating film according to the present embodiment is thus formed as a multi layered film comprising the crystallized tantalum oxide films 56 and 58 having excellent quality, the film quality of the capacity insulating film is arranged to be uniform in the film thickness direction. If the capacity insulating film 1 is formed of a single layer of crystallized tantalum oxide film, the film quality varies along the film thickness direction, and in some cases, the film thickness at the part of the uppermost layer is reduced so that the film does not substantially function as an insulating film. There is a case that this deterioration concerning the film thickness can be understood as a phenomenon of increase of the film stress or reduction of the film density due to deterioration of the morphology. In this case, the uppermost region of the capacity insulating film cannot substantially function as an excellent insulating film but causes decrease of the withstand voltage of the capacity insulating film or increase of the leakage current. However, according to the present embodiment, the crystallized tantalum oxide films 56 and 58 forming the capacity insulating film are respectively formed in separate stages, and therefore, excellent film quality can be maintained and can also be realized at any region in the film thickness direction thereof in the capacity insulating film formed of the multi layered film. Therefore, the capacity insulating film according to the present embodiment is capable of improving the withstand voltage and reducing the leakage current.

Note that the sum film thickness of the film crystallized tantalum oxide films 56 and 58, i.e., the film thickness of the capacity insulating film can be set within a range of 10 nm to 40 nm. In the present embodiment, since a ruthenium film is adopted to the lower electrodes 54, ruthenium oxide has conductivity if ruthenium is oxidized by oxidation processing when forming the tantalum oxide films 56 and 58. Therefore, there is no substantial increase of the film thickness of the capacity insulating film due to ruthenium oxide. Accordingly, the capacity insulating film can be formed of only the multi layered film comprising the crystallized tantalum oxide films 58 and 56, and therefore, a designing margin can be given to the film thickness of this multi layered film so that a film thickness up to 40 nm is tolerable.

In addition, the heat treatments for crystallizing the tantalum oxide films 55 and 57 should preferably be carried out at 900° C. or less since thermal deterioration of the $TiSi_2$ layer needs to be reduced. However, both the heat treatments are carried out at 850° C. or less in the present embodiment, and therefore, thermal deterioration of the $TiSi_2$ layer 42 can be reduced.

Also, metal for forming the lower electrodes 54 such as a ruthenium oxide film in case of the present embodiment in which the lower electrodes 54 are made of ruthenium can be previously formed before forming the tantalum oxide film 55. If the lower electrodes 54 are made of titanium, a titanium oxide film can be formed. These ruthenium oxide films are formed by a sputtering method, CVD method, or oxidation processing of the lower electrodes 54. Of a ruthenium oxide film is formed on the lower electrodes 54 in advance, the lower electrodes have been already oxidized when performing the crystallization processing of the tantalum oxide film 55. Therefore, further oxidation is restricted so that unnecessary stress is not caused as for the crystallized tantalum oxide films 56 and 58 after crystallization, but the leakage current can be reduced. Note that, since ruthenium oxide is conductive, the film thickness of the capacity insulating film is not substantially increased and reduction of the storage charge amount of the information storage capacitor is not reduced.

Also, in the present embodiment, since the reaction protect layer 53 is formed of a ruthenium oxide film as described before, oxygen does not pass through the tantalum oxide film 55 or the lower electrodes 54 to reach the plugs 49, in the present heat treatment step, and reaction between ruthenium forming the lower electrodes 54 and nitrogen or titanium forming the plugs 49 can be restricted. As a result of this, the connection resistance between the plugs 49 and the lower electrodes 54 can be maintained to be low, so that the reliability can be improved with respect to the electric connection between the plugs 49 and the lower electrodes 54.

Figure 24:
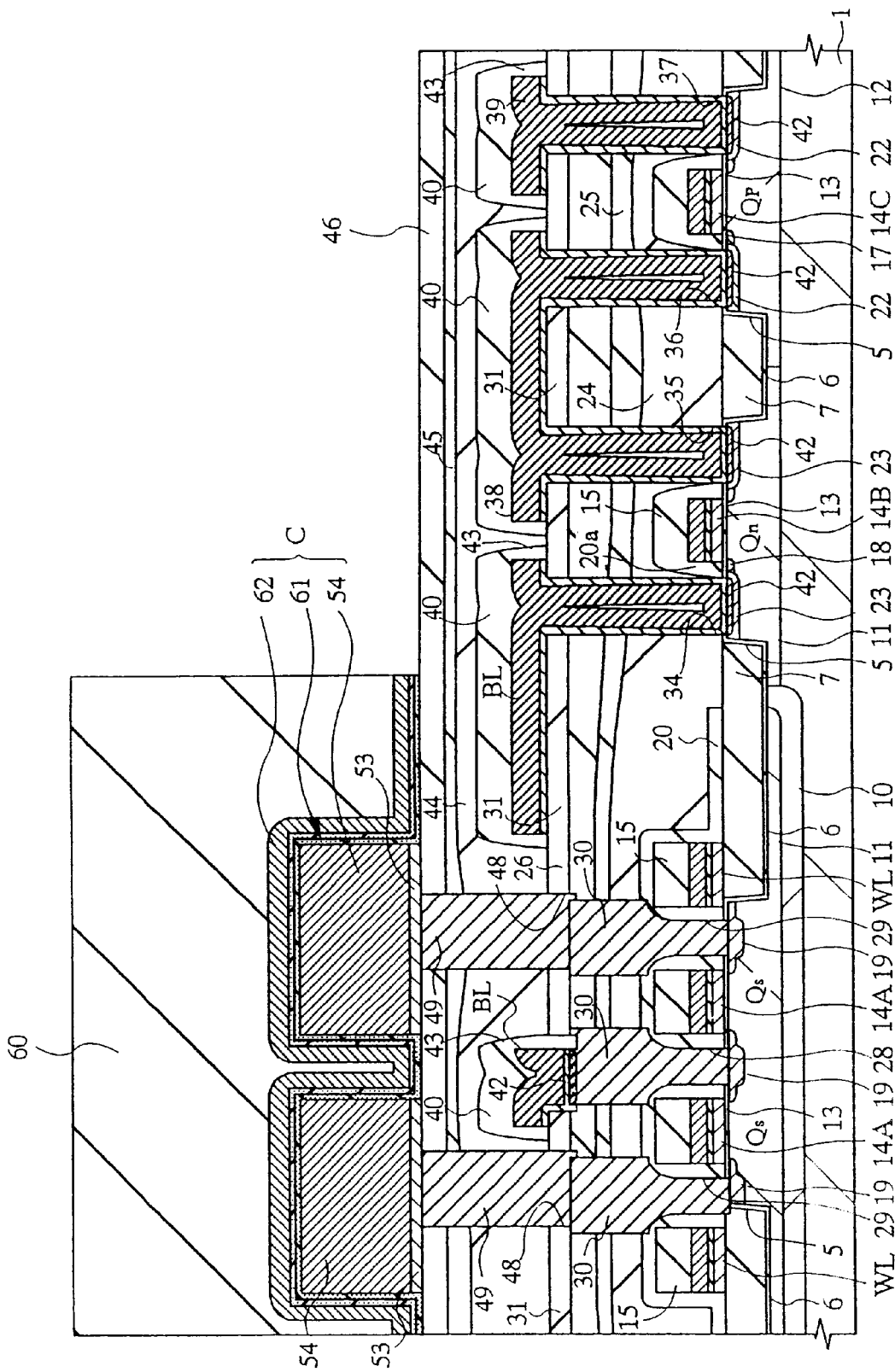
FIG. 24 is a cross-sectional view of an example of the DRAM according to the embodiment 1 under a stage of manufacturing process sequence.

Next, a titanium nitride film is deposited on the crystallized tantalum oxide film 58, and a photoresist film 60 is formed on the titanium nitride film, as shown in FIG. 24. With this photoresist mask 60 used as a mask, the titanium nitride film and the crystallized tantalum oxide films 56 and 58 are etched to form a capacity insulating film 61 and an upper electrode 62. For example, a CVD method can be used for the deposition of the titanium nitride film. Thus, an information storage capacitor C is formed which consists of the lower electrodes 54 made of ruthenium, the capacity insulating film 61 made of a multi layered film comprising the crystallized tantalum oxide films 56 and 58, and the upper electrode 62 made of titanium nitride. In this manner, a memory cell of a DRAM which consists of a memory cell selection MISFET Qs and an information storage capacitor C connected in series thereto is completed.

Note that a ruthenium oxide film, a ruthenium film, or a tungsten film may be used as the material forming the upper electrode 62, in place of the titanium nitride film.

Figure 25:
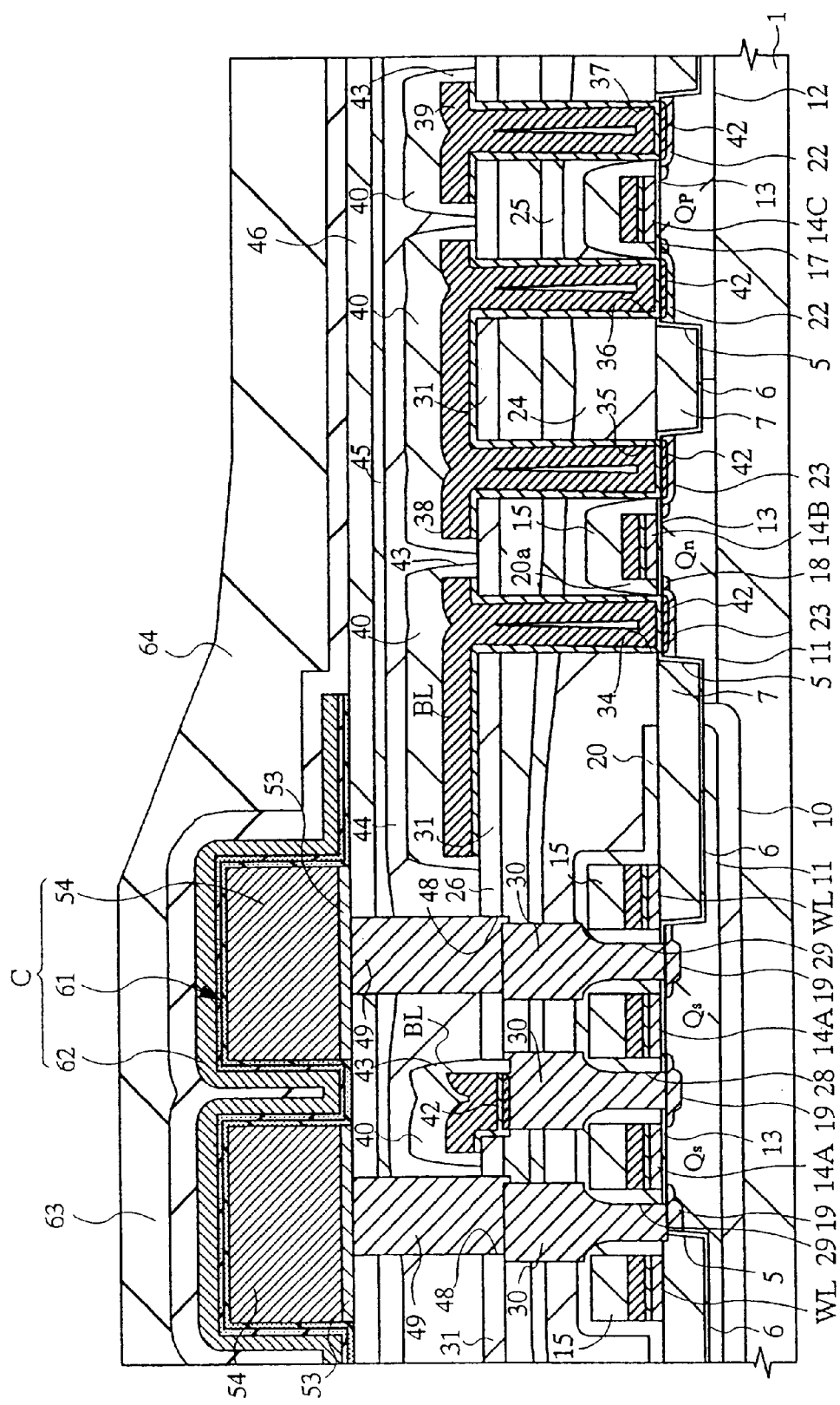
FIG. 25 is a cross-sectional view of an example of the DRAM according to the embodiment 1 under a stage of manufacturing process sequence.

Next, the photoresist film 60 is removed, and thereafter, a silicon oxide film 63 having a film thickness of about 40 nm is deposited above the information storage capacitor C, as shown in FIG. 25. The silicon oxide film 63 is deposited, for example, by a plasma CVD method using ozone ($O_3$) and tetraethoxysilane (TEOS) as a source gas. Further, a SOG film 64 is coated thereof to flatten the region where the memory cell is formed, and simultaneously, steps relative to the peripheral circuit region are reduced. In the DRAM according to the present embodiment, since a polycrystalline tantalum oxide film having a high dielectric constant is used for the capacity insulting film 61, the lower electrodes 54 need not be formed to be particularly high. Therefore, the steps between the memory cell region and the peripheral circuit region can be reduced only by the SOG film 64. As a result, the process can be simplified without introducing a complicated stage for eliminating those steps.

Figure 26:
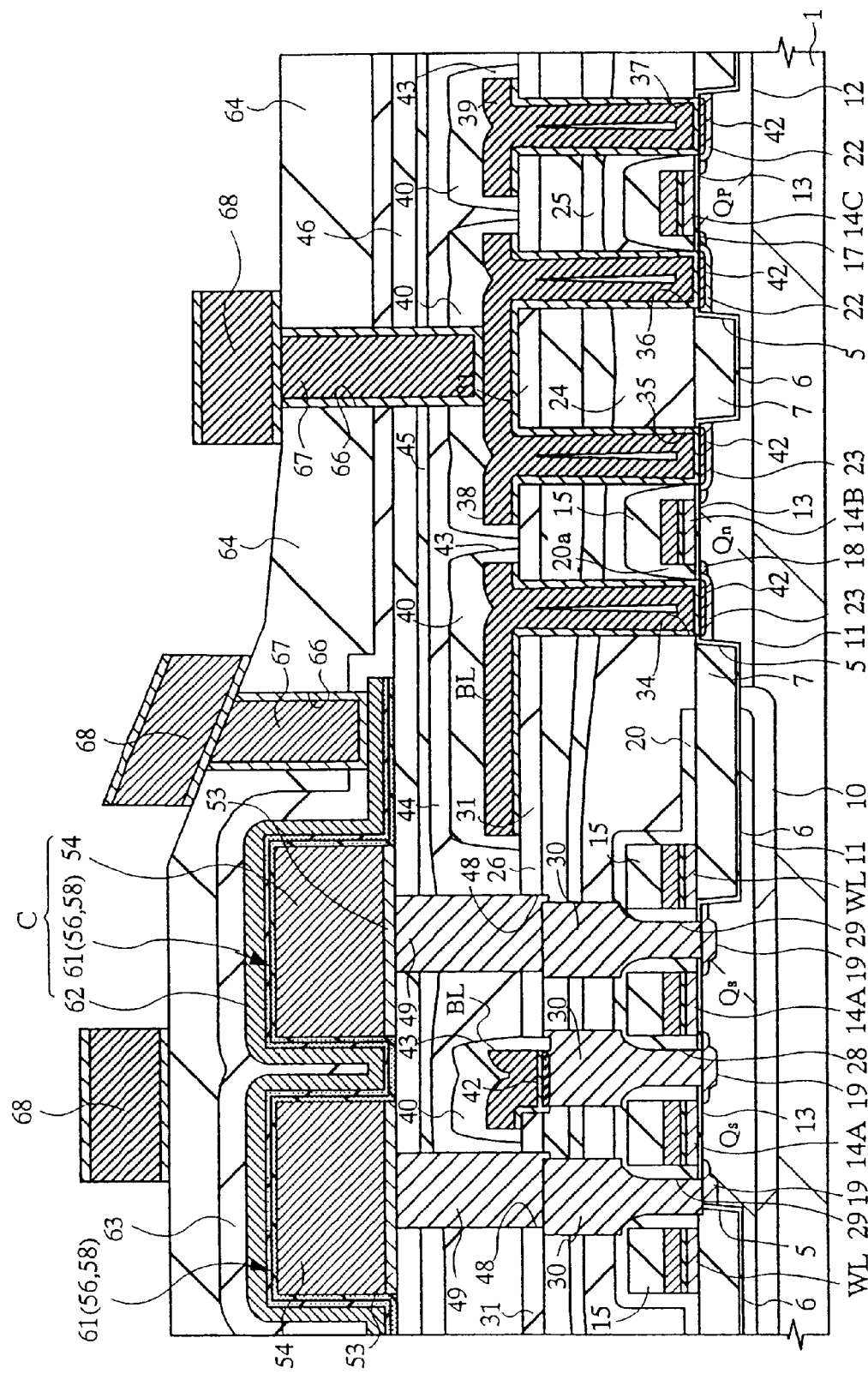
FIG. 26 is a cross-sectional view of an example of the DRAM according to the embodiment 1 under a stage of manufacturing process sequence.

Next, as shown in FIG. 26, the SOG film 64, the silicon oxide films 63 and 53, the silicon oxide film 46, the silicon oxide film 45, the SOG film 44, and the silicon nitride film 40 are removed above the first layer wire 38 of the peripheral circuit, by dry etching with a photoresist film used as a mask, thereby to form a through hole 65. Likewise, a through hole 66 is formed by removing the SOG film 64 and the silicon oxide film 63 above the upper electrode 62. Thereafter, plugs 67 are formed in the through holes 65 and 66, and subsequently, a second layer wire 68 is formed above the SOG film 64. The plugs 67 are formed as follows. A TiN film having a film thickness of about 100 nm is formed on the SOG film 64, and further, a W film having a film thickness of about 500 nm is deposited thereon by a CVD method. Thereafter, these films are etched back such that these films remain only in the through hole, to form the plugs. The second layer wire 68 is formed by depositing a TiN film having a thickness of about 500 nm, a Al (aluminum) film having a thickness of about 500 nm, and a Ti film having a film thickness of about 50 nm, on the SOG film 64, by a sputtering method, and by thereafter patterning these film by dry etching with a photoresist film used as a mask.

Thereafter, a third layer wire is formed with an interlayer insulating film inserted thereunder, and a passivation film comprising a silicon oxide film and a silicon nitride film is deposited thereon, although the passivation film is not shown in the figure. Through the steps as described above, the DRAM according to the present embodiment is substantially completed.

Note that the third layer wire and the plug connected thereto are formed in the same manner as in the manner in which the second layer wire is formed. The interlayer insulating film can be formed of, for example, a silicon oxide film having a film thickness of about 300 nm, a SOG film having a film thickness of about 400 nm, and a silicon oxide film having a film thickness of about 300 nm. The silicon oxide film can be deposited by, for example, a plasma CVD method using ozone ($O_3$) and tetraethoxysilane (TEOS) as a source gas.

According to the present embodiment, since the capacity insulating film 61 is made of a multi layered film comprising of two layers, or the crystallized tantalum oxide films 56 and 58, the leakage current between the upper electrode 62 and the lower electrodes 54 can be reduced and the refresh characteristic of the DRAM can be improved. In addition, since each of the crystallized tantalum oxide films 56 and 58 is formed in a manner in which deposition and crystallization thereof are performed respectively in separate steps (e.g., two steps in the present embodiment), the film quality of the capacity insulating film 61 becomes uniform in the film thickness direction and the film quality of the capacity insulating film can thus be improved. Further, since the film thickness of each of the crystallized tantalum oxide films 56 and 58 forming the capacity insulating film 61 is set to 10 nm or less, the morphology and the film density can be improved. As a result, the film quality can be totally raised so that the performance and reliability of the DRAM can be improved.

Figure 27:
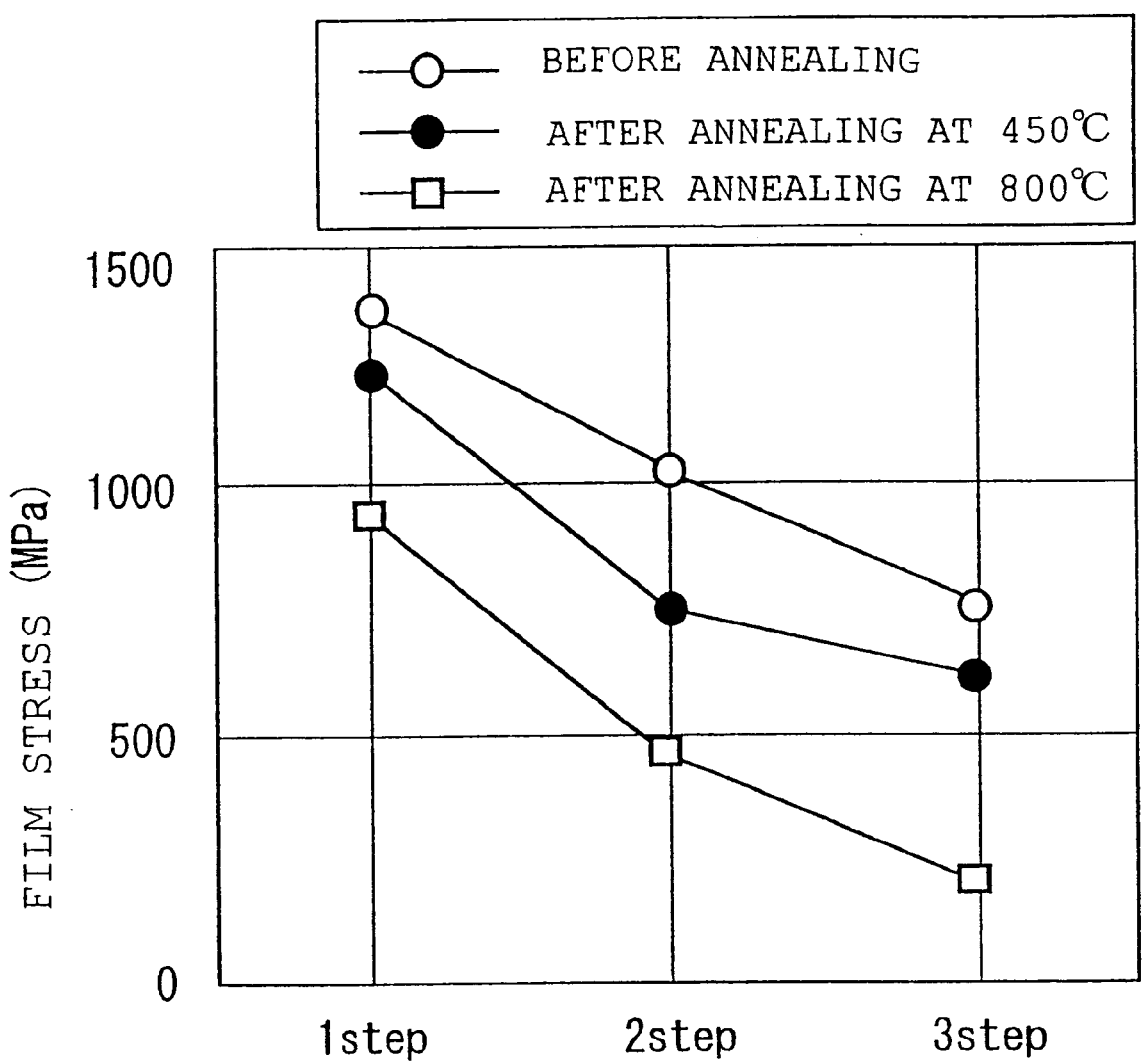
FIG. 27 is a graph showing measurement results of the film stress of crystallized tantalum oxide films.

The advantages described above will be explained with reference to data shown in FIGS. 27 to 29. FIG. 27 is a graph showing measurement results concerning the film stress of the crystallized tantalum oxide film. In the graph, the steps of 1 to 3 in the lateral axis respectively show the cases where deposition and crystallization of a tantalum oxide film is repeated three times to form a multi layered film composed of three crystallized tantalum oxide films by three steps. Note that the film thickness of each tantalum oxide film is constantly 15 nm regardless of the number of steps to be taken. With respect to each of the cases of one to three steps, three cases are cited: the case of performing no anneal-processing and the cases of performing anneal-processing at 450° C. and 800° C. The anneal-processing is indicated in consideration of the thermal step inserted when forming an upper electrode 62. The present embodiment corresponds to the case of the 2 step.

From the results of this film stress measurement, it is found that the film stress decreases as the number of steps increases, i.e., as the number of time for which the step of depositing and crystallizing a tantalum oxide film is repeated. That is, it is considered that increase of the film stress causes increase of undesirable stress to the capacity insulating film 61 and causes a leakage current of the information storage capacitor C. Hence, it can be said that the way of forming the capacity insulating film 61 consisting of two steps according to the present embodiment can offer better film quality, in which a tantalum oxide film 55 is crystallized to form a crystallized tantalum oxide film 56 and another tantalum oxide film 57 is further deposited thereafter and is crystallized to form a crystallized tantalum oxide film 58, than the way of forming the capacity insulating film consisting of one step in which the tantalum oxide film having a film thickness of 15 nm is deposited and crystallized at once. Also, it can be said that the film quality is improved as the number of step increase.

Note that the film stress was measured by a measurement method as follows. A crystallized tantalum oxide film having a film thickness of 15 nm is formed on a silicon wafer having a thickness of 730 μm by one to three steps, and thereafter, the back surface of the wafer is polished to a thickness of 200 μm. Thereafter, this wafer was cut into strips, and the film stress was calculated from the warp amounts of the strips.

Figure 28B:
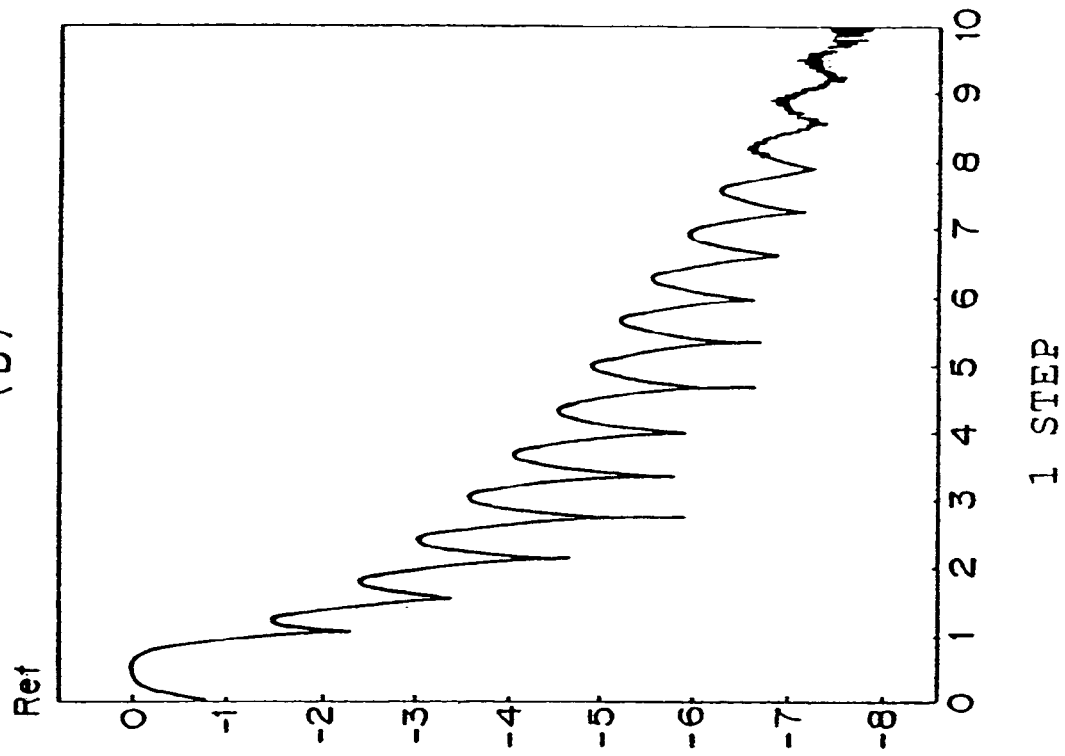
FIG. 28 shows graphs showing reflection rate data of an X-ray reflection rate measurement, wherein FIG. 28(*a*) shows the case of one step and FIG. 28(*b*) shows the case of two steps.
Figure 28A:
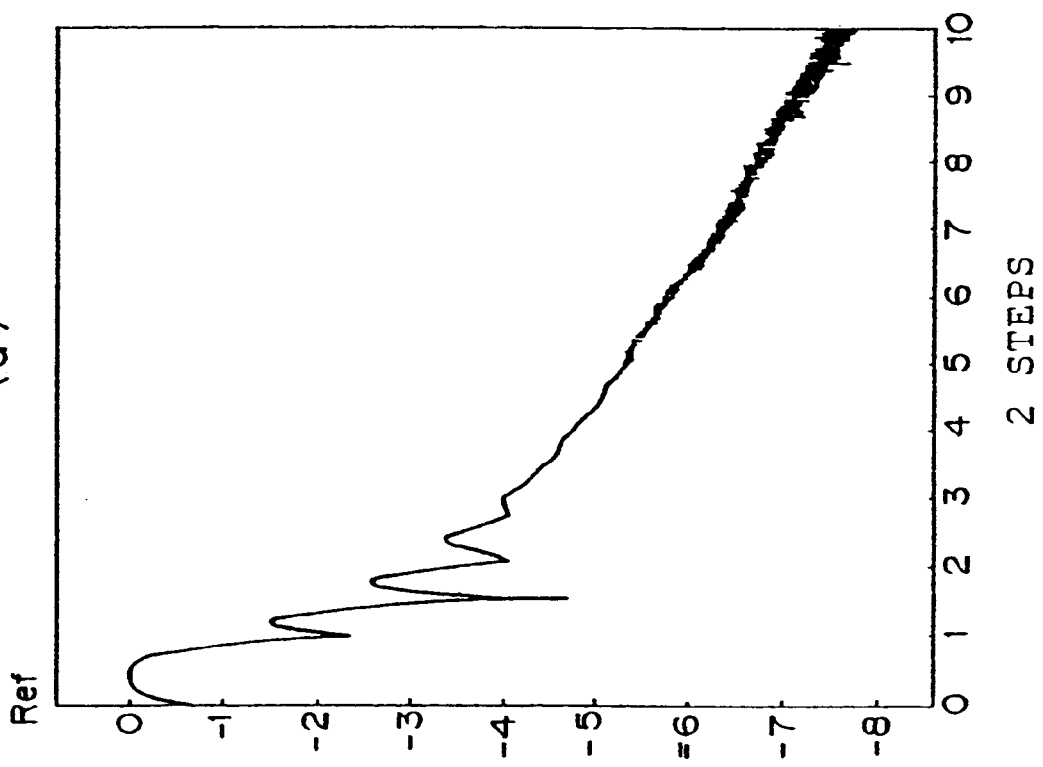

FIGS. 28 show graphs showing data of reflection rates in an X-ray reflection rate measurement. FIG. 28(b) shows the case of one step and FIG. 28(b) shows the case of two steps. This X-ray reflection rate measurement is a measurement method in which an X-ray is let enter over all the reflection region (θ=0 to 2°) and the reflected X-ray therefrom is detected and analyzed to obtain the film thickness, density, and roughness of a multi layered film. Analysis of reflection rate data adopts Fourier calculation and fitting to a film structure model with use of a least square method where the film thickness, density, and roughness are used as parameters. The X-ray reflection rate measurement used an X-ray reflection rate measurement device SLX-2000 (trademark) manufactured by Kabushikikaisha Rigaku. CuKα1 was used as the incident X-ray and a goniometer with a resolution of 0.001° was used for angle scanning of the sample. A NaI detector was used to detect an X-ray.

The results of the X-ray reflection rate measurement were shown in Table 1.

TABLE 1

|  | Tantalum oxide film thickness (nm) | Tantalum oxide film density (g/cm$^3$) | Roughness (nm) |
| --- | --- | --- | --- |
| 1 step | 1.568 | 6.70436 | 0.400 |
|  | 5.822 | 8.65277 | 0.899 |
|  | 6.078 | 8.77475 | 0.227 |
|  | (13.468) | (8.4809) | (1.576) |
| 2 step | 13.338 | 8.74630 | 1.089 |
| 3 step | 13.712 | 8.94992 | 1.025 |

As shown in the above table, the crystallized tantalum oxide film formed by one step cannot be subjected to fitting with the film structure model of one single layer even through the film was formed by one step. Fitting can be achieved only with the film structure of three layers. This means that the crystallized tantalum oxide film formed by one step has non-uniformity in the film thickness direction and appears as if it is a tantalum oxide film of a three-layer structure as long as it is observed from the X-ray reflection rate measurement. The lines of the 1 step in the table 1 show the results (such as the film thickness, density, and roughness) obtained from analysis supposing this three-layer structure. Note that the values in the parentheses in the lowermost line of the 1 step express respectively the total of the film thickness, the total of the roughness, and the average of the density. From the results of the 1 step, it is found that the film density is lower at the uppermost layer region thereof and the average film density is also lower compared with two or three steps. As for the roughness, the sum of the values of respective component layers forming the tantalum oxide film formed by one step is considered as the roughness of all layers, i.e., as the roughness of the crystallized tantalum oxide film formed by one step. This roughness is about 1.5 times greater than that of the two or three steps.

In contrast, the tantalum oxide film formed by two or three steps is regarded as a film of a single layer structure as long as it is observed from the X-ray reflection rate measurement. This means that the crystallized tantalum oxide film formed by two or more steps has uniform film quality in the film thickness direction. In addition, this film has a higher film density and a smaller roughness compared with those of the film formed by one step. Further, there is a tendency that the film density increases and the roughness decreases as the number of steps is increased. If it is supposed that the increase in the film density leads to exhibit of the precision of the film and the precision of the polycrystalline film comes from reduction of clearances between grain boundaries, it is concluded that the increase in the film density exhibits the scale down of the crystalline grains. This kind of increase of the film density which is fine granulation mainly functions to reduce the leakage current which flows through the grain boundaries as paths. In addition, decrease of the roughness functions to prevent local concentration of electric fields and to improve the withstand voltage of the crystallized tantalum oxide film.

From the results described above, the crystallized tantalum oxide film formed by two or three steps has more excellent film quality than the crystallized tantalum oxide film formed by one step, in view of the film density and the roughness. In addition, the former film has uniformity in the film thickness direction. Thus, this film can be said to be an insulating film having an excellent withstand voltage and an excellent anti-leakage characteristic.

Figure 29:
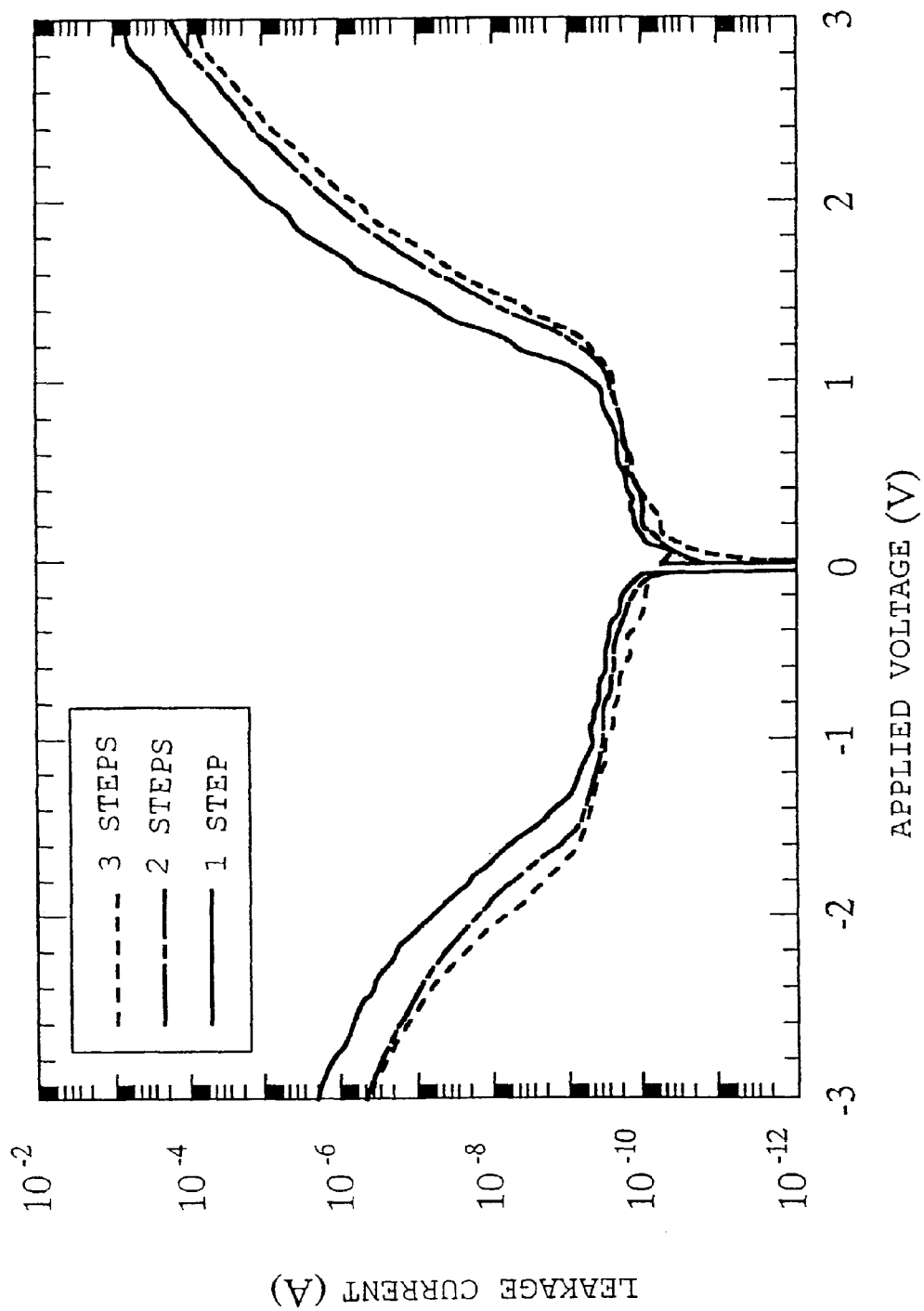
FIG. 29 is a graph showing leakage characteristics of crystallized tantalum oxide films formed by one step, two steps, or three steps.

FIG. 29 is a graph showing the leakage current characteristics of the crystallized tantalum oxide film formed by one to three steps. The leakage current decreases as the number of step increases. Hence, it is found that the crystallized tantalum oxide film subjected to multi layered film formation contributes to reduction of the leakage current. At 1.7 V which is an operating voltage where the embodiment is applied to a DRAM, the value of the leakage current is about 0.9 µA in case of one step, about 0.11 µA in case of two steps, and about 0.06 µA in case of three steps. The leakage current in the case of two or three steps can thus be reduced by one digit in comparison with that in the case of one step. This effect of reduction of the leakage current is equivalent to the effect of extending the refresh time form 10 msec to 200 msec in a DRAM.

Although the capacity insulating film 61 has been explained as a multi layered film composed of two layers, or the layered crystallized tantalum oxide films 56 and 58 in the present embodiment, the capacity insulating film 61 may be made of a multi layered film comprising three or more layers by further performing deposition and crystallization of another tantalum oxide film by the same step as described above.

(Embodiment 2)

FIGS. 30 to 35 are cross-sectional views showing an example of the DRAM according to the embodiment 2 under a step of manufacturing process sequence.

The DRAM according to the present embodiment has the same circuit configuration and plan structure as those shown in FIGS. 1 and 2. Also, the DRAM has the same cross-section as that of the embodiment 1 except for the difference in the structure of the information storage capacitor C. Therefore, in the following explanation, only the different portion will be explained but explanations to common portions will be omitted herefrom.

Figure 30:
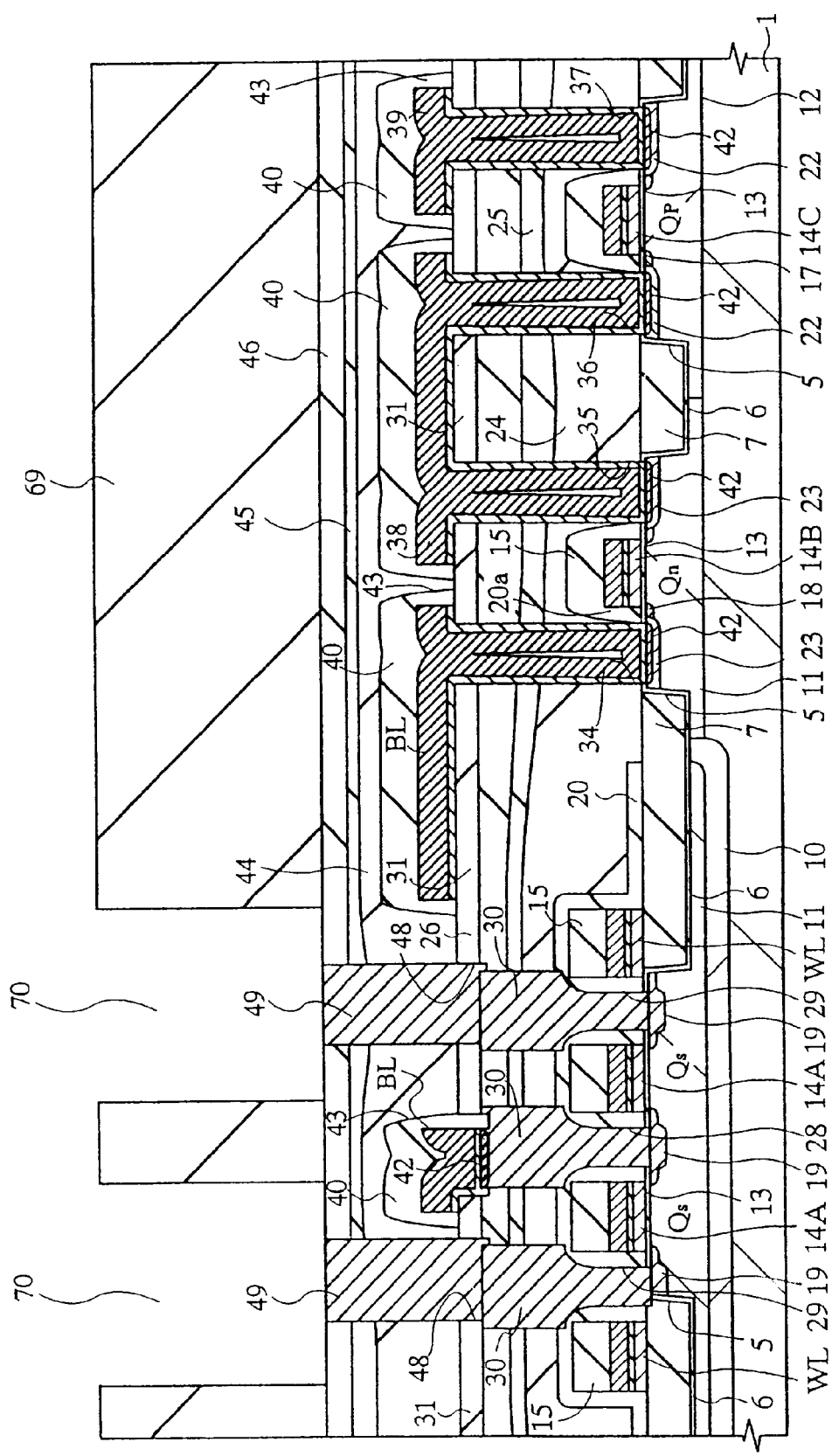
FIG. 30 is a cross-sectional view of an example of the DRAM according to the embodiment 2 under a stage of manufacturing process sequence.

The method of manufacturing a DRAM according to the embodiment 2 adopts the same steps as shown in the figures up to FIG. 18 in the embodiment 1. Thereafter, an insulating film 69 is formed and a groove 70 is formed so as to expose the plugs 49, as shown in FIG. 30. The insulating film 69 is formed by, for example, a plasma CVD method using ozone ($O_3$) and tetraethoxysilane (TEOS) as a source gas. Also, the groove 70 is processed by etching with a photoresist film used as a mask.

Figure 31:
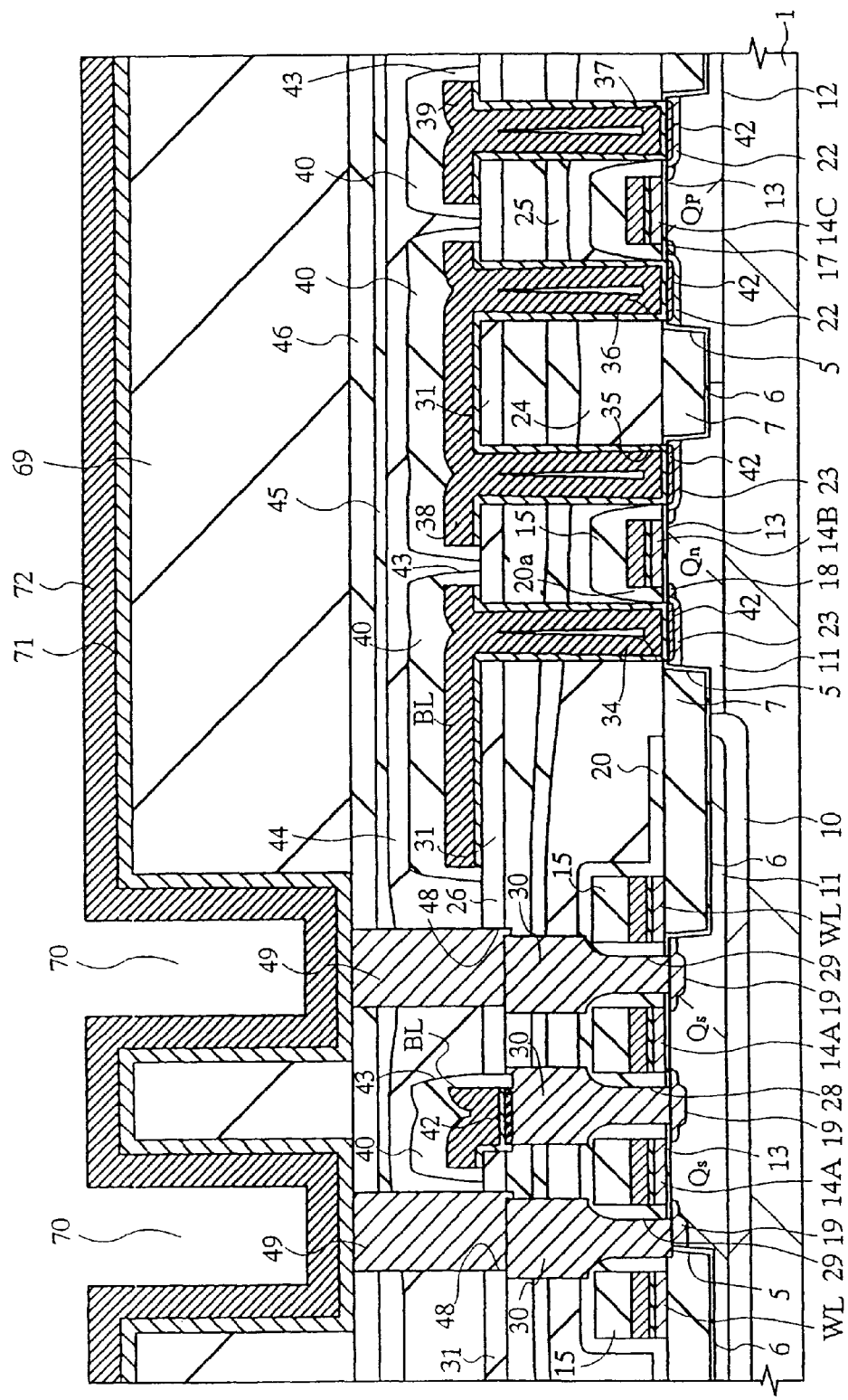
FIG. 31 is a cross-sectional view of an example of the DRAM according to the embodiment 2 under a stage of manufacturing process sequence.

Next, as shown in FIG. 31, a reaction protect layer 71 and a ruthenium film 72 are sequentially deposited. The reaction protect film 71 and the ruthenium film 72 can be deposited in the same manner as in the embodiment 1.

Figure 32:
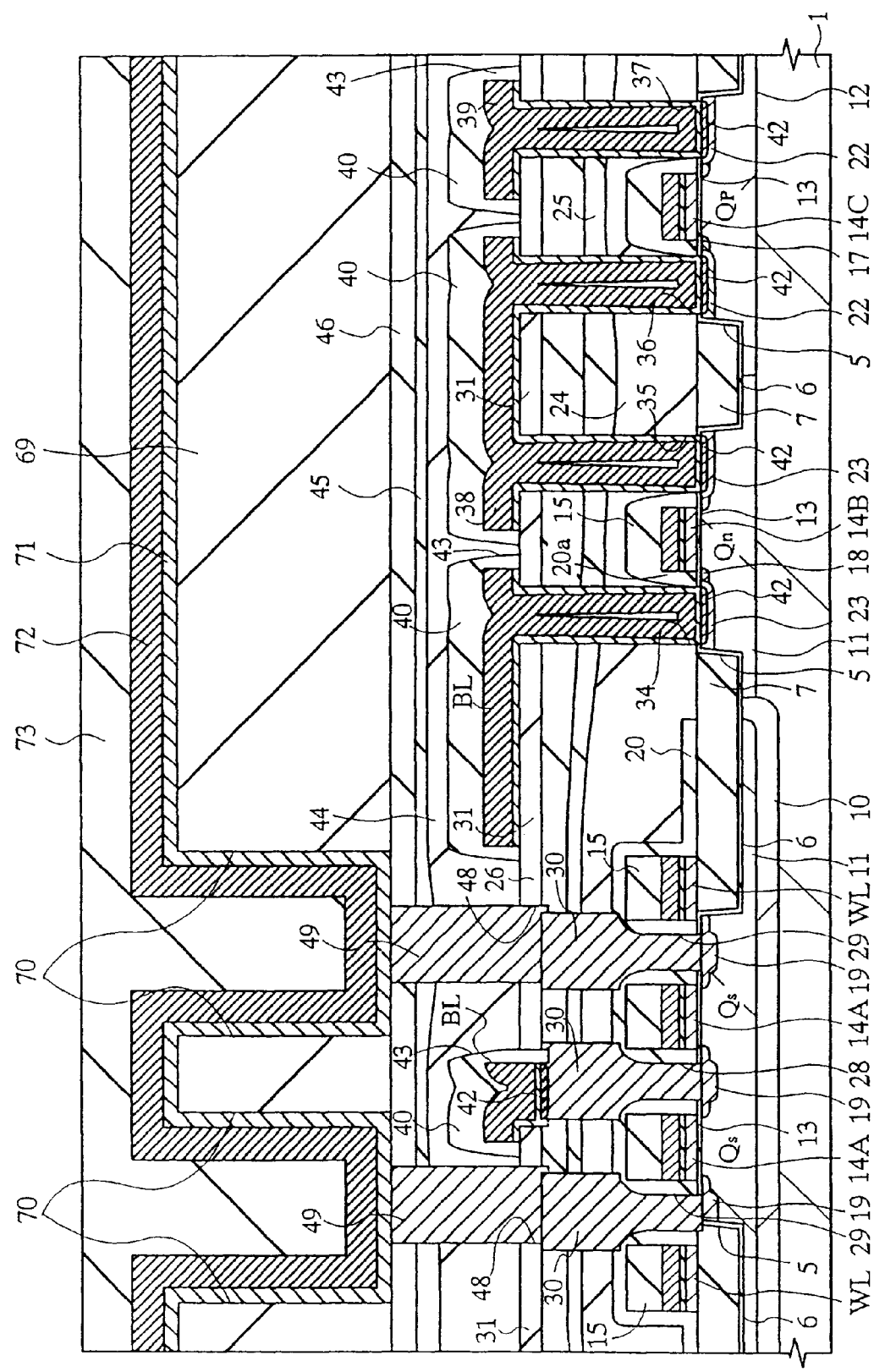
FIG. 32 is a cross-sectional view of an example of the DRAM according to the embodiment 2 under a stage of manufacturing process sequence.

Next, as shown in FIG. 32, an insulating film 73 is deposited on the entire surface of the semiconductor substrate 1. The insulating film 73 should preferably be a SOG film in consideration of the facility of embedding in the groove 70 and the etching selectivity with respect to the insulating film 69.

Figure 33:
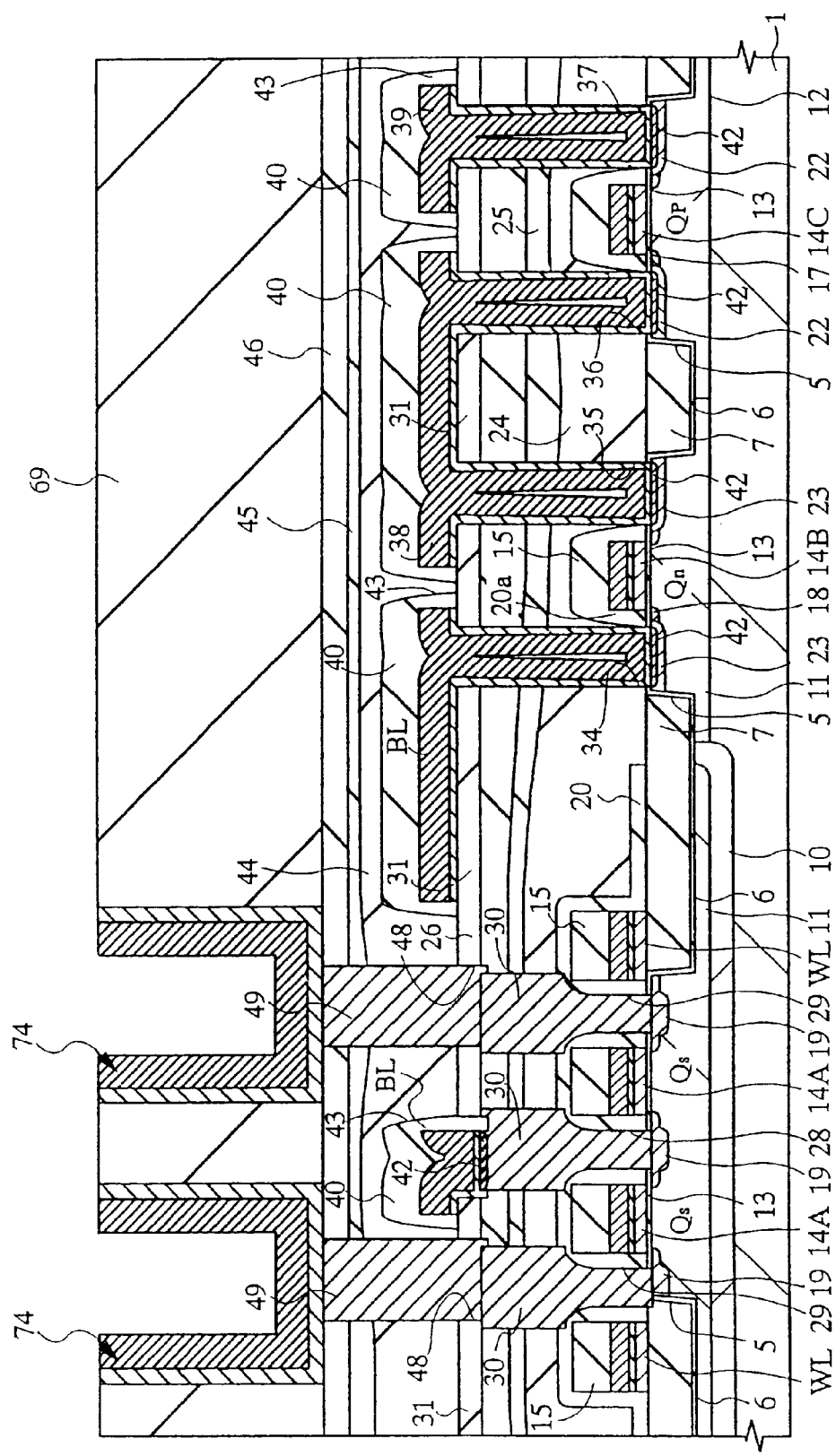
FIG. 33 is a cross-sectional view of an example of the DRAM according to the embodiment 2 under a stage of manufacturing process sequence.

Next, as shown in FIG. 33, the reaction protect layer 7 and the ruthenium film 72 on the insulating film 69 are removed except for the regions of the insulating film 73 and the groove 70. For removal of the layer 71 and the film 72, an etch-back method or a CMP method can be used. The insulating film 73 remaining in the groove 70 can be removed by wet etching. Thus, lower electrodes 74 made of the reaction protect layer 71 and the ruthenium film 72 is formed.

Figure 34:
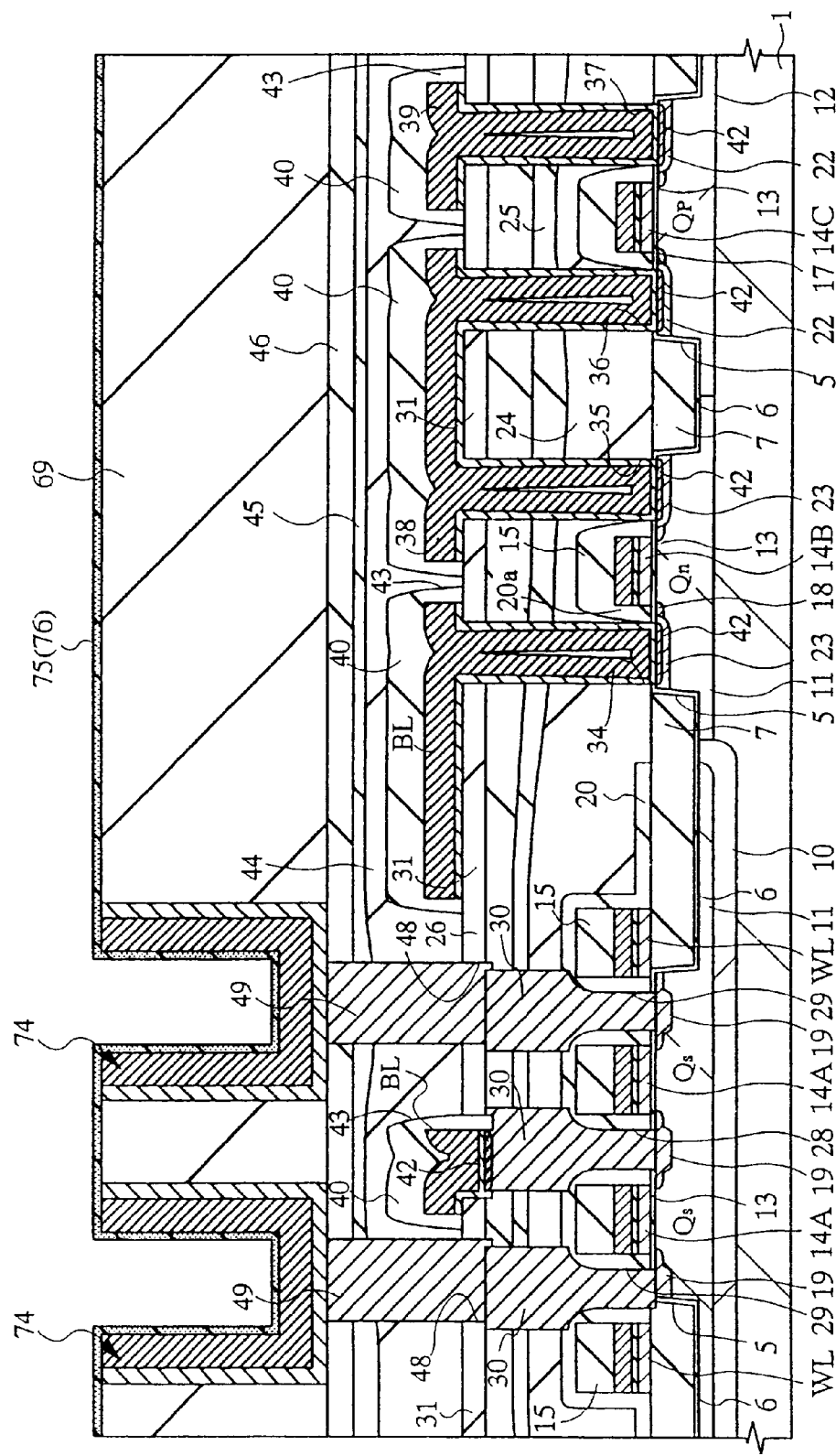
FIG. 34 is a cross-sectional view of an example of the DRAM according to the embodiment 2 under a stage of manufacturing process sequence.

Next, as shown in FIG. 34, a tantalum oxide film 75 is deposited on the entire surface of the semiconductor substrate 1. The deposition of the tantalum oxide film 75 is carried out in the same manner as in the case of the tantalum oxide film 55 of the embodiment 1.

Further, like in the case of the tantalum oxide film 56 of the embodiment 1, the tantalum oxide film 75 is subjected to a heat treatment and is thereby crystallized, to form a polycrystalline tantalum oxide film 76.

Figure 35:
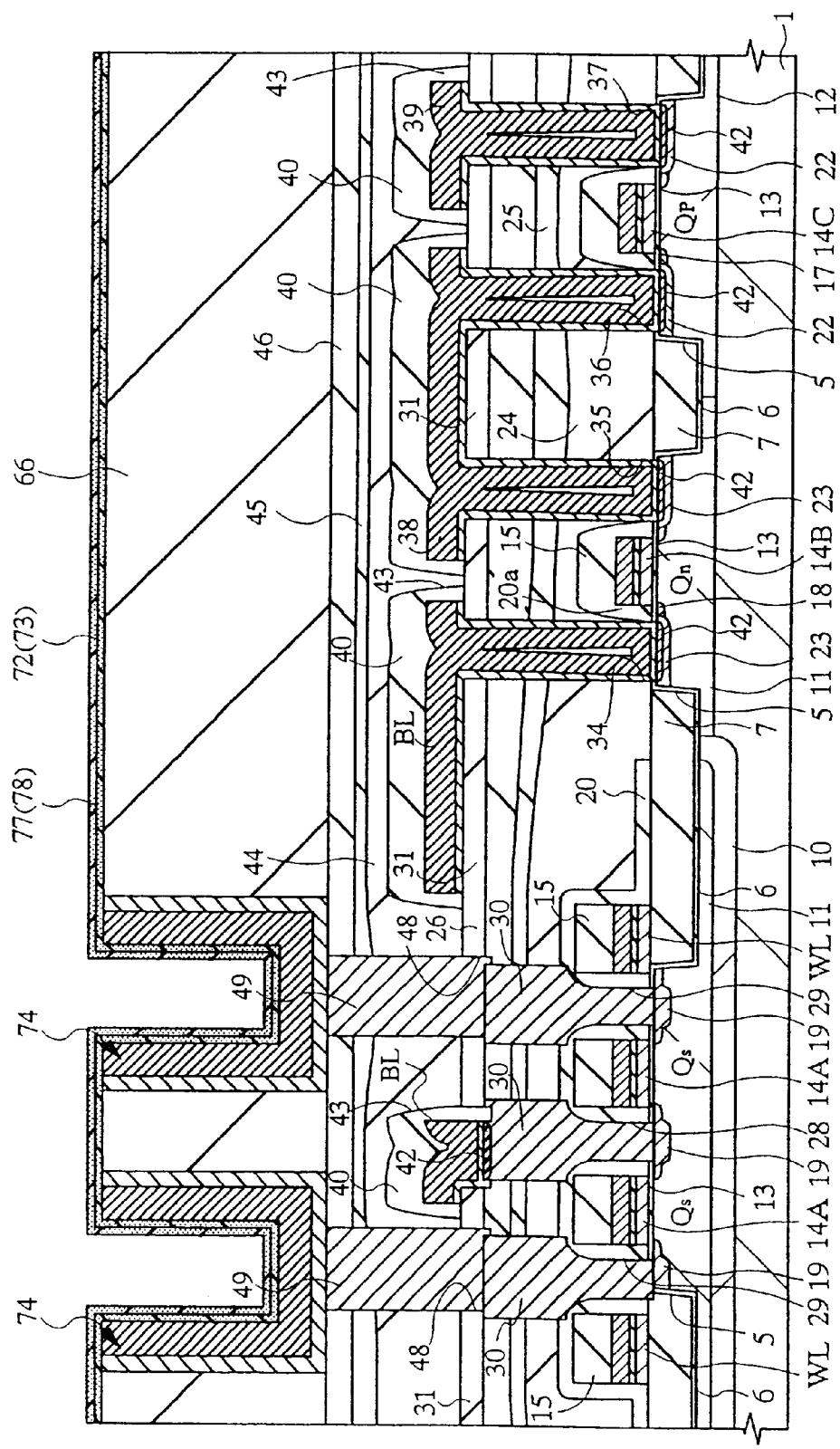
FIG. 35 is a cross-sectional view of an example of the DRAM according to the embodiment 2 under a stage of manufacturing process sequence.

Next, as shown in FIG. 35, a second tantalum oxide film 77 is deposited on the polycrystalline tantalum oxide film 76. The deposition of the tantalum oxide film 75 is carried out in the same manner as in the case of the tantalum oxide film 57 of the embodiment 1.

Further, like in the case of the tantalum oxide film 58 of the embodiment 1, the tantalum oxide film 77 is subjected to a heat treatment and is thereby crystallized, to form a polycrystalline tantalum oxide film 78.

The subsequent steps are substantially similar to those of the embodiment 1.

According to the DRAM of the embodiment 2, an advantage is obtained in that the lower electrodes 74 are each formed in a cylindrical shape having an opening at the upper surface so that the surface areas of the electrodes are increased thereby increasing the storage charge amount of the asinformation storage capacitor C, in addition to the advantage explained in the embodiment 1. Also, since an insulating film 69 is formed in the peripheral circuit region, gaps are prevented from being created between the memory cell region and the peripheral circuit region, and disconnection of the second layer wire or processing margins in photolithography can be improved.

Figure 36:
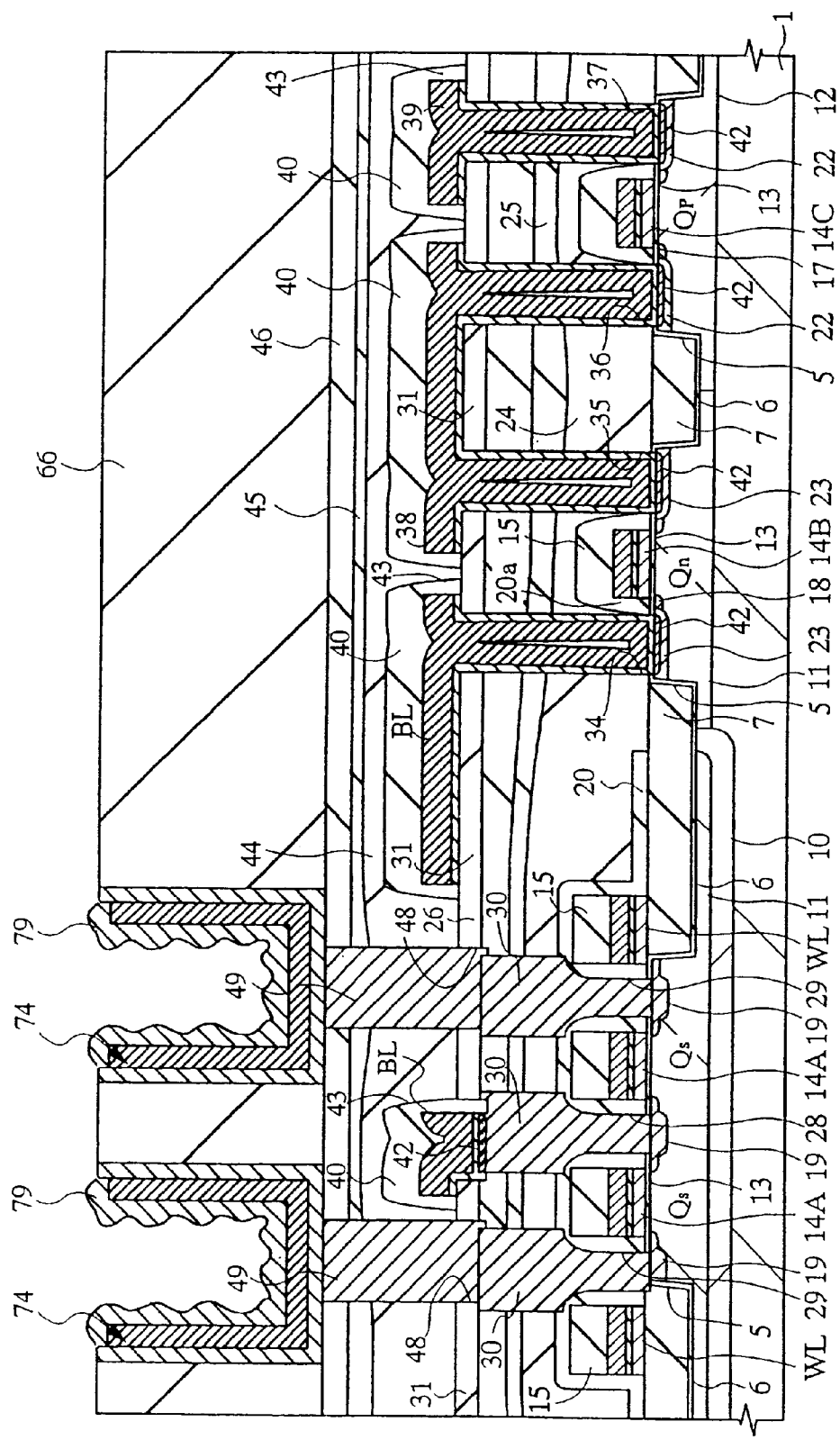
FIG. 36 is a cross-sectional view of an example of the DRAM according to the embodiment 2 under a stage of manufacturing process sequence.

Note that oxidation processing may be performed on the surfaces of the lower electrodes 74 made of a ruthenium film to form a ruthenium oxide film 79, as shown in FIG. 36. In this case, the ruthenium oxide film 79 is formed to have a surface with irregularity, and the surface areas of the lower electrodes can be increased to increase the storage charge amount. Note that the oxidation processing on the surfaces of the lower electrodes 74 may be, for example, a heat treatment at 700° C. for 10 minutes in a dinitrogen monoxide ($N_2O$) gas atmosphere diluted with a nitrogen gas.

(Embodiment 3)

FIGS. 37 to 44 are cross-sectional views showing an example of the DRAM according to the embodiment 3 under a step of manufacturing process sequence. FIGS. 37 to 44 show only the region of the information storage capacitor, and the other components are the same as those shown in the embodiment 1.

The DRAM according to the present embodiment 3 is the same as that according to the embodiment 1, except for the region of the information storage capacitor C. In the following, explanation will be made of only the portion of the information storage capacitor C. The method of manufacturing the DRAM according to the embodiment 3 adopts the same steps as shown in the figures up to FIG. 17 in the embodiment 1.

After forming the through holes 48 shown in FIG. 17 in the embodiment 1, the photoresist film 47 is removed to form plugs 80 made of a polycrystalline silicon film. The plugs 80 are formed by depositing a polycrystalline silicon film for filling the through holes 48, on the entire surface of the semiconductor substrate 1, and by thereafter removing the film by polishing based on an etch-back method or a CMP method. It is preferable that a silicon nitride film 81 is formed on the silicon oxide film 46, prior to formation of the plugs 80. This silicon nitride film 81 can be used as an etching stopper for wet etching when exposing the lower electrodes.

Figure 37:
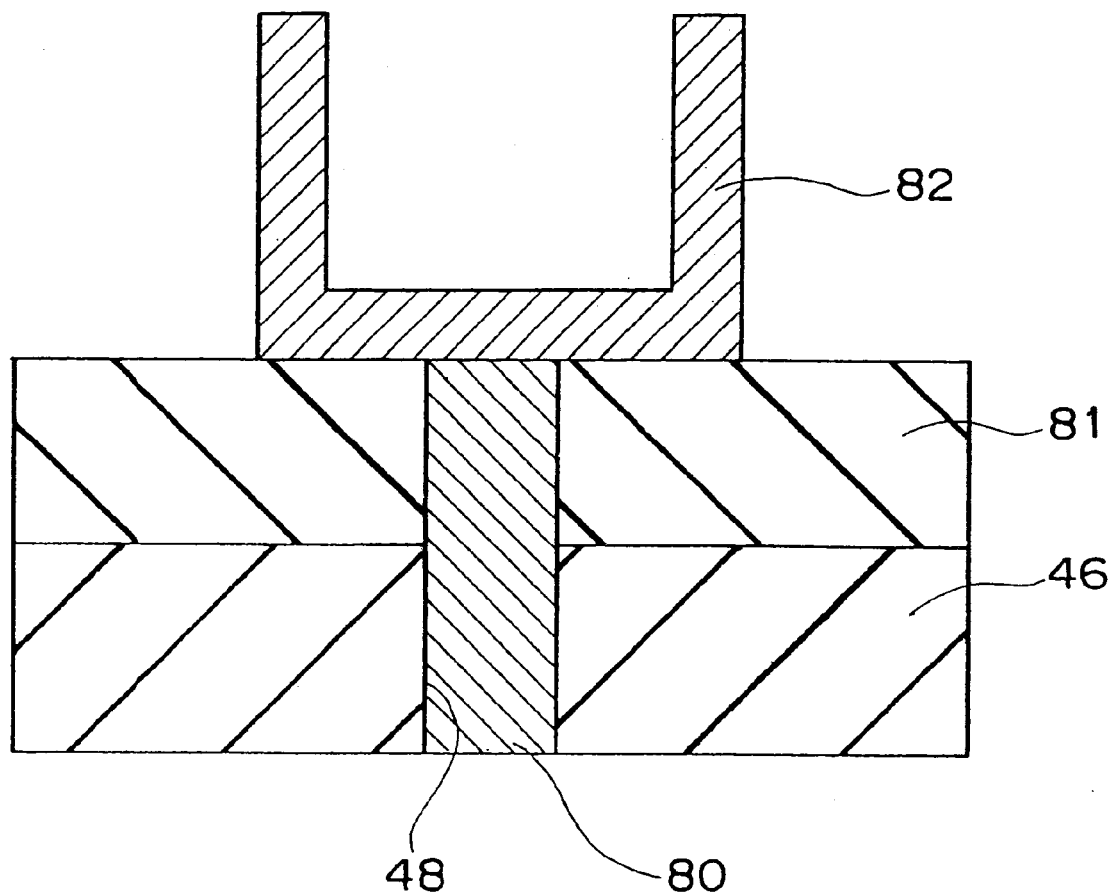
FIG. 37 is a cross-sectional view of an example of the DRAM according to the embodiment 3 under a stage of manufacturing process sequence.

Next, like in the step shown in FIG. 30 in the embodiment 2, an insulating film 69 is deposited and a groove 70 is formed therein. Further, an amorphous silicon film is deposited in place of the reaction protect layer 71 and the ruthenium film 72 shown in FIG. 31 in the embodiment 2, and a cylindrical amorphous silicon film 82 having an opening at the upper surface in the groove 70 is formed like in the steps shown in the embodiment 2. Thereafter, the insulating film 69 is removed by wet etching thereby expose the amorphous silicon film 82 (ref. FIG. 37). In this etching, the silicon nitride film 81 is used as an etching stopper.

Figure 38:
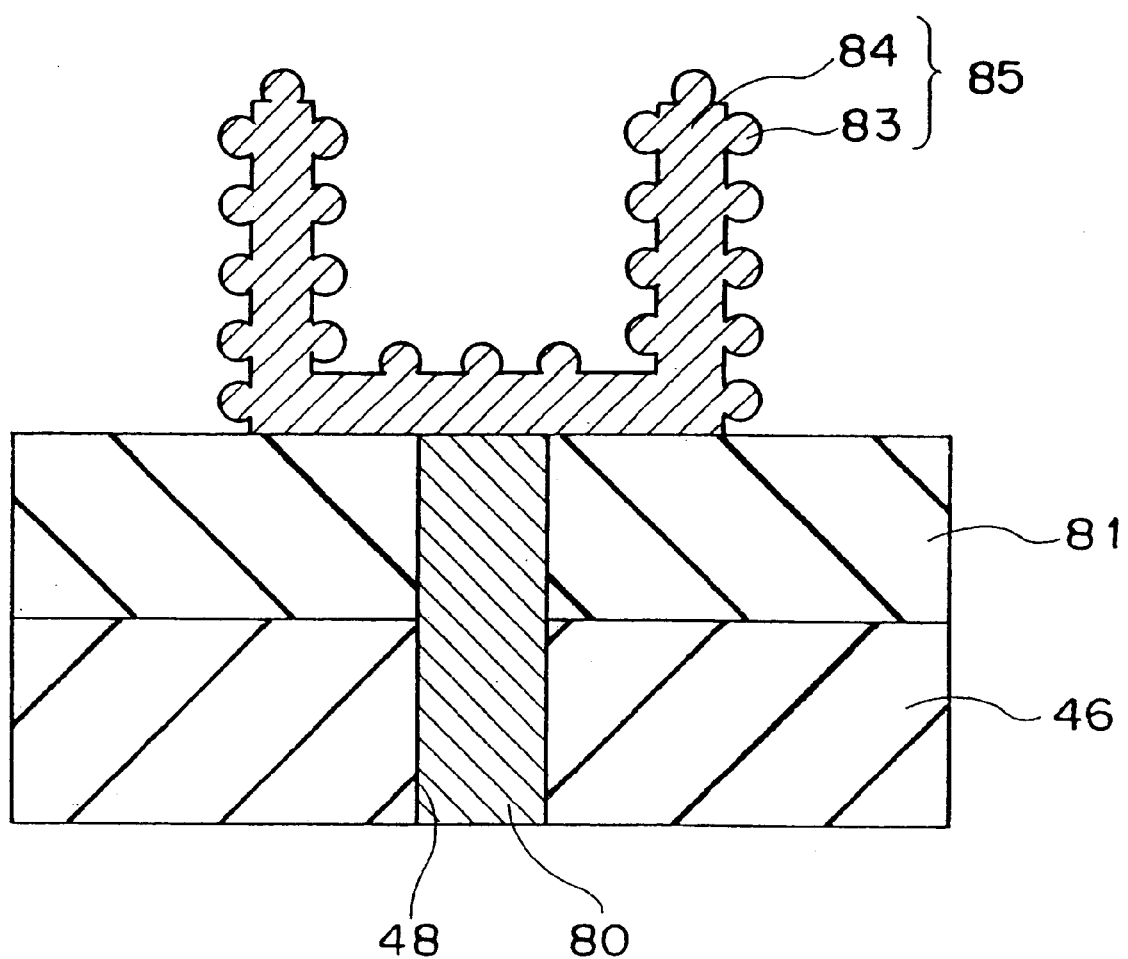
FIG. 38 is a cross-sectional view of an example of the DRAM according to the embodiment 3 under a stage of manufacturing process sequence.

Next, as shown in FIG. 38, the amorphous silicon film 82 is subjected to core formation processing and is crystallized to form lower electrodes 85 made of spherical silicon crystal 83 and a polycrystalline silicon film 84. The silicon crystal 83 has a diameter of about 50 nm.

Note that existence of a natural oxide film, sticking organic material, or the like causes a factor which hinders the core formation of the silicon crystal 83 in the formation of the spherical silicon crystal 83, and it is preferable that the surface of the non-crystalline silicon film 82 should be cleaned before the core formation processing. The cleaning method will be, for example, UV (ultraviolet) and ozone ($O_3$) cleaning and HF gas etching after wet cleaning. It is also preferable that cleaning step and the step of forming the spherical silicon crystal 83 are processed by an integrated device.

Figure 39:
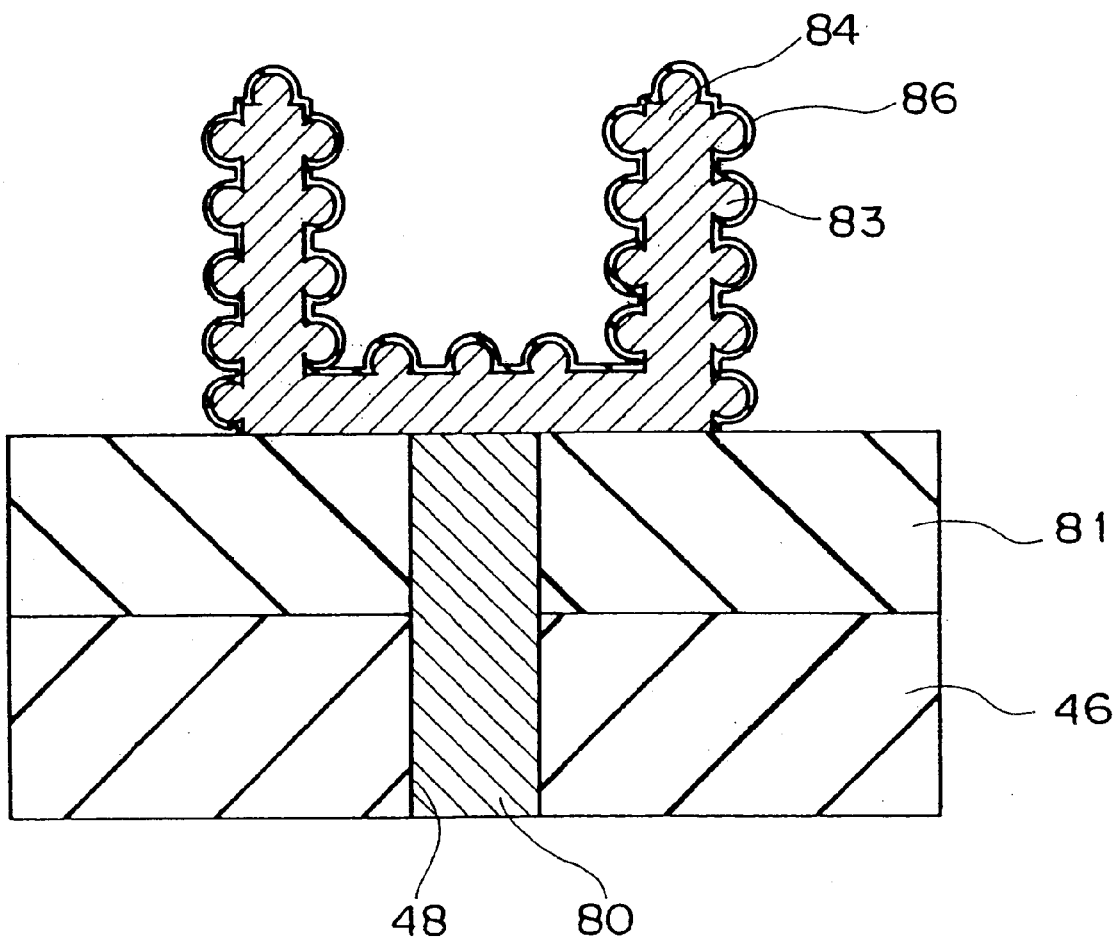
FIG. 39 is a cross-sectional view of an example of the DRAM according to the embodiment 3 under a stage of manufacturing process sequence.

Next, as shown in FIG. 39, a heat treatment is performed, for example, in an ammonia atmosphere at 700 to 800° C. for 1 to 10 minutes or more preferably at 800° C. for three minutes, thereby to form a silicon nitride film 86 on the surface of the lower electrode 85. The film thickness of the silicon nitride film 86 is set to 2 nm. By thus forming the silicon nitride film 86, the silicon forming the lower electrode 85 is not oxidized even by the heat treatment in an oxidative atmosphere for the tantalum oxide film which will be explained later, and therefore, no silicon oxide film is formed between the lower electrode 85 and the tantalum oxide film. If a silicon oxide film is formed between the lower electrode 85 and the tantalum oxide film, the effective film thickness of the capacity insulating film is increased and the capacity value of the information storage capacitor C is greatly reduced since the silicon oxide film is an insulating film having a low dielectric constant. However, according to the present embodiment, the silicon nitride film 86 achieves an excellent anti-oxidation characteristic even though it has a relatively high dielectric constant and a small film thickness. Therefore, substantial increase of the film thickness of the capacity insulating film can be reduced to a minimum necessary amount and decrease of the capacity value of the information storage capacitor can be restricted within a tolerable range.

Figure 40:
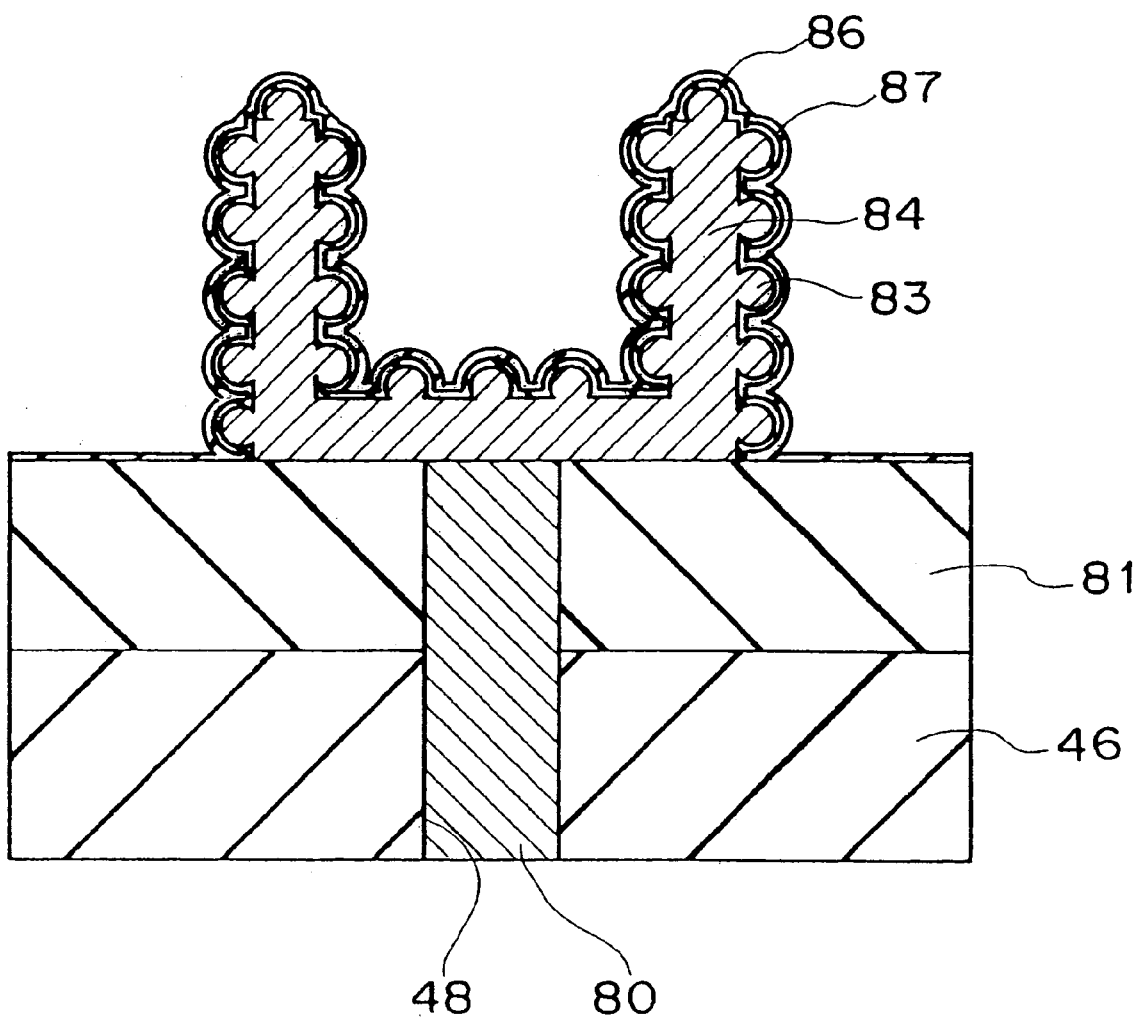
FIG. 40 is a cross-sectional view of an example of the DRAM according to the embodiment 3 under a stage of manufacturing process sequence.

Next, as shown in FIG. 40, a tantalum oxide film 87 is formed like in the case of the tantalum oxide film 55 in the embodiment 1. At this time, since a silicon nitride film 86 has already been formed, the surface of the lower electrode 85 made of silicon is not oxidized.

Figure 41:
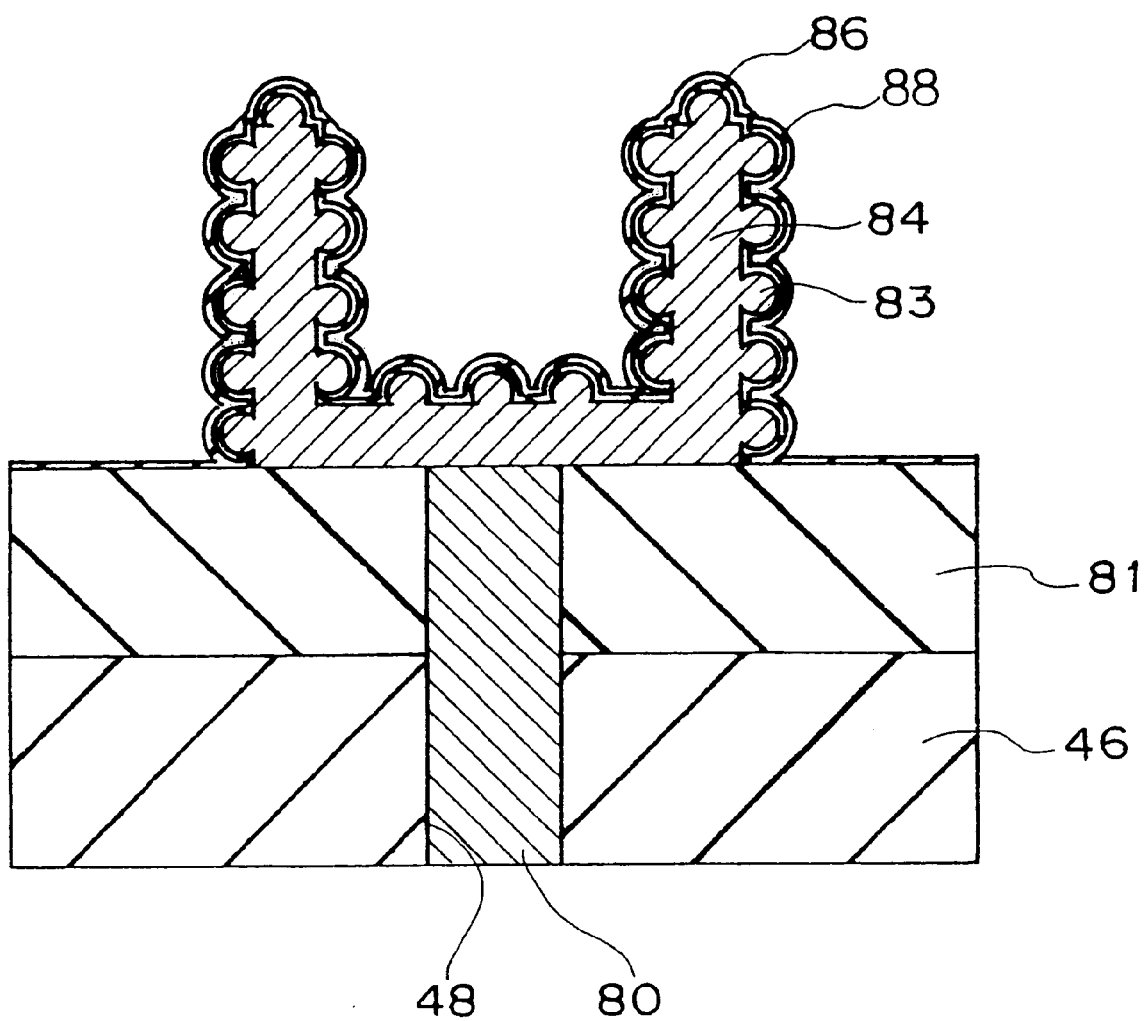
FIG. 41 is a cross-sectional view of an example of the DRAM according to the embodiment 3 under a stage of manufacturing process sequence.

Next, as shown in FIG. 41, a heat treatment is performed like in the case of the crystallized tantalum oxide film 56 in the embodiment 1 so that the tantalum oxide film 87 is crystallized to form a crystallize tantalum oxide film 88. Also, at this time, since a silicon nitride film 86 has already been formed, the surface of the lower electrode 85 made of silicon is not oxidized.

Figure 42:
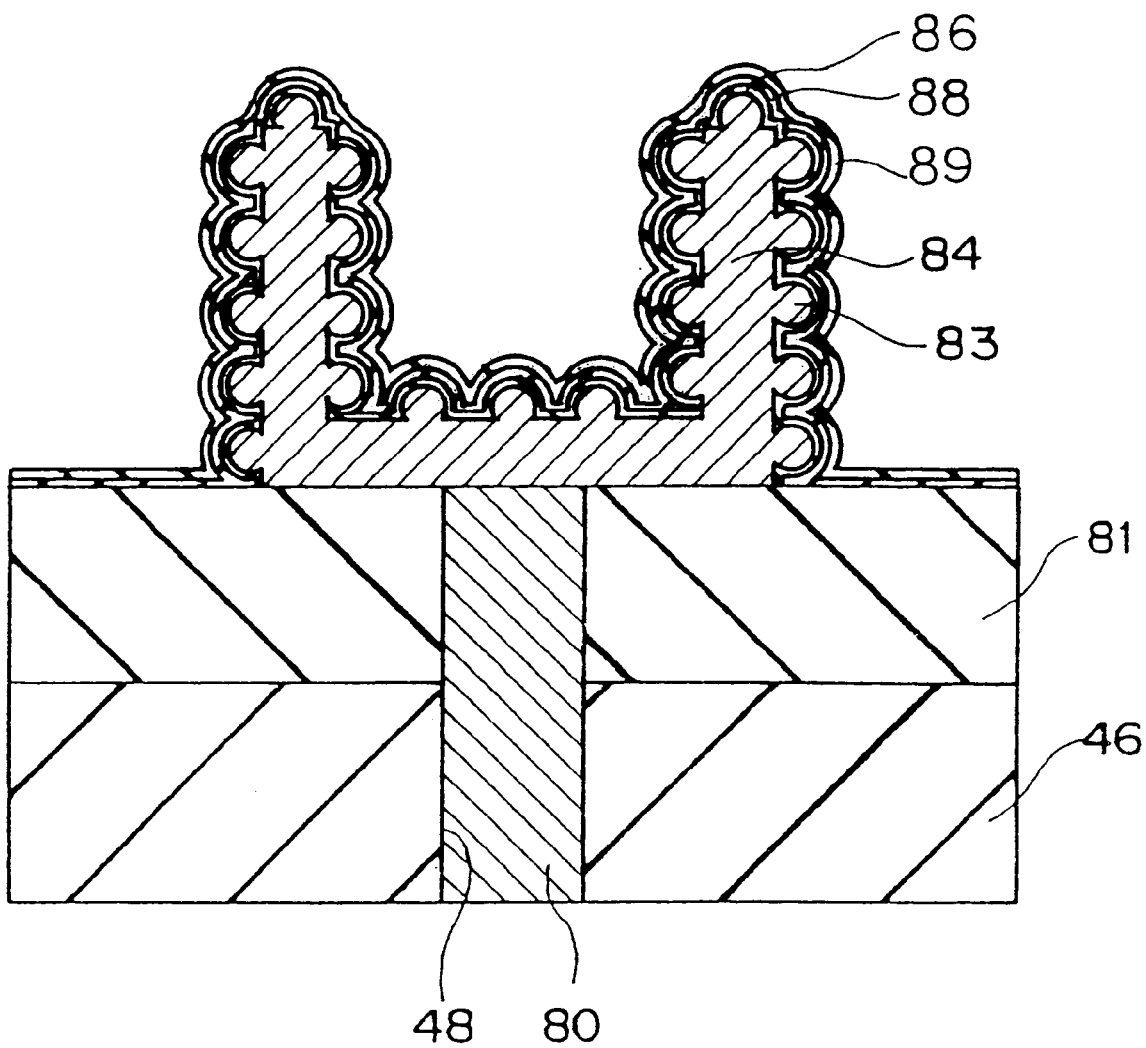
FIG. 42 is a cross-sectional view of an example of the DRAM according to the embodiment 3 under a stage of manufacturing process sequence.

Next, as shown in FIG. 42, like in the case of the tantalum oxide film 57 in the embodiment 1, a tantalum oxide film 89 is formed on the crystallized tantalum oxide film 88. Since this tantalum oxide film 89 is formed on the crystallized tantalum oxide film 88, there is a case that a kind of epitaxial growth occurs. In this case, the treatment temperature of the next heat treatment can be lowered.

Figure 43:
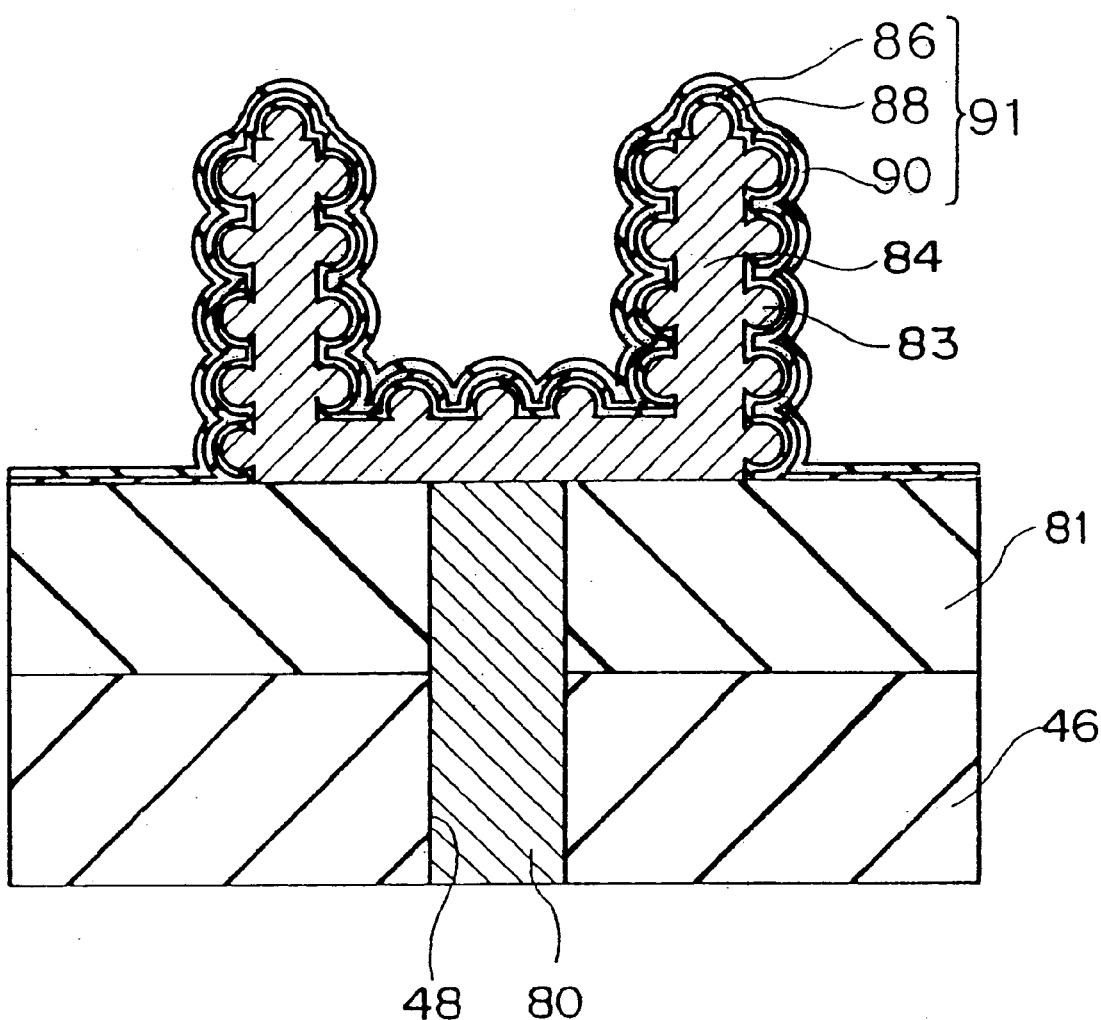
FIG. 43 is a cross-sectional view of an example of the DRAM according to the embodiment 3 under a stage of manufacturing process sequence.

Next, as shown in FIG. 43, a heat treatment is performed like in the case of the crystallized tantalum oxide film 58 in the embodiment 1, so that the tantalum oxide film 89 is crystallized to form a crystallized tantalum oxide film 90. Thus, a capacity insulating film 91 comprising the silicon nitride film 86 and the crystallized tantalum films 88 and 90 is formed. The multi-layered film comprising two layers, or the crystallized tantalum oxide films 88 and 90 has a film thickness of 10 to 20 nm.

Note that there is a case that the silicon nitride film 86 is oxidized by the heat treatment described above and becomes a silicon oxy-nitride film as a result.

Figure 44:
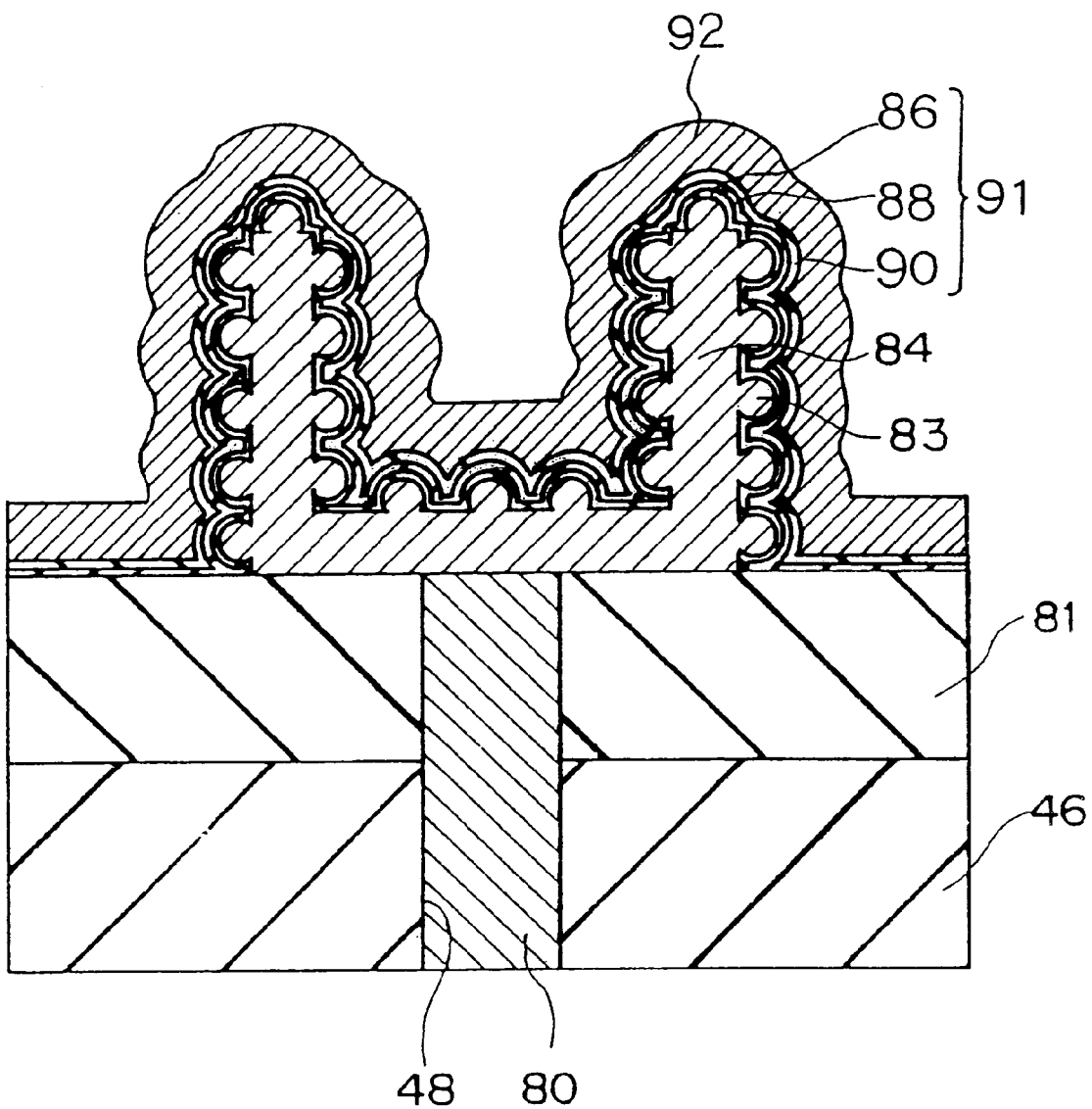
FIG. 44 is a cross-sectional view of an example of the DRAM according to the embodiment 3 under a stage of manufacturing process sequence.

Next, as shown in FIG. 44, a titanium nitride is deposited to form an upper electrode 92. Subsequent steps are the same as those shown in the embodiment 1. Needless to say, a polycrystalline silicon film, a tungsten film, or the like may be used in place of the titanium nitride film.

According to the present embodiment, the surface area of the lower electrode 85 is increased by the silicon crystal 83 so that the storage charge amount of the information storage capacitor C can be increased. In addition, the effect of layering crystallized tantalum oxide films is naturally obtained in the present embodiment. Particularly, if the lower electrode 85 suffers from surface irregularity due to the silicon crystal 83, there is a fear that the leakage current may be increased. However, in the present embodiment, the capacity insulating film 91 includes a multi layered film comprising layered crystallized tantalum oxide films, and therefore, the leakage current is effectively reduced thereby improving the refresh characteristic and the like. Accordingly, the DRAM achieves high performance.

(Embodiment 4)

FIGS. 45 to 48 are cross-sectional views showing an example of a semiconductor device according to the embodiment 4 under a step of manufacturing process sequence.

Figure 45:
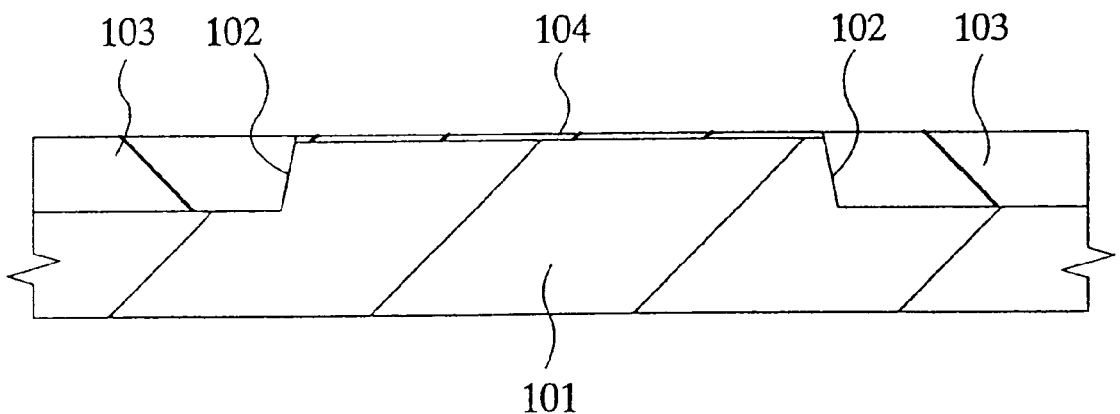
FIG. 45 is a cross-sectional view of an example of the DRAM according to the embodiment 4 under a stage of manufacturing process sequence.

At first, as shown in FIG. 45, a semiconductor substrate similar to the semiconductor substrate 1 of the embodiment 1 is prepared. Grooves 102 for element isolation regions are formed in the main surface of the semiconductor substrate 101, and a silicon oxide film 103 is formed in the grooves 102. Formation of the grooves 102 and the silicon oxide film 103 is carried out in the same manner as in the case of the groove 5 and the silicon oxide film 7 in the embodiment 1. Also, a silicon nitride film 104 is formed in the active region surrounded by the silicon oxide film 7 in the element isolation regions. Formation of the silicon nitride film is carried out in the same manner as the formation of the silicon nitride film 86 in the embodiment 1.

Figure 46:
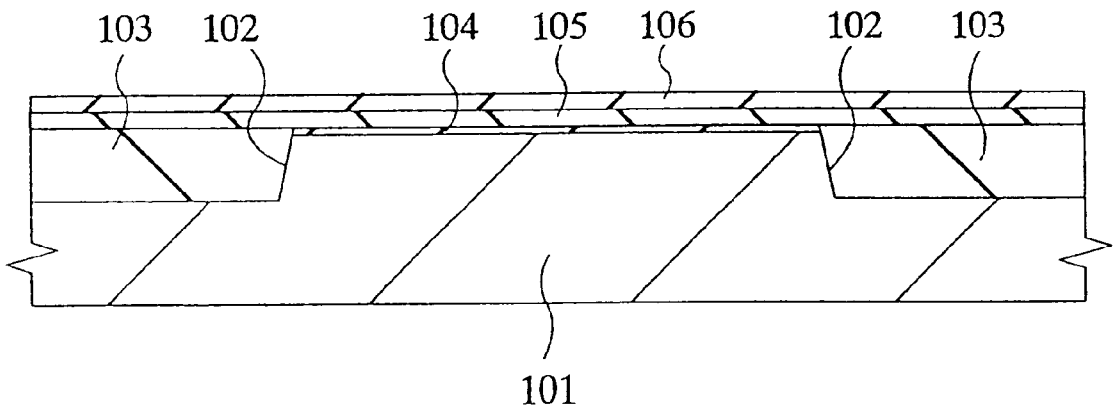
FIG. 46 is a cross-sectional view of an example of the DRAM according to the embodiment 4 under a stage of manufacturing process sequence.

Next, as shown in FIG. 46, a first tantalum oxide film is deposited on the entire surface of the semiconductor substrate 101 and is then crystallized to form a crystallized tantalum oxide film 105. Further, a tantalum oxide film is formed on the crystallized tantalum oxide film 105 and is then crystallized to form a crystallized tantalum oxide film 106. The deposition and crystallization of the tantalum oxide films are carried out in the same manner as in the steps in which the tantalum oxide films 87 and 89 are deposited and crystallized to form the crystallized tantalum oxide films 88 and 90 in the embodiment 3. The silicon nitride film 104 and the crystallized tantalum films 105 and 106 are to form the gate insulating film for the MISFET Q as will be explained later.

Since the gate insulating film is thus formed of the tantalum oxide films 105 and 106, the film thickness of the gate insulating film is enlarged so that a tunneling current can be prevented from being generated. In addition, the crystallized tantalum oxide films 105 and 106 are layered in this structure, the grain boundaries of the crystallized tantalum oxide films are divided so that generation of a leakage current can be prevented.

Figure 47:
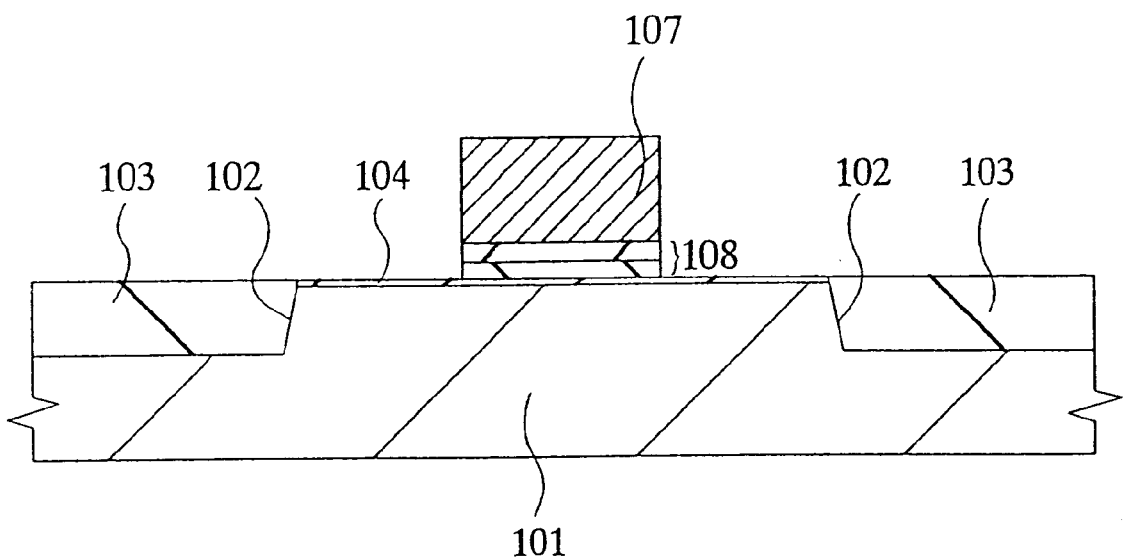
FIG. 47 is a cross-sectional view of an example of the DRAM according to the embodiment 4 under a stage of manufacturing process sequence.
Figure 48:
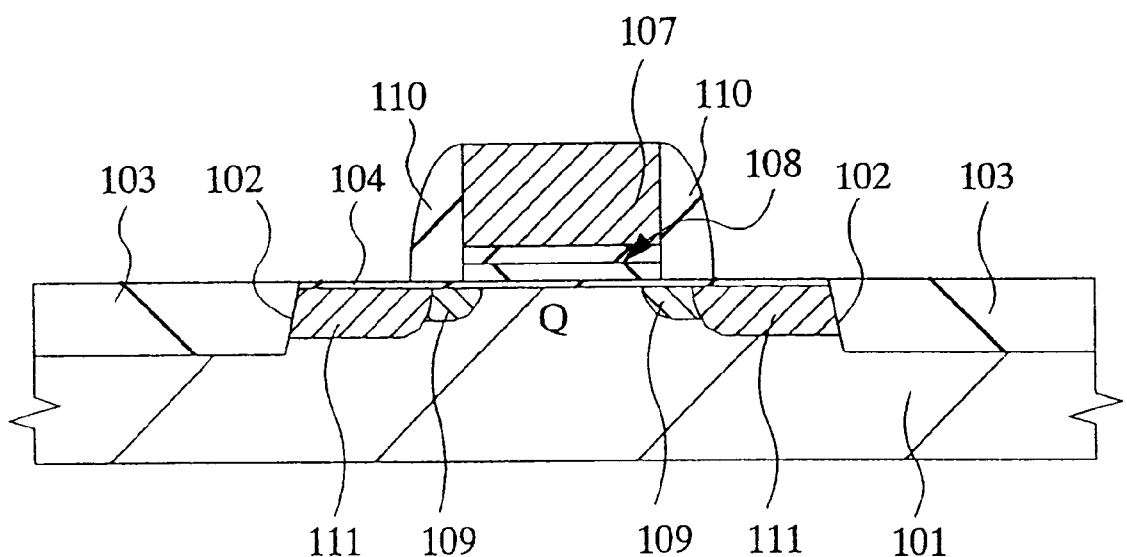
FIG. 48 is a cross-sectional view of an example of the DRAM according to the embodiment 4 under a stage of manufacturing process sequence.

Next, as shown in FIG. 47, a polycrystalline silicon film is deposited on the crystallized tantalum oxide film 105, and this polycrystalline silicon film and the crystallized tantalum oxide films 105 and 106 are removed by etching. In this manner, the gate electrode 107 made of a polycrystalline silicon film and the gate insulating film 108 containing a multi layered film comprising the crystallized tantalum oxide films 105 and 106 are formed Next, impurities are ion-implanted at a low density with a photoresist film and the gate electrode 107 used as masks, thereby to form semiconductor regions 109. In addition, a silicon nitride film or a silicon oxide film are deposited on the entire surface and are subjected to anisotropic etching, thereby to form a sidewall spacers 110 on the sidewall of the gate electrode 107. Further, impurities are ion-implanted at a high density with the photoresist film, the gate electrode 107, and the sidewall spacer 110 used as masks, thereby to for semiconductor regions 111. The semiconductor regions 109 and 111 respectively form a source and a drain of a so-called LDD structure.

Thus, a MISFET Q is formed. Note that an interlayer insulating film may be formed to form a first layer wire in contact with the semiconductor region 111. In addition, a further upper layer may be formed with an interlayer insulating film inserted therebetween. Explanation thereof is common to the first layer wire in the embodiment 1 and will be therefore omitted herefrom.

According to this semiconductor device, the gate electrode 108 is formed of crystallized tantalum oxide films, and therefore, the film thickness of the electrode can be thickened. That is, a requisite for the film thickness of a gate insulating film resulting from high integration of a semiconductor device, which will otherwise cause such a large increase of tunneling currents that cannot be neglected if was realized by a silicon oxide film, can be satisfied by the gate insulating film 108 comprising crystallized tantalum oxide films.

Also, since the gate insulating film 108 is thus formed of an multi layered film comprising two layers of crystallized tantalum oxide films 105 and 106, leakage currents which flow through grain boundaries of the tantalum oxide crystal as paths can be restricted. In this manner, the leakage current between the gate electrode 107 and the semiconductor substrate 101 can be reduced and the performance of the semiconductor device can be improved.

Further, since a silicon nitride film 104 is formed between the crystallized tantalum oxide film 105 and the semiconductor substrate 101, the semiconductor substrate 101 can be prevented from being oxidized excessively when forming the crystallized tantalum oxide films 105 and 106. In this manner, the performance of the MISFET can be improved. Although polycrystalline silicon is used for the gate electrode 107 in the present embodiment, the gate electrode is not limited thereto but a metal electrode such as titanium nitride, tungsten, or tungsten nitride may be used.
(Embodiment 5)

Figure 49:
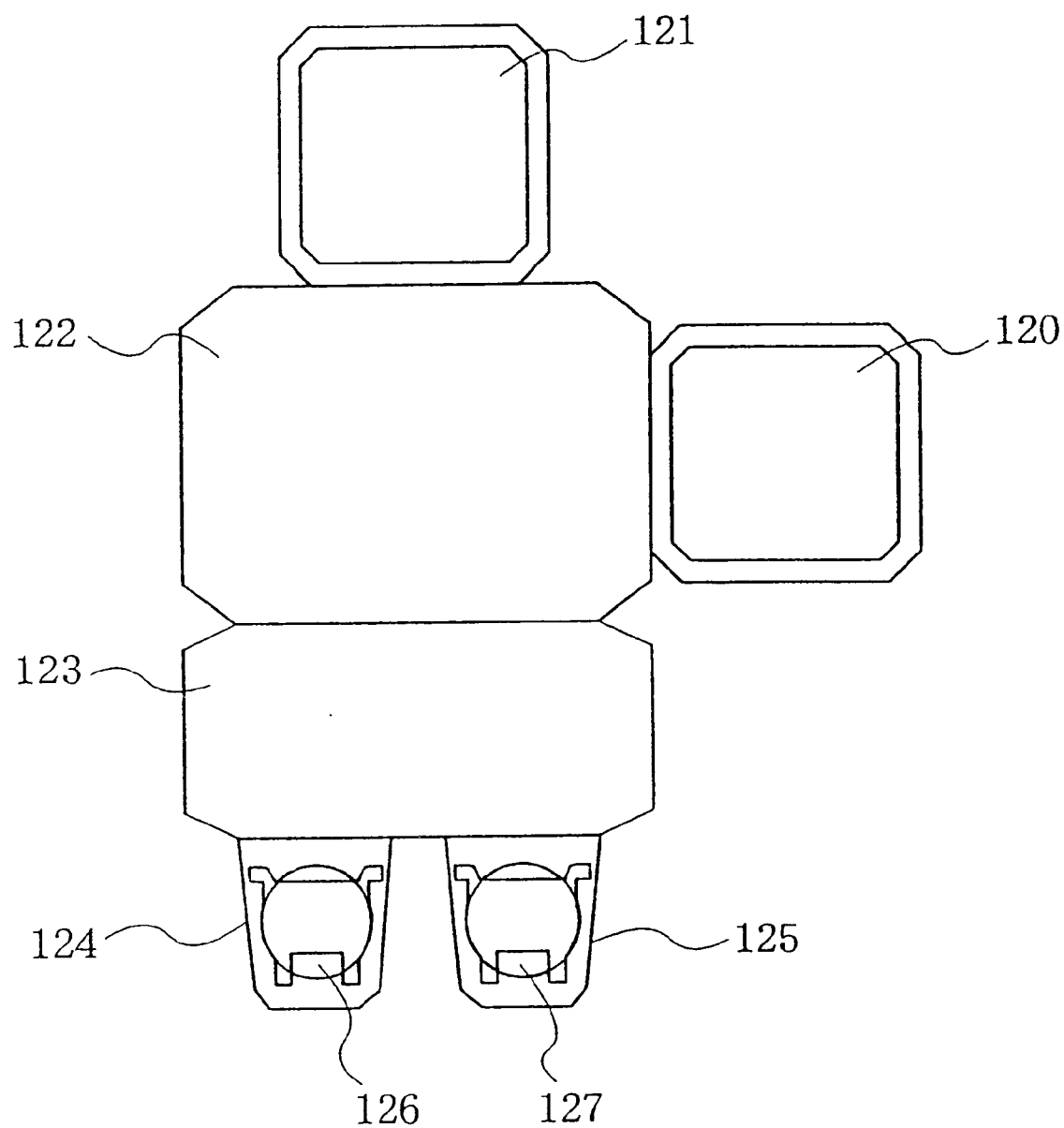
FIG. 49 is a schematic diagram showing an example of a device for fabricating a DRAM, according to the embodiment 5.

FIG. 49 is a schematic illustration showing an example of a manufacturing device for a semiconductor device according to the embodiment 5.

The manufacturing device according to the present embodiment includes a first reaction chamber 120 for forming a tantalum oxide film and a second reaction chamber for performing a heat treatment on the tantalum oxide film. The first reaction chamber 120 and the second reaction chamber 121 are connected with each other through a gate valve. Note that the gate valve is omitted from the figure.

Each of the reaction chambers 120 and 121 comprises a substrate heat mechanism and a gas feed mechanism. The gas feed mechanism of the first reaction chamber 120 has a means for supplying a material gas for forming a tantalum oxide film by a CVD method. The gas feed mechanism of the second reaction chamber 121 has a means for supplying an oxidation gas or an inert-gas, such as oxygen, dinitrogen monoxide, ozone, or the like.

A vacuum transfer chamber 122 is connected to a load lock chamber 123 through a gate valve not shown, and the load lock chamber 123 is connected to cassette chambers 124 and 125. Wafers 126 and 126 held in wafer cassettes are respectively set in the cassette chambers 124 and 125.

The wafer 126 is introduced into the vacuum transfer chamber 122 from the cassette chamber 124 through the load lock chamber 123. At this time, vacuum exhaustion is carried out in the load lock chamber 123 and air is not mixed into the vacuum transfer chamber 122. Therefore, high cleanliness is maintained in the vacuum transfer chamber 122 and the first and second reaction chambers 120 and 121.

The wafer 126 introduced into the vacuum transfer chamber 122 is transferred into the first reaction chamber 120, and a tantalum oxide film is deposited as has been explained in the embodiments 1 to 4. Thereafter, the wafer 126 is transferred to the second reaction chamber 121 from the first reaction chamber 120 through the vacuum transfer chamber 122. In the second reaction chamber 121, the wafer 126 is subjected to the heat treatment as has been explained in the embodiments 1 to 4 thereby to crystallize the tantalum oxide film.

Further, deposition of a tantalum oxide film in the first reaction chamber and crystallization thereof in the second reaction chamber are repeated again, thereby to form a multi layered film composed of two layers, or crystallized tantalum oxide films. In this while, the wafer 126 is transferred through the vacuum transfer chamber 122 maintained at a high degree of vacuum, and therefore, the interfaces of the tantalum oxide films are kept clean so that deposition of a high quality tantalum oxide film and formation of a high quality crystalline film are achieved. That is, impurities and foreign material such as dust in air generally accelerates abnormal crystallization of tantalum oxide films and may cause undesirable drawbacks. However, with use of the manufacturing apparatus according to the present embodiment, it is possible to realize manufacturing steps with consistent film formation and crystallization and repetitions thereof under an environment which provides a high degree of vacuum. Accordingly, a multi layered film comprising high quality crystallized tantalum oxide films can be formed, and the performance and reliability of the DRAM using the multi layered film are improved, as well as the performance and reliability of the MISFET using the multi layered film as a gate insulating film.

The wafer 126 on which crystallized tantalum oxide films have been formed is transferred to the cassette chamber 125 through the load lock chamber 123 from the vacuum transfer chamber 122, and is held as a wafer 127 in the wafer cassette.

Note that the vacuum transfer chamber 122 may further comprise a third reaction chamber in which nitrification processing for forming a silicon nitride film may be performed as explained in the embodiment 3 or 4. This nitrification processing is performed prior to the processing in the first reaction chamber 120. In addition, the vacuum transfer chamber 122 may further comprise a fourth reaction chamber in which deposition of a titanium nitride or another conductive film forming part of the upper electrode may be performed as explained in the embodiments 1 to 3. The deposition of such a conductive film is performed after processing in the second reaction chamber 121.

While, the invention made by the present inventor has been specifically explained on the basis of the embodiments of the invention, the present invention is not limited to the embodiments but various modifications can be effected without departing from the scope of the invention.

For example, the MISFET explained in the embodiment 3 can also be used as a memory selection MISFET of a DRAM. Otherwise, it may be used as a MISFET of a peripheral circuit. In this case, formation of the gate insulating film of the MISFET of the peripheral circuit may be carried out through the same steps as taken for forming a capacity insulating film of a memory cell region.

In addition, the MISFET according to the embodiment 3 is applicable to all kinds of semiconductor devices such as a SRAM, a read-only memory which is electrically rewritable and batch-erasable, a general purpose logic circuit, and the like.

Advantages obtained by representative embodiments of the inventions disclosed in the present application will be explained in brief below.

(1) It is possible to realize a capacity insulating film which has heat resistance and achieves less leakage currents and a high withstand voltage.

(2) It is possible to improve film characteristics such as stress of the capacity insulating film, surface morphology thereof, density thereof, and the like.

(3) It is possible to improve the reliability and performance of the DRAM concerning refresh characteristic and the like.

(4) It is possible to provide a gate insulating film in which the effective film thickness of the gate insulating film is reduced and generation of a tunneling current is restricted.

What is claimed is:

1. A method of manufacturing a semiconductor device comprising a substrate made of semiconductor or a substrate having a semiconductor layer formed thereon, a memory cell selection MISFET formed on a main surface of the substrate and an information storage capacitor comprising a first electrode electrically connected to a semiconductor region which functions as a source or drain of the memory cell selection MISFET, a second electrode formed to be opposed to the first electrode, and a capacity insulating film inserted between the first and second electrodes, or a semiconductor device comprising a substrate made of semiconductor or having a semiconductor layer formed thereon, and a MISFET including a gate insulating film formed on a main surface of the substrate and a gate electrode formed on the main surface of the substrate through the gate insulating film, wherein the method comprising the steps of:

(a) forming a first tantalum oxide film by a CVD method;

(b) crystallizing the first tantalum oxide film by a first heat treatment, thereby to form a first polycrystalline tantalum oxide film;

(c) forming a second tantalum oxide film on the first polycrystalline tantalum oxide film by a CVD method; and (d) performing a second heat treatment on the second tantalum oxide film.

2. A method according to claim 1, wherein the first and second tantalum oxide films are formed at a temperature of 550° C. or less by a CVD method using an organic tantalum gas as a raw material.

3. A method according to claim 2, wherein each of the first and second tantalum oxide films is made to have a thickness of 10 nm or less.

4. A method according to claim 1, wherein the first or second heat treatment is carried out at a temperature of 650° C. or more in an oxidation atmosphere.

5. A method according to claim 4, wherein the first or second heat treatment is carried out under a first condition set in an oxygen atmosphere at a treatment temperature of 700 to 850° C. for a processing time of 1 to 10 minutes or under a second condition set in a dinitrogen monoxide atmosphere at a treatment temperature of 650 to 850° C. for a processing time of 1 to 10 minutes.

6. A method according to claim 1, wherein either of the first or second heat treatment is composed of a first treatment step carried out in an oxidation atmosphere at a temperature of 600° C. or less and a second treatment step thereafter carried out in an inert-gas atmosphere at a processing temperature of 650° C. to 850° C. for a processing time of 1 to 10 minutes.

7. A method according to claim 6, wherein the first treatment step is carried out under a third condition set in an ozone atmosphere at a treatment temperature of 300° C. to 500° C. or under a fourth condition set in an oxygen atmosphere at a treatment temperature of 550° C. to 600° C.

8. A method according to claim 1, wherein either of the first or second heat treatment is composed of a second treatment step carried out under a condition set in an inactive atmosphere at a treatment temperature of 650° C. to 850° C. for a processing time of 1 to 10 minutes and a first treatment step thereafter carried out in an oxidation atmosphere at a temperature of 600° C. or less.

9. A method according to claim 8, wherein the first treatment step is carried out under a third condition set in an ozone atmosphere at a treatment temperature of 300° C. to 500° C. or under a fourth condition set in an oxygen atmosphere at a treatment temperature of 550° C. to 600° C.

10. A method according to claim 1, wherein the first electrode or the main surface of the substrate is made of a material containing silicon as a principal component, and the first electrode or the substrate is nitrified at its surface before the first tantalum oxide film is formed at the step(a).

11. A method according to claim 10, wherein the nitrification is carried out as a heat treatment at a treatment temperature of 700° C. to 850° C. in an ammonia atmosphere.

12. A method according to claim 11, wherein granular silicon crystal is grown on the surface of the first electrode before the nitrification.

* * * * *